(12) United States Patent
Naito et al.

(10) Patent No.: US 8,178,361 B2
(45) Date of Patent: *May 15, 2012

(54) MAGNETIC SENSOR AND MANUFACTURING METHOD THEREFOR

(75) Inventors: Hiroshi Naito, Aira-gun (JP); Hideki Sato, Hamamatsu (JP); Yukio Wakui, Iwata (JP); Masayoshi Omura, Hamamatsu (JP)

(73) Assignee: Yamaha Corporation, Hamamatsu-Shi, Shizuoka-ken (JP)

( * ) Notice: Subject to any disclaimer, the term of this patent is extended or adjusted under 35 U.S.C. 154(b) by 916 days.

This patent is subject to a terminal disclaimer.

(21) Appl. No.: 10/584,666

(22) PCT Filed: Mar. 15, 2006

(86) PCT No.: PCT/JP2006/305131
§ 371 (c)(1),
(2), (4) Date: May 29, 2007

(87) PCT Pub. No.: WO2006/098367
PCT Pub. Date: Sep. 21, 2006

(65) Prior Publication Data
US 2008/0169807 A1 Jul. 17, 2008

(30) Foreign Application Priority Data

Mar. 17, 2005 (JP) ................................. 2005-077010
Mar. 25, 2005 (JP) ................................. 2005-088828
Mar. 28, 2005 (JP) ................................. 2005-091616
Mar. 28, 2005 (JP) ................................. 2005-091617
Mar. 30, 2005 (JP) ................................. 2005-098498
Apr. 28, 2005 (JP) ................................. 2005-131857
Dec. 5, 2005 (JP) ................................. 2005-350487

(51) Int. Cl.
*H01L 21/00* (2006.01)
*G01R 33/09* (2006.01)

(52) U.S. Cl. .................... 438/3; 257/E43.001; 324/252; 324/249

(58) Field of Classification Search ............. 324/207.21, 324/249, 252; 29/603.16, 603.18; 438/3, 438/14; 360/324, 324.1, 324.11, 324.12, 360/326; 257/E43.001; 365/8
See application file for complete search history.

(56) References Cited

U.S. PATENT DOCUMENTS 4,385,975 A    5/1983   Chu et al.
(Continued)

FOREIGN PATENT DOCUMENTS

CN    1523658 A    8/2004
(Continued)

OTHER PUBLICATIONS

Yamaha Corp., Partial English Translation of JP2004006752A, Jan. 8, 2004.*

(Continued)

*Primary Examiner* — Bot Ledynh
(74) *Attorney, Agent, or Firm* — Dickstein Shapiro LLP

(57) ABSTRACT

There is provided a small-size magnetic sensor for detecting the intensity of a magnetic field in three axial directions, in which a plurality of giant magnetoresistive elements are formed on a single semiconductor substrate. A thick film is formed on the semiconductor substrate; giant magnetoresistive elements forming an X-axis sensor and a Y-axis sensor are formed on a planar surface thereof; and giant magnetoresistive elements forming a Z-axis sensor are formed using slopes of channels formed in the thick film. Regarding the channel formation, it is possible to use the reactive ion etching and high-density plasma CVD methods. In addition, an insulating film is formed between the thick film and passivation film and is used as an etching stopper. Each of the slopes of the channels can be constituted of a first slope and a second slope, so that a magneto-sensitive element is formed on the second slope having a larger inclination angle. In order to optimize the slope shape and inclination with respect to each channel, it is possible to form a dummy slope that does not directly relate to the formation of the giant magnetoresistive elements.

8 Claims, 36 Drawing Sheets

U.S. PATENT DOCUMENTS

| | | |
|---|---|---|
| 6,344,951 B1 | 2/2002 | Sato et al. |
| 6,707,298 B2 | 3/2004 | Suzuki et al. |
| 6,904,669 B2 | 6/2005 | Sato et al. |
| 7,687,284 B2 | 3/2010 | Naito et al. |
| 2004/0080872 A1 | 4/2004 | Sato et al. |
| 2004/0104724 A1 | 6/2004 | Sato |
| 2004/0163246 A1 | 8/2004 | Nishioka et al. |
| 2004/0189295 A1 | 9/2004 | Sato et al. |
| 2004/0212360 A1 | 10/2004 | Sato et al. |
| 2004/0233588 A1 | 11/2004 | Oohashi et al. |
| 2005/0270020 A1 | 12/2005 | Peczalski et al. |
| 2008/0169807 A1 | 7/2008 | Naito et al. |

FOREIGN PATENT DOCUMENTS

| | | |
|---|---|---|
| EP | 1 411 365 A2 | 4/2004 |
| JP | 01172581 | 7/1989 |
| JP | 1-250875 | 10/1989 |
| JP | 11-305055 A | 11/1999 |
| JP | 11329228 | 11/1999 |
| JP | 2000-232156 | 8/2000 |
| JP | 2002-299728 A | 10/2002 |
| JP | 2002324800 | 11/2002 |
| JP | 3498737 B2 | 12/2003 |
| JP | 2004-6752 | 1/2004 |
| JP | 2004-012156 A | 1/2004 |
| JP | 2004079820 | 3/2004 |
| JP | 2004-193540 | 7/2004 |
| JP | 2004214267 | 7/2004 |
| JP | 2004-356338 | 12/2004 |
| JP | 2005-039010 | 2/2005 |
| JP | 2005-039011 | 2/2005 |

OTHER PUBLICATIONS

Japanese Office Action dated May 17, 2011 issued to Japanese Application No. 2005-091617.

Japanese Office Action dated May 24, 2011 issued to Japanese Application No. 2005-098498.

Japanese Office Action dated May 24, 2011 issued to Japanese Application No. 2005-131857.

Chinese Office Action dated Nov. 22, 2011 for corresponding CN 200680008164.2 (English translation attached).

* cited by examiner (a)

(b)

(c)

(a)

(b)

(c)

(a)

(b)

(c)

(d)

(a)

(b)

(c)

(a)

(b)

(a)

(b)

(a)

(b)

(a)

(b)

(c)

(a)

(b)

(c)

(a)

(b)

(a)

(b)

(c)

(a)

(b)

(a)

(b)

MAGNETIC SENSOR AND MANUFACTURING METHOD THEREFOR

TECHNICAL FIELD

The present invention relates to magnetic sensors and manufacturing methods therefor, and in particularly to small-size magnetic sensors and manufacturing methods therefor, in which three or more giant magnetoresistive elements are arranged on a single substrate so as to detect the intensity of a magnetic field in three axial directions.

The present application claims priority on seven Japanese patent applications, i.e., Patent Application No. 2005-77010 (filing date: Mar. 17, 2005), Patent Application No. 2005-91616 (filing date: Mar. 28, 2005), Patent Application No. 2005-88828 (filing date: Mar. 25, 2005), Patent Application No. 2005-131857 (filing date: Apr. 28, 2005), Patent Application No. 2005-350487 (filing date: Dec. 5, 2005), Patent Application No. 2005-91617 (filing date: Mar. 28, 2005), and Patent Application No. 2005-98498 (filing date: Mar. 30, 2005), the contents of which are incorporated herein by reference.

BACKGROUND ART

Conventionally, a variety of magnetic sensors have been developed. For example, Japanese Unexamined Patent Application Publication No. 2004-6752 discloses a magnetic sensor in which three or more giant magnetoresistive elements are arranged on a single substrate so as to detect the intensity of a magnetic field in three axial directions.

The magnetic sensor disclosed in the aforementioned paper is designed such that channels are formed on a silicon substrate, Z-axis giant magnetoresistive elements are arranged on slopes of channels, and X-axis giant magnetoresistive elements and Y-axis giant magnetoresistive elements are arranged on a planar surface of the silicon substrate, thus reducing the overall size thereof.

In addition, a three-axial magnetic sensor, in which elongated projections composed of silicon oxide are formed, Z-axis giant magnetoresistive elements are arranged on slopes of the elongated projections, and X-axis giant magnetoresistive elements and Y-axis giant magnetoresistive elements are arranged on a planar surface of the silicon substrate, is known.

Patent document 1: Japanese Unexamined Patent Application Publication No. 2004-6752.

Problems to be Solved by the Invention

It is an object of the present invention to further reduce the overall size and to improve the detection accuracy in a magnetic sensor in which three or more giant magnetoresistive elements are arranged on a single substrate so as to detect the intensity of a magnetic field in three axial directions.

Means for Solving the Problems

In a first aspect of the present invention, a magnetic sensor is formed in such a way that a thick film formed on a semiconductor substrate is subjected to treatment so as to form a plurality of channels in parallel; Z-axis sensors are realized by a plurality of giant magnetoresistive elements, which are constituted using magneto-sensitive elements formed on slopes of channels and bias magnets for electrically connecting magneto-sensitive elements in series; and X-axis sensors and Y-axis sensors are realized by a plurality of giant magnetoresistive elements, which are arranged at prescribed positions on a planar surface of the thick film.

According to a manufacturing method of the aforementioned magnetic sensor, a planation layer realizing planation by covering a wiring layer of a semiconductor substrate is formed; a passivation film is formed on the planation layer; a thick film is formed on the passivation film; a resist film is formed on the thick film; the resist layer is partially removed; the resist layer is subjected to heat treatment so as to make side surfaces thereof slope; the resist film and thick film are subjected to etching with an etching selection ratio of 1:1 so as to form a plurality of channels in the thick film; bias magnets forming giant magnetoresistive elements are formed on a planar surface of the thick film as well as slopes, top portions, and bottom portions of channels; a giant magnetoresistive element film is formed; the semiconductor substrate in which the giant magnetoresistive element film is formed is arranged in proximity to a magnet array and is then subjected to heat treatment; the giant magnetoresistive element film is partially removed by etching; magneto-sensitive elements forming giant magnetoresistive elements are formed on the planar surface of the thick film and the slopes of the channels; and a protection film is formed.

In the above, the passivation film can be constituted by an upper layer and a lower layer. In this case, the planation layer is partially removed so as to make vias and pads be exposed; the upper layer of the passivation film is removed from the vias and pads; the resist film is subjected to etching, and then the thick film remaining in the center of the vias as well as the lower layer of the passivation film are removed so as to make conductive portions of the vias be exposed; after the formation of bias magnets, a wiring film connecting between the bias magnets and the conductive portions of the vias is formed; and after the formation of the protection film, the thick film covering the pads and the lower layer of the passivation film are removed so as to make the conductive portions of the pads be exposed.

In a second aspect of the present invention, a plurality of channels are formed in the resist film before the formation of a plurality of channels in the thick film. That is, after the formation of the resist film, a mold having a plurality of projections corresponding to a plurality of channels formed in the thick film is pressed against the resist film so as to form a plurality of channels therein. Alternatively, after the formation of the resist film, a photomask having a fine pattern, in which the number of channels per unit area is gradually increased from the center to both ends of the thick film, is arranged opposite to the resist film, which is then subjected to exposure and development, thus forming channels in the resist film.

In a third aspect of the present invention, after the heat treatment of the resist film, reactive ion etching is performed under high ion etching conditions on the resist film and thick film, thus forming a plurality of channels in the thick film. Alternatively, an insulating film is formed using deposition of silicon oxide on the thick film by way of the high-density plasma CVD method; a plurality of projections having linear ridgelines are formed at prescribed parts of the insulating film; then, the insulating film having a plurality of projections and the thick film are subjected to etching under high ion etching conditions, thus forming a plurality of channels in the thick film, whereby the thick film remaining in vias and pads is reduced in thickness.

Thus, it is possible to form a plurality of channels connected in a zigzag manner in the thick film; and it is possible to improve the planation with respect to each of slopes of channels.

In a fourth aspect of the present invention, a prescribed inclination angle is applied to each of slopes of channels by easy etching control; hence, it is possible to form giant magnetoresistive elements having good characteristics.

That is, an etching stopper film is formed between the thick film and the semiconductor substrate in the magnetic sensor. Specifically, an insulating film is formed between the thick film and the passivation film and is used as an etching stopper in execution of etching.

Thus, it is possible to increase the etching selection ratio between the resist film and the thick film. In addition, it is possible to make the thick film dent towards the etching stopper film, thus forming channels by way of etching.

In a fifth aspect of the present invention, it is possible to improve a sensing accuracy of a magnetic sensor due to variations of inclination angles of slopes of channels formed in the thick film, in particular due to variations of inclination angles between upper portions and lower portions of slopes. That is, each of slopes of channels is formed by an upper-side first slope and a lower-side second slope, wherein the second slope is greater than the first slope in terms of the inclination angle, and magneto-sensitive elements of giant magnetoresistive elements are formed on the second slope. Thus, it is possible to improve the planation with respect to the surfaces of the magneto-sensitive elements; hence, sensing directions of giant magnetoresistive elements are adjusted in the Z-axis direction; and it is therefore possible to realize a magnetic sensor having a high sensitivity.

In a sixth aspect of the present invention, giant magnetoresistive elements are formed selectively on the channels having prescribed shapes. Because, the peripheral shapes of the channels become uncertain due to the difficulty of uniformly executing plasma etching, and this makes it difficult to realize the desired planation and inclination angle with respect to the peripheral portions and center portions of the channels.

That is, a first dummy slope is formed in at least one of the channels; and no giant magnetoresistive element is formed on the first dummy slope. In addition, a second dummy slope is formed in proximity to the terminal end of the channels in longitudinal directions.

In a seventh aspect of the present invention, the terminal ends of the slopes of the channels formed in the thick film on the semiconductor substrate are rounded so as to realize uniformity in the slope shape and inclination angle.

Effect of the Invention

In the present invention, giant magnetoresistive elements for detecting the intensity of a magnetic field in X-axis, Y-axis, and Z-axis directions are mounted on a single semiconductor substrate, thus realizing a small-size three-axial magnetic sensor. It is possible to realize a magnetic sensor having good performance because the thick film formed on the semiconductor substrate is subjected to treatment so as to form channels, and magneto-sensitive elements of giant magnetoresistive elements are selectively formed on slopes of channels having good planation. A giant magnetoresistive element film is deposited on wiring composed of a magnet film with respect to a recessed end of a via; hence, it is possible to avoid the occurrence of breakdown of wiring at corners of a step portion. In addition, it is possible to realize giant magnetoresistive elements having high stability against a magnetic field.

According to the manufacturing method of the aforementioned magnetic sensor, it is possible to form channels and to form giant magnetoresistive elements on slopes of the channels by way of a series of processes. Furthermore, it is possible to form vias and pads by way of a series of processes. Thus, it is possible to efficiently produce a magnetic sensor.

A plurality of channels are formed in advance in the resist film on the semiconductor substrate. This makes it possible to easily form channels having prescribed shapes in the thick film by way of etching; and it is possible to improve the planation with respect to the slopes of the channels. Thus, it is possible to form a Z-axis sensor having a prescribed sensing direction and a good sensitivity.

DESCRIPTION OF THE REFERENCE NUMERALS

Figure 1:
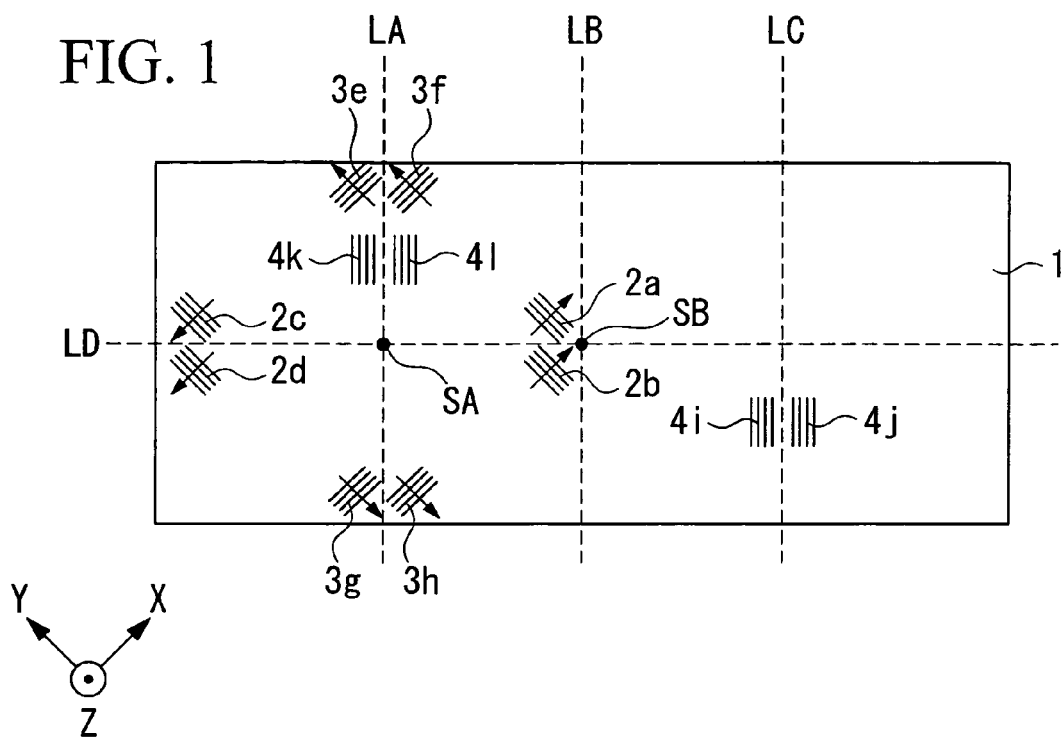
FIG. 1 A plan view showing giant magnetoresistive elements forming an X-axis sensor, a Y-axis sensor, and a Z-axis sensor arranged on a semiconductor substrate of a magnetic sensor in accordance with a first embodiment of the present invention.

A via
B pad
C channel forming region
1 semiconductor substrate
2a, 2b, 2c, 2d giant magnetoresistive elements forming an X-axis sensor
3e, 3f, 3g, 3h giant magnetoresistive elements forming a Y-axis sensor
4i, 4j, 4k, 4l giant magnetoresistive elements forming a Z-axis sensor
5 magneto-sensitive element
6 bias magnet
7 wiring layer
8 channel
8A, 8E, 8G, 8K, 8M, 8Q, 8S, 8W first slope
8B, 8D, 8H, 8J, 8N, 8P, 8T, 8V second slope
21a conductive portion of via A
21b conductive portion of pad B
27 passivation film
28 protection film
31 planation film
32 passivation film
33 silicon oxide film
34 silicon nitride film
35 thick film
36 resist film
37 insulating film
38 resist film
40 photomask
41 fine pattern
50 slope

BEST MODE FOR CARRYING OUT THE INVENTION

The present invention realizes downsizing and improves a detection accuracy with respect to a magnetic sensor using giant magnetoresistive elements, and it will be described by way of various embodiments in conjunction with the attached drawings.

First Embodiment

FIG. 1 diagrammatically shows a magnetic sensor in accordance with a first embodiment of the present invention, and it shows the layout regarding a plurality of giant magnetoresistive elements arranged on a semiconductor substrate.

In FIG. 1, reference numeral 1 designates a semiconductor substrate composed of silicon, in which semiconductor integrated circuits such as drive circuits and signal processing circuits, and wiring layers are formed in advance with respect to the magnetic sensor, and on which a planation film, a passivation film, and a silicon oxide film (not shown) are sequentially formed so as to form a thick film.

An X-axis sensor 2, a Y-axis sensor 3, and a Z-axis sensor 4 are arranged on the thick film of the semiconductor substrate 1, thus making it possible to detect the intensity of an external magnetic field in three axial directions. In coordinates axes shown in FIG. 1, the X-axis sensor 2 has sensitivity in an X-axis direction, the Y-axis sensor 3 has sensitivity in a Y-axis direction, and the Z-axis sensor 4 has sensitivity in a Z-axis direction.

Specifically, the X-axis sensor 2 is composed of four giant magnetoresistive elements 2a, 2b, 2c, and 2d; the Y-axis sensor 3 is composed of four giant magnetoresistive elements 3e, 3f, 3g, and 3h; and the Z-axis sensor 4 is composed of four giant magnetoresistive elements 4i, 4j, 4k, and 4l.

The X-axis sensor 2 and the Y-axis sensor 3 are arranged on the planar surface of the thick film of the semiconductor substrate 1, and the Z-axis sensor 4 is arranged on the slopes of channels formed in the thick film. Details will be described later.

Within the four giant magnetoresistive elements forming the X-axis sensor 2, the giant magnetoresistive elements 2a and 2b are arranged to adjoin together approximately in the center of the semiconductor substrate 1, and the giant magnetoresistive elements 2c and 2d are arranged to adjoin together in the end portion of the semiconductor substrate 1. That is, the giant magnetoresistive elements 2c and 2d are distant from and arranged opposite to the giant magnetoresistive elements 2a and 2b.

Within the four giant magnetoresistive elements forming the Y-axis sensor 3, the giant magnetoresistive elements 3e and 3f are arranged to adjoin together in one end portion of the semiconductor substrate 1, and the giant magnetoresistive elements 3g and 3h are arranged to adjoin together in the other end portion of the semiconductor substrate 1. That is, the giant magnetoresistive elements 3e and 3f are distant from and arranged opposite to the giant magnetoresistive elements 3g and 3h.

Within the four giant magnetoresistive elements forming the Z-axis sensor 4, the giant magnetoresistive elements 4k and 4l are arranged in proximity to the giant magnetoresistive elements 3e and 3f, and the giant magnetoresistive elements 4i and 4j are slightly distant from and arranged adjacent to the giant magnetoresistive elements 2a and 2b.

The arrangement of the aforementioned giant magnetoresistive elements forming the X-axis sensor 2, Y-axis sensor 3, and Z-axis sensor 4 is determined based on the following rules.

In FIG. 1, dotted lines LA, LB, and LC are imaginary lines for equally dividing the semiconductor substrate 1 into four sections in the longitudinal direction; and a dotted line LD is an imaginary line for equally dividing the semiconductor substrate 1 in the width direction. In addition, SA designates an intersecting point between the dotted lines LA and LD, and SB designates an intersecting point between the dotted lines LB and LD.

That is, in the X-axis sensor 2, the giant magnetoresistive elements 2a and 2b and the giant magnetoresistive elements 2c and 2d are arranged symmetrically with respect to the intersecting point SA. In the Y-axis sensor 3, the giant magnetoresistive elements 3e and 3f and the giant magnetoresistive elements 3g and 3h are arranged symmetrically with respect to the intersecting point SA. In the Z-axis sensor 4, the giant magnetoresistive elements 4i and 4j and the giant magnetoresistive elements 4k and 4l are arranged symmetrically with respect to the intersecting point SB.

Figure 2:
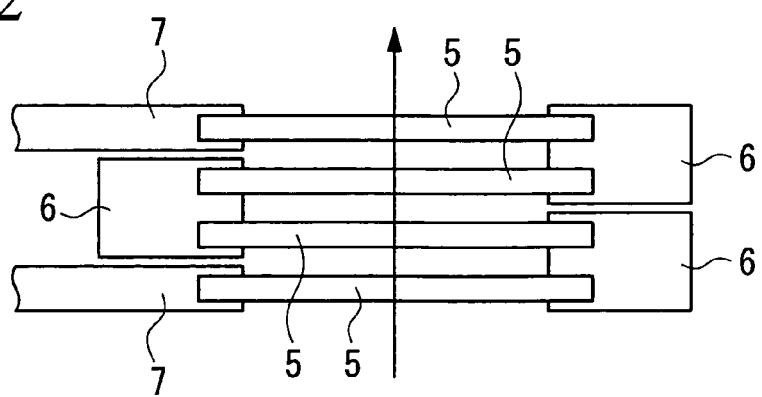
FIG. 2 A plan view showing an example of the internal structure of a giant magnetoresistive element.

The aforementioned giant magnetoresistive elements are formed similar to the conventionally-known giant magnetoresistive elements. For example, as shown in FIG. 2, each giant magnetoresistive element is constituted of four magneto-sensitive elements 5 and three bias magnets 6 for electrically connecting them in series.

The magneto-sensitive elements 5 form a main part of the giant magnetoresistive element, and they have thin band-like plane shapes. The magneto-sensitive elements 5 are arranged in parallel in the longitudinal direction of channels formed in the semiconductor substrate 1.

The magneto-sensitive element 5 has a pinned layer whose magnetization direction is fixed and a free layer whose magnetization direction varies in response to an external magnetic field. Specifically, it is constituted of multilayered laminated metals including a conductive spacer layer, a pinned layer, and a capping layer, which are sequentially laminated on a free layer.

For example, the free layer has a three-layered structure including an amorphous magnetic layer composed of cobalt-zirconium-niobium, a magnetic layer composed of nickel-iron, and a magnetic layer composed of cobalt-iron. The spacer layer is composed of copper; the pinned layer has a two-layered structure including a ferromagnetic layer composed of cobalt-iron and a diamagnetic layer composed of platinum-manganese; and the capping layer is composed of tantalum.

The bias magnets 6 electrically connect the four magneto-sensitive elements 5 in series, and they apply a bias magnetic field to the magneto-sensitive elements 5, which are thus adjusted in magnetic characteristics. For example, the bias magnet 6 is constituted of laminated metals having a two-layered structure including a cobalt-platinum-chrome layer and a chrome layer.

Each of the giant magnetoresistive elements 2a, 2b, 2c, 2d, 3e, 3f, 3g, and 3h forming the X-axis sensor 2 and the Y-axis sensor 3 arranged on the planar surface of the semiconductor substrate 1 is constituted of the four magneto-sensitive elements 5 and the three bias magnets 6 as shown in FIG. 2, wherein the terminal ends of the externally-arranged two magneto-sensitive elements 5, which are not connected to the bias magnets 6, are respectively connected to wiring layers 7, which are connected to vias (not shown).

Figure 3:
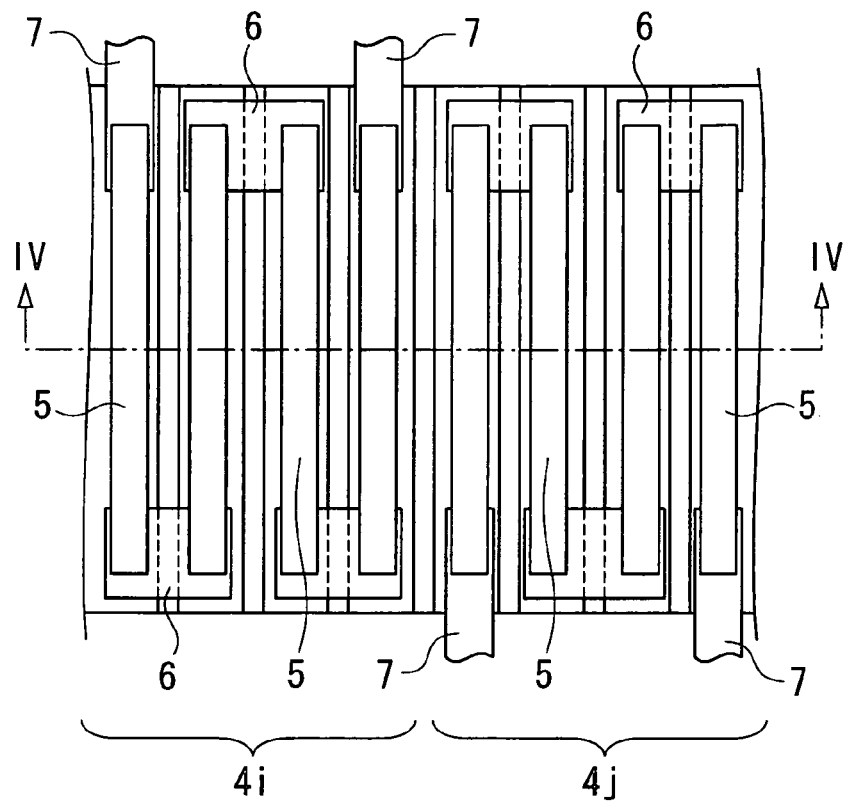
FIG. 3 A plan view showing the structure of giant magnetoresistive elements forming the Z-axis sensor.
Figure 4:
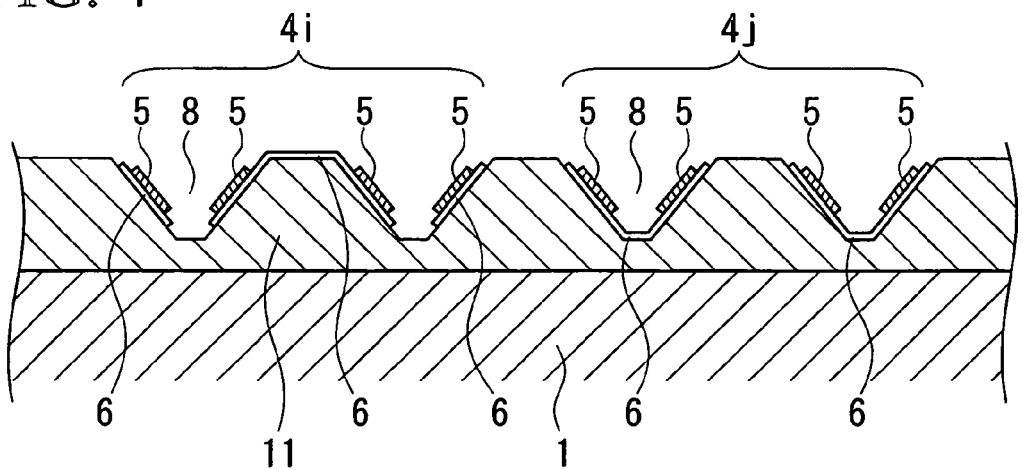
FIG. 4 A cross-sectional view showing a method of forming giant magnetoresistive elements forming the Z-axis sensor.
Figure 5:
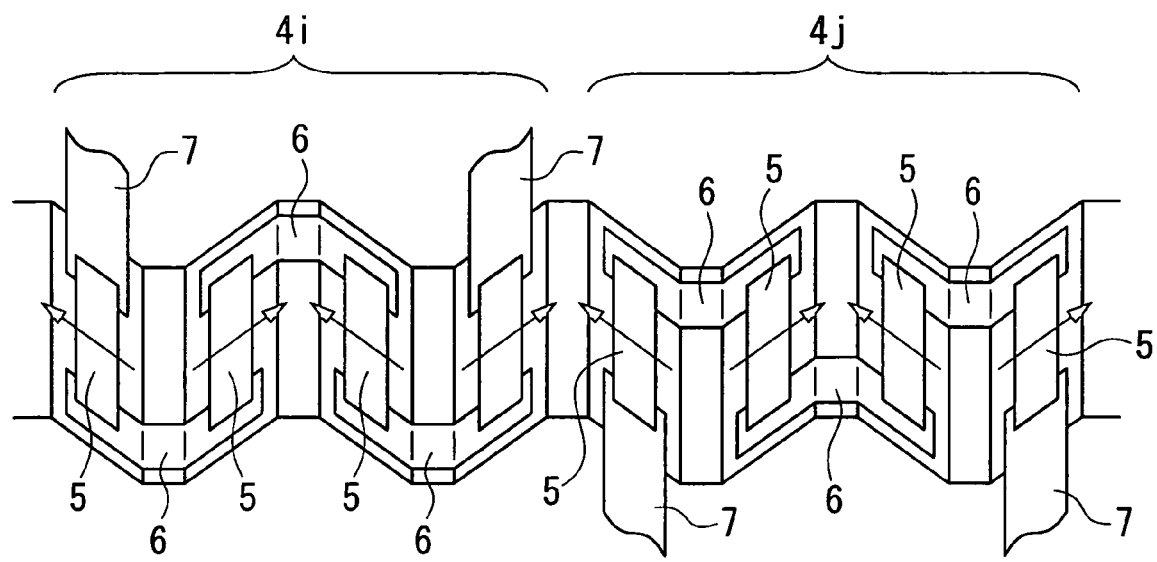
FIG. 5 A perspective view showing an example of the layout of giant magnetoresistive elements forming the Z-axis sensor.

FIGS. 3 to 5 show the detailed structure of the giant magnetoresistive elements 4i and 4j within four giant magnetoresistive elements forming the Z-axis sensor 4. Incidentally, the detailed structure of the other giant magnetoresistive elements 4k and 4l is the same as the aforementioned one; hence, it is not described.

FIG. 3 is a plan view showing the giant magnetoresistive elements 4i and 4j; and FIG. 4 is a cross-sectional view taken along line IV-IV in FIG. 3. FIG. 5 is a perspective view diagrammatically showing the layout of the magneto-sensitive elements 5 and bias magnets 6 included in the giant magnetoresistive elements 4i and 4j.

In FIG. 4, reference numeral 11 designates a thick film composed of silicon oxide, which is deposited on the semiconductor substrate 1. The thick film 11 is partially subjected to cutting so as to form four V-shaped channels 8.

Each channel 8 is a thin recess having prescribed dimensions, in which the depth ranges from 3 μm to 8 μm, the length ranges from 200 μm to 400 μm, and the slope width ranges from 3 μm to 16 μm. The angle between the slope and the surface of the thick film 11 ranges from 30° to 80° and is preferably set to 70°.

Incidentally, FIG. 4 shows that each channel 8 has planar slopes; in the actual manufacturing process, the slope is slightly curved in an outside direction (i.e., the upper side of the semiconductor substrate 1).

FIG. 4 shows the four channels 8, in which the magneto-sensitive elements 5 forming eight giant magnetoresistive elements are arranged at the center planar positions of the eight slopes adjoining together in the longitudinal direction. With respect to the giant magnetoresistive element 4j, a bias magnet 6 is formed to extend from the magneto-sensitive element 5, which is formed on one slope of the channel 8, to the magneto-sensitive element 5, which is formed on the other slope of the channel 8, via the bottom, so that the magneto-sensitive elements 5 adjoining together in the channel 8 are electrically connected together. Furthermore, with respect to the giant magnetoresistive element 4i, a bias magnet 6 is formed to extend from the magneto-sensitive element 5, which is formed on the slope of one channel 8, to the magneto-sensitive element 5, which is formed on the slope of the adjacent channel 8, via the top portion, so that the magneto-sensitive elements 8 in the adjacent channels 8 are electrically connected together.

As described above, with respect to each giant magnetoresistive element, the four magneto-sensitive elements 5 are electrically connected together by way of the three bias magnets 6.

Similar to the giant magnetoresistive elements forming the X-axis sensor 2 and the Y-axis sensor 3 arranged on the planar surface of the thick film 11 described above, with respect to each of the giant magnetoresistive elements forming the Z-axis sensor 4, the externally-arranged two magneto-sensitive elements 5 are not connected to the bias magnets 6 but are connected to the wiring layers 7, which are connected to vias (not shown). The wiring layers 7 are formed using the magnet film forming the bias magnets 6 of the giant magnetoresistive elements. Thus, it is possible to simultaneously form the bias magnets 6 and the wiring layers 7 in each giant magnetoresistive element.

As shown in FIG. 2, the sensing directions of the giant magnetoresistive elements forming the X-axis sensor 2 and the Y-axis sensor 3 cross at a right angle with the magneto-sensitive elements 5 in the longitudinal direction, and they are set in parallel with the surface of the semiconductor substrate 1. In addition, the pinning direction of the magneto-sensitive elements 5 and the magnetization direction of a bias magnetic field of the bias magnets 6 are inclined with respect to the longitudinal direction of the magneto-sensitive elements 5 by an angle ranging from 30° to 60°, preferably by an angle of 45°, and they are in parallel with the surface of the semiconductor substrate 1.

As shown in FIG. 5, the sensing directions of the giant magnetoresistive elements 4i and 4j included in the Z-axis sensor 4 cross at a right angle with the longitudinal direction of the magneto-sensitive elements 5, and they are each set in parallel with the slopes of the channels 8 and in an upward direction. In addition, the pinning direction of the magneto-sensitive elements 5 and the magnetization direction of the bias magnets 6 are inclined with respect to the longitudinal direction of the magneto-sensitive elements 5 by an angle ranging from 30° to 60°, preferably by an angle of 45°, and they are set in parallel with the slopes of the channels 8 and in an upward direction.

Figure 6:
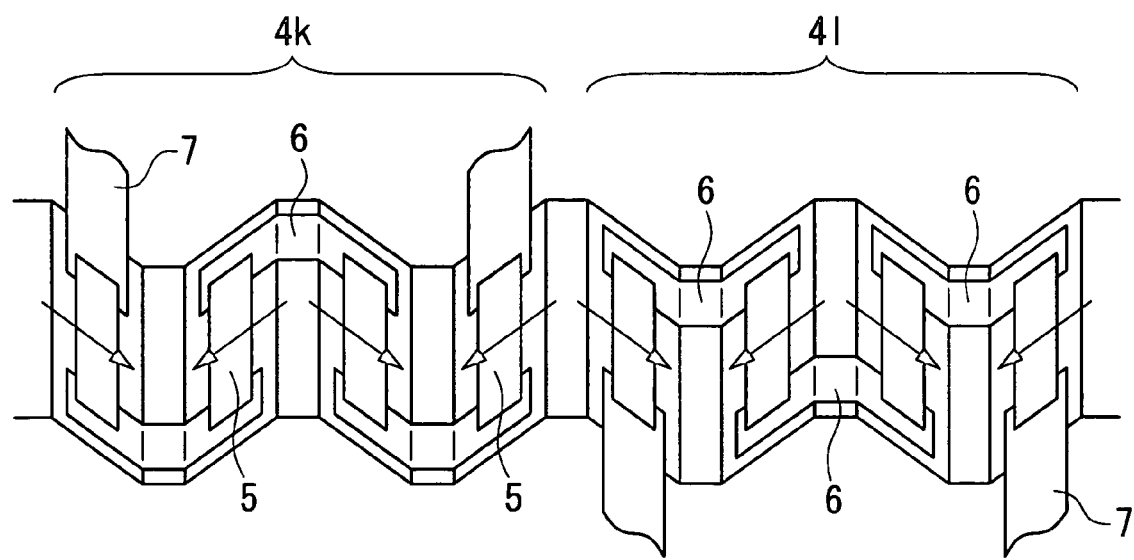
FIG. 6 A perspective view showing another example of the layout of giant magnetoresistive elements forming the Z-axis sensor.

As shown in FIG. 6, the sensing directions of the giant magnetoresistive elements 4k and 4l included in the Z-axis sensor 4 cross at a right angle with the longitudinal direction of the magneto-sensitive elements 5, and they are set in parallel with the slopes of the channels 8 and in a downward direction. In addition, the pinning direction of the magneto-sensitive elements 5 and the magnetization direction of a bias magnetic field of the bias magnets 6 are inclined with respect to the longitudinal direction of the magneto-sensitive elements 5 by an angle ranging from 30° to 60°, preferably by an angle of 45°, and they are in parallel with the slopes of the channels 8 and in a downward direction.

In order to realize the aforementioned sensing directions, a magnet array is positioned close to the upper side of the semiconductor substrate, which is then subjected to heat treatment for three to five hours at a temperature ranging from 260° C. to 290° C. This method is similar to the conventionally-known pinning process.

Normally, both the sensing direction and pinning direction of the giant magnetoresistive element cross at a right angle with the longitudinal direction of the magneto-sensitive elements 5 and are also set in parallel with the surface of the semiconductor substrate. In the present embodiment, the sensing direction differs from the pinning direction; hence, it is possible to improve the stability against a high magnetic field.

Figure 7:
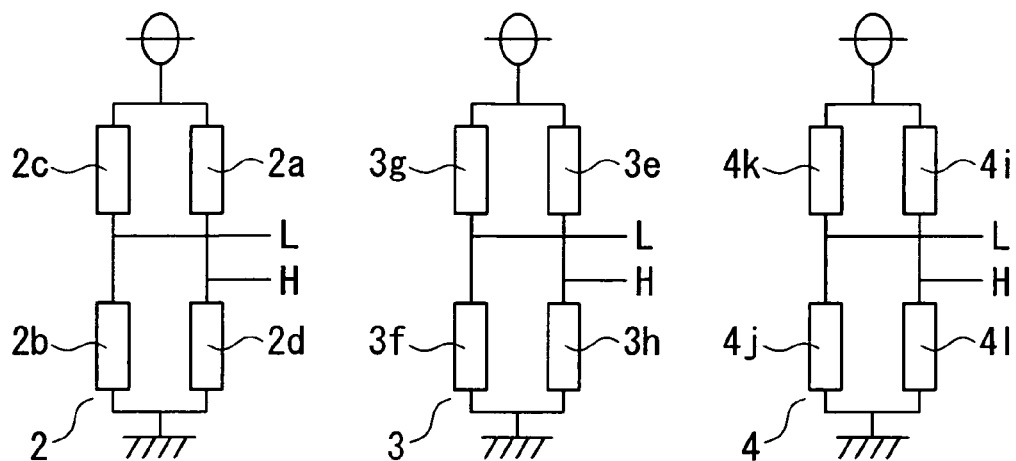
FIG. 7 Line-connection diagrams showing line connections between giant magnetoresistive elements with respect to the X-axis sensor, Y-axis sensor, and Z-axis sensor.

FIG. 7 shows line-connection methods with respect to the four giant magnetoresistive elements 2a, 2b, 2c, and 2d forming the X-axis sensor 2, the four giant magnetoresistive elements 3e, 3f, 3g, and 3h forming the Y-axis sensor 3, and the four giant magnetoresistive elements 4i, 4j, 4k, and 4l forming the Z-axis sensor 4, wherein the four giant magnetoresistive elements included in each sensor are connected together by way of a bridge.

Due to the aforementioned bridge connection, when magnetic fields are applied in the positive directions of the X-axis, Y-axis, and Z-axis in the coordinate axes shown in FIG. 1, the outputs of the X-axis sensor 2, Y-axis sensor 3, and Z-axis sensor 4 increase, whereas when magnetic fields are applied in the negative directions of the X-axis, Y-axis, and Z-axis, the outputs of the X-axis sensor 2, Y-axis sensor 3, and Z-axis sensor 4 decrease.

FIGS. 1 to 6 do not show that the overall surface of the semiconductor substrate 1 including all of the giant magnetoresistive elements forming the X-axis sensor 2, Y-axis sensor 3, and Z-axis sensor 4 is covered with a passivation film composed of silicon nitride and a protection film composed of polyimide, by which it is protected from external environments.

Figure 8:
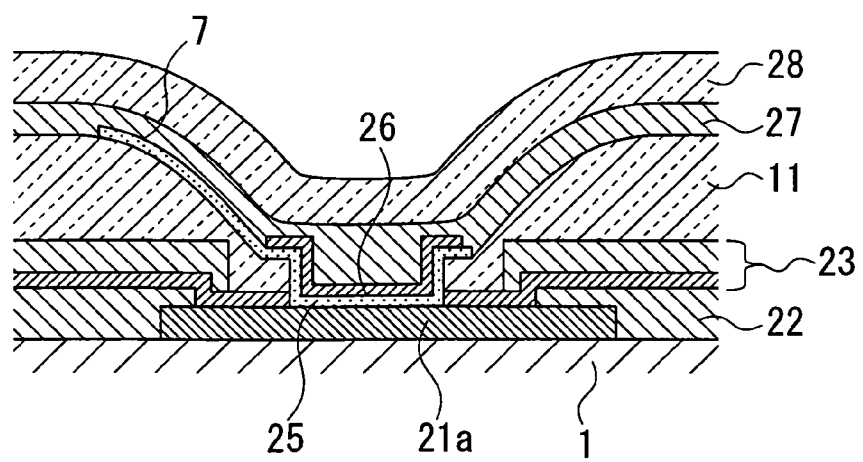
FIG. 8 A cross-sectional view showing the structure of a via in the magnetic sensor of the first embodiment.

FIG. 8 shows the structure of a via formed in the semiconductor substrate 1, wherein reference numeral 21a designates a conductive portion composed of aluminum forming the via. The conductive portion 21a is electrically connected to a wiring layer, which is formed therebelow.

The periphery of the surface of the conductive portion 21a is covered with a planation film 22 and a first passivation film 23 as well as the thick film 11. The terminal surfaces of the thick film 11 are sloped surfaces.

The center of the surface of the conductive portion 21a is covered with a wiring film 25. The wiring film 25 is connected to the aforementioned wiring layer 7 for the giant magnetoresistive elements. Similar to the wiring layer 7, the wiring film 25 is formed using the magnet film forming the bias magnets 6. Thus, it is possible to simultaneously form the wiring film 25 and the bias magnets 6.

Step portions are formed in the wiring film 25 in proximity to the terminal portion of the thick film 11. Due to the manufacturing process, there is a possibility that the wiring film 25 is reduced in thickness and may be broken at corners of the step portions. For this reason, a protective conductive film 26 is laminated to cover the step portions and the center portion.

In the present embodiment, the aforementioned giant magnetoresistive element film forming the magneto-sensitive elements 5 is used as the protective conductive film 26. Thus, it is possible to laminate the protective conductive film 26 on the wiring film 25 simultaneously with the formation of the magneto-sensitive elements 5; hence, it is possible to avoid the breakage of the wiring film 25.

The via having the aforementioned structure is covered with a passivation film 27 composed of silicon oxide and a protection film 28 composed of polyimide, by which it is protected from external environments.

The magnetic sensor of the present embodiment functions as a small-size three-axial magnetic sensor in that the X-axis sensor 2, Y-axis sensor 3, and Z-axis sensor 4 are arranged on a single semiconductor substrate 1. In addition, the magneto-sensitive elements 5 of the giant magnetoresistive elements are formed on the prescribed portions of the slopes of the channels 8 having good planation; hence, it is possible to produce a magnetic sensor having good sensitivity.

In the end portion of an opening of the via, the protective conductive film 26 composed of the giant magnetoresistive element film is laminated on the wiring film 25 composed of the bias magnet film, thus avoiding breakage of the wiring film 25 at the corners of the step portions.

In addition, the pinning direction of the magneto-sensitive element 5 is inclined by an angle ranging from 30° to 60° with respect to the longitudinal direction, thus making it possible to produce a giant magnetoresistive element having stability against a high magnetic field.

Next, the manufacturing method of the magnetic sensor of the present embodiment will be described.

Hereinafter, the following description will be mainly given with respect to the manufacturing method regarding vias, pads, and giant magnetoresistive elements that form the Z-axis sensor 4 and that are formed on the slopes of the channels 8.

FIGS. 9, 10, 11, and 12 show cross-sectional views with regard to a via A, a pad B, and a channel forming region C in the manufacturing method of the magnetic sensor of the present embodiment.

First, there is provided a semiconductor substrate 1. That is, wiring layers and semiconductor integrated circuits such as drive circuits and signal processing circuits of the magnetic sensor are formed in advance on the semiconductor substrate 1 composed of silicon.

As shown in FIG. 9(a), a via A and a pad B corresponding to prescribed parts of a wiring layer, which is an uppermost layer, are formed on the semiconductor substrate 1, wherein the conductive portion 21a composed of aluminum is formed in the via A, and a conductive portion 21b composed of aluminum is formed in the via B.

A planation film 31 is formed on the aforementioned semiconductor substrate 1. For example, the planation film 31 is formed by sequentially laminating a silicon oxide film of 300 nm thickness by way of the plasma CVD (plasma chemical vapor deposition) method, as SOG film of 600 nm thickness, and a silicon oxide film of 50 nm thickness, which is formed by way of the plasma CVD method using the TEOS method, thus forming a planar insulating film.

Next, as shown in FIG. 9(b), the planation film 31 is removed from the conductive portion 21a of the via A and the conductive portion 21b of the pad B by way of etching, thus making the conductive portions 21a and 21b be exposed. Next, as shown in FIG. 9(c), a first passivation film 32 (corresponding to the first passivation film 23 shown in FIG. 8) is formed on the overall surface of the semiconductor substrate 1. For example, the first passivation film 32 is formed by sequentially laminating a silicon oxide film 33 of 250 nm thickness by way of the plasma CVD method and a silicon nitride film 34 of 600 nm thickness by way of the plasma CVD method.

Next, as shown in FIG. 9(d), the silicon nitride film 34 deposited on the conductive portion 21a of the via A and the conductive portion 21b of the pad B is removed by way of etching. At this time, the silicon oxide film 33 is left, while the removing range of the silicon nitride film 34 is made smaller than the opening width of the planation film 31. Thus, the terminal portions of the planation film 31 are exposed in the openings of the via A and the pad B, thus preventing water content from being infiltrated into the wiring layer and semiconductor integrated circuits.

Next, as shown in FIG. 10(a), a thick film 35 of 5 μm thickness composed of silicon oxide is formed by way of the plasma CVD method. The thick film 35 corresponds to the thick film 11 shown in FIGS. 4 and 8, in which channels 8 are formed.

Next, as shown in FIG. 10(b), a resist film 36 of 3 μm thickness is formed on the overall surface of the thick film 35. Thereafter, prescribed parts of the resist film 36 are removed by way of exposure and development, thus forming a prescribed resist pattern. Thus, channel regions are exposed with respect to the via A, pad B, and channel forming region C.

Next, as shown in FIG. 10(c), the remaining resist film 36 is subjected to heat treatment for ten minutes or so at a temperature of 150° C., thus dissolving the resist film 36. Surface tension of the solution, which is produced by way of resist dissolution in heat treatment, causes the upper surface of the resist film 36 to rise upwardly, whereby the terminal surface is inclined simultaneously. In particular, the resist film 36 is transformed into a plurality of projections having linear ridgelines in the channel forming region C, wherein the height of the cross-sectional shape reaches about 5 μm.

Thereafter, the resist film 36 and the thick film 35 are subjected to dry etching under the prescribed conditions in which the etching selection ratio between resist and silicon oxide becomes approximately one-to-one. The dry etching is performed under the following conditions.

Etching gas: mixed gas of $CF_4/CHF_3/N_2/O_2$, the mixing ratio of which is 60/180/10/100 sccm.

Process pressure: 400 mTorr (53.2 Pa).

RF power: 750 W.

Electrode temperature: 15° C.

Chamber temperature: 15° C.

In the dry etching, as shown in FIG. 11(a), the recessed areas of the via A and pad B are controlled so as not to become larger than the recessed area of the passivation film 32. Thereafter, the resist film 36 remaining on the thick film 35 is removed.

Thus, as shown in FIG. 11(a), a plurality of the channels 8 are formed in the channel forming region of the thick film 35. Next, as shown in FIG. 11(b), the thick film 35 and the silicon oxide film 33 covering the conductive portion 21a of the via A are removed, thus making the conductive portion 21a be exposed.

Next, a magnet film used for the formation of the bias magnets 6 of the giant magnetoresistive elements is formed on the overall surface of the semiconductor substrate 1 by way of sputtering; then, unnecessary portions are removed by way of resist work and etching. As shown in FIG. 11(c), the bias magnets 6 are formed along the slopes of the channels 8; at the same time, the wiring film 25 is formed on the conductive portion 21a of the via A, thus forming the wiring layer 7 connecting between the wiring film 25 and the bias magnets 6 of the giant magnetoresistive elements.

As described above, the magnet film is formed as a multi-layered thin metal composed of Co—Cr—Pt, for example. At this time, the wiring layer 7 corresponding to the bias magnets 6 of the giant magnetoresistive elements forming the X-axis sensor 2 and the Y-axis sensor 3 is formed on the planar surface of the thick film 35 as well.

In the resist work for the formation of the bias magnets 6, in order to appropriately perform etching on the magnet film in the slopes of the channels 8, it is preferable that the resist film having a prescribed pattern be subjected to heat treatment, thus inclining the terminal surfaces of the resist film.

Next, the giant magnetoresistive element film forming the magneto-sensitive elements 5 of the giant magnetoresistive elements is formed on the overall surface of the semiconductor substrate 1 by way of sputtering. As described above, the giant magnetoresistive element film is formed as a multilayered thin metal.

Thereafter, the semiconductor substrate 1 is set up above a magnet array and is then subjected to heat treatment for three to five hours at a temperature ranging from 260° C. to 290° C., so that the giant magnetoresistive element film is subjected to a pinning process. The details of the pinning process will be described later.

Thereafter, the giant magnetoresistive element film is subjected to resist work and etching, thus removing unnecessary portions therefrom. As shown in FIG. 12(a), the magneto-sensitive elements 5 are formed on the slopes of the channels 8, thus completing the formation of the giant magnetoresistive elements. That is, it is possible to complete the production of the Z-axis sensor 4.

At the same time, the giant magnetoresistive element film is left on the wiring film 25 composed of the magnet film, which is formed in advance on the conductive portion 21a of the via A, and is used as the protective conductive film 26. Thus, it is possible to produce the structure of the via A shown in FIG. 8. At the same time, the magneto-resistive elements 5 are formed on the planar surface of the thick film 35 as well, thus producing giant magnetoresistive elements. This completes the production of the X-axis sensor 2 and the Y-axis sensor 3.

Next, as shown in FIG. 12(b), a passivation film 27 of 1 μm thickness composed of silicon nitride is formed by way of the plasma CVD method; and then the protection film 28 composed of polyimide is formed. The protection film 28 and the passivation film 27 are removed from the pad B, thus forming a recess.

Next, as shown in FIG. 12(c), etching is performed using the protection film 28 as a mask, so that the passivation film 32 and the thick film 35 covering the conductive portion 21b of the pad B are removed, thus making the conductive portion 21b be exposed. This completes the production of a magnetic sensor of the present embodiment.

Figure 13:
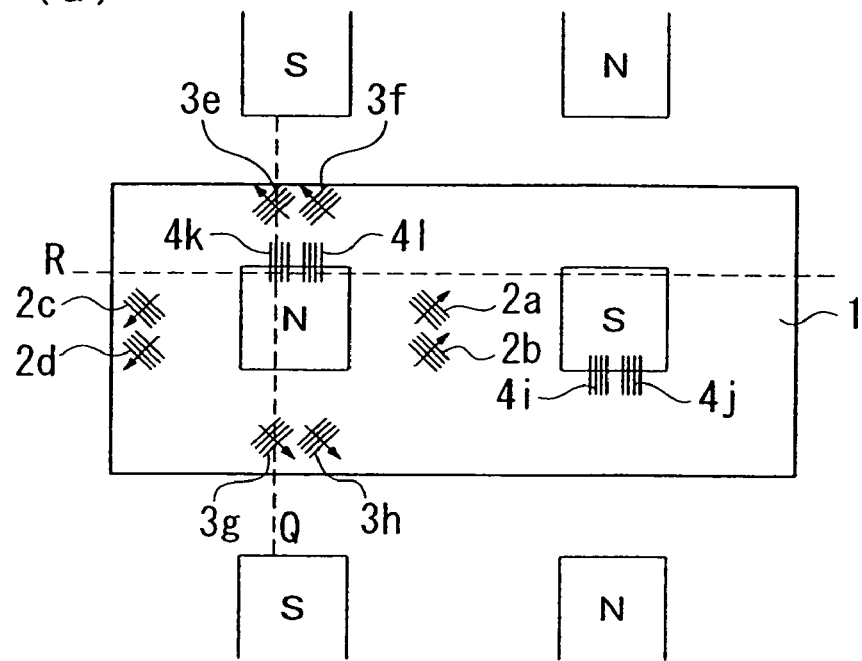
FIG. 13 A plan view and cross-sectional views showing the relationships between giant magnetoresistive elements and polarities of magnets of a magnet array used in a pinning process in the manufacturing method of the magnetic sensor of the first embodiment.
Figure 13:
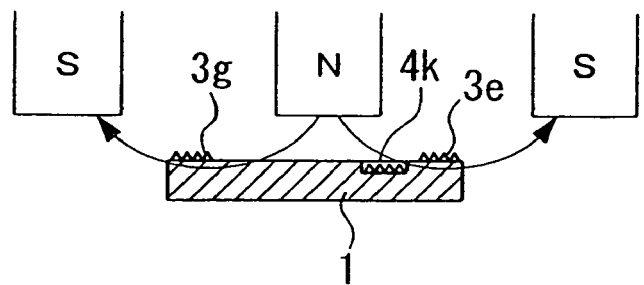
Figure 13:
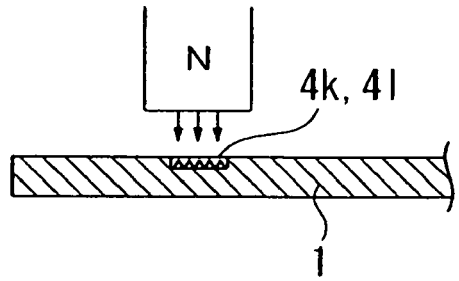
Figure 14:
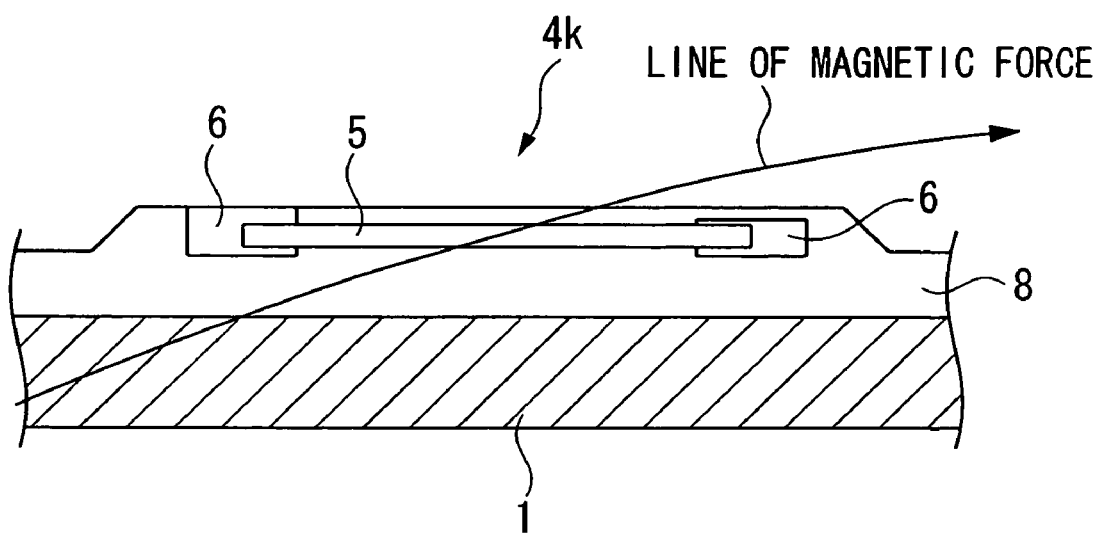
FIG. 14 A cross-sectional view showing the direction of a line of magnetic force exerted on giant magnetoresistive elements in the pinning process shown in FIG. 13(*b*).

The aforementioned pinning process will be described with reference to FIGS. 13 and 14. FIG. 13 shows the arrangement of magnets in the magnet array. The magnet array is positioned above the surface of the semiconductor substrate 1 on which the giant magnetoresistive elements are formed.

FIG. 13(a) shows the positional relationship between the giant magnetoresistive elements on the surface of the semiconductor substrate 1 and the magnets of the magnet array, wherein S and N represent polarities of magnets positioned opposite to the surface of the semiconductor substrate 1. FIG. 13(b) shows the polarity and arrangement of the magnets in the cross section taken along a dotted line Q in FIG. 13(a). FIG. 13(c) shows the polarity and arrangement of the magnets in the cross section taken along a dotted line R in FIG. 13(a). FIG. 14 is an enlarged view of FIG. 13(b), wherein it shows the direction of a line of magnetic force exerted on a single giant magnetoresistive element.

According to the manufacturing method of the magnetic sensor of the present embodiment, it is possible to form the X-axis sensor 2, Y-axis sensor 3, and Z-axis sensor 4 on the single semiconductor substrate 1, and it is possible to simultaneously produce the via A and pad B. Hence, it is possible to rapidly produce a small-size three-axial magnetic sensor by way of a series of processes.

Second Embodiment

Next, a second embodiment of the present invention will be described. Similar to the first embodiment, the second embodiment is designed such that the X-axis sensor 2, Y-axis sensor 3, and Z-axis sensor 4 are formed using giant magnetoresistive elements formed on the semiconductor substrate 1; hence, the same reference numerals of the first embodiment are used, and the duplicate description will be omitted.

The second embodiment uses the structures shown in FIGS. 1 and 2. The structural difference between the first embodiment and second embodiment will be described with reference to FIGS. 15 and 16. Similar to the illustrations of FIGS. 3 and 4, FIGS. 15 and 16 show the giant magnetoresistive elements 4i and 4j of the Z-axis sensor 4, wherein reference numerals are denoted with respect to slopes, bottoms, and top portions of the channels 8 adjoining together.

Figure 16:
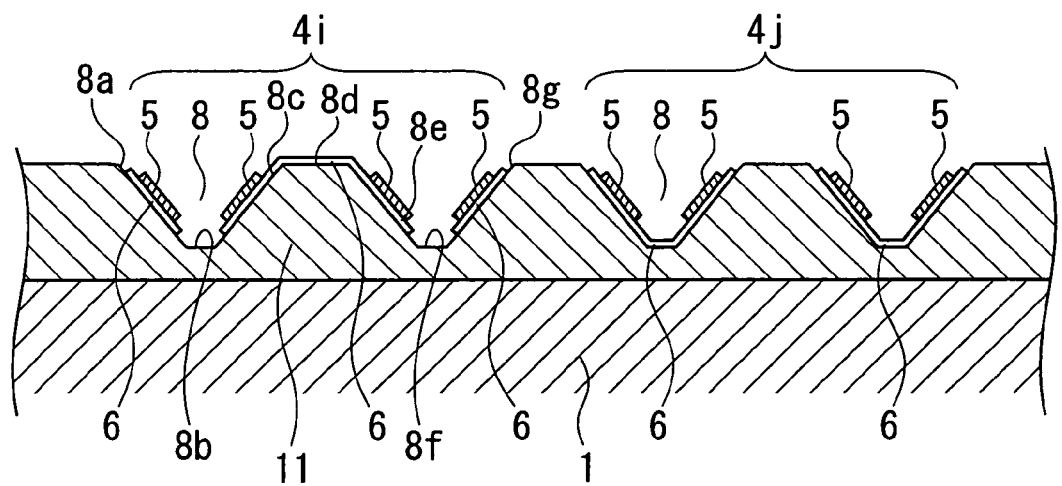
FIG. 16 A cross-sectional view showing a method of forming giant magnetoresistive elements forming the Z-axis sensor shown in FIG. 15.

As shown in FIG. 16, each channel 8 is a thin recess having prescribed dimensions, in which the depth ranges from 3 μm to 7 μm, the length ranges from 250 μm to 300 μm, and the slope width ranges from 3 μm to 8 μm. An angle between the slope and the thick film 11 ranges from 30° to 80° and is preferably set to 70°.

Incidentally, FIG. 16 is shown such that the channel 8 has planar slopes; however, in the actual manufacturing process, the slope is curved externally (toward the upper side of the semiconductor substrate 1).

Figure 15:
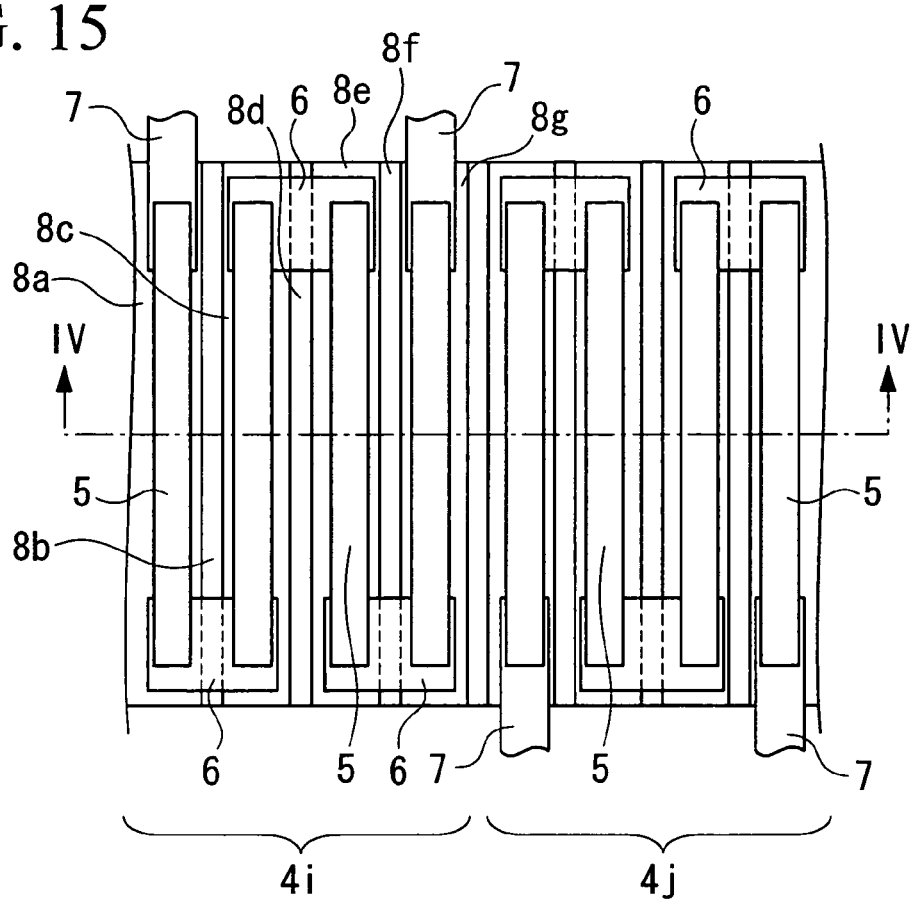
FIG. 15 A plan view showing the structure of giant magnetoresistive elements forming a Z-axis sensor in accordance with a second embodiment.

With respect to the giant magnetoresistive element 4i shown in FIGS. 15 and 16, the magneto-sensitive element 5 is formed on a slope 8a via the bias magnet 6. The magneto-sensitive element 5 formed on a slope 8c, which adjoins the slope 8a via a bottom 8b, is electrically connected to the magneto-sensitive element 5 formed on a slope 8e, which adjoins the slope 8c via a top portion 8d, via the bias magnet 6. In addition, the magneto-sensitive element 5 is formed on a slope 8g, which adjoins the slope 8e via a bottom 8f, via the bias magnet 6.

The detailed structure of the magnetic sensor of the second embodiment is similar to that of the first embodiment shown in FIGS. 5 to 8.

Next, the manufacturing method of the magnetic sensor of the second embodiment will be described.

Figure 9:
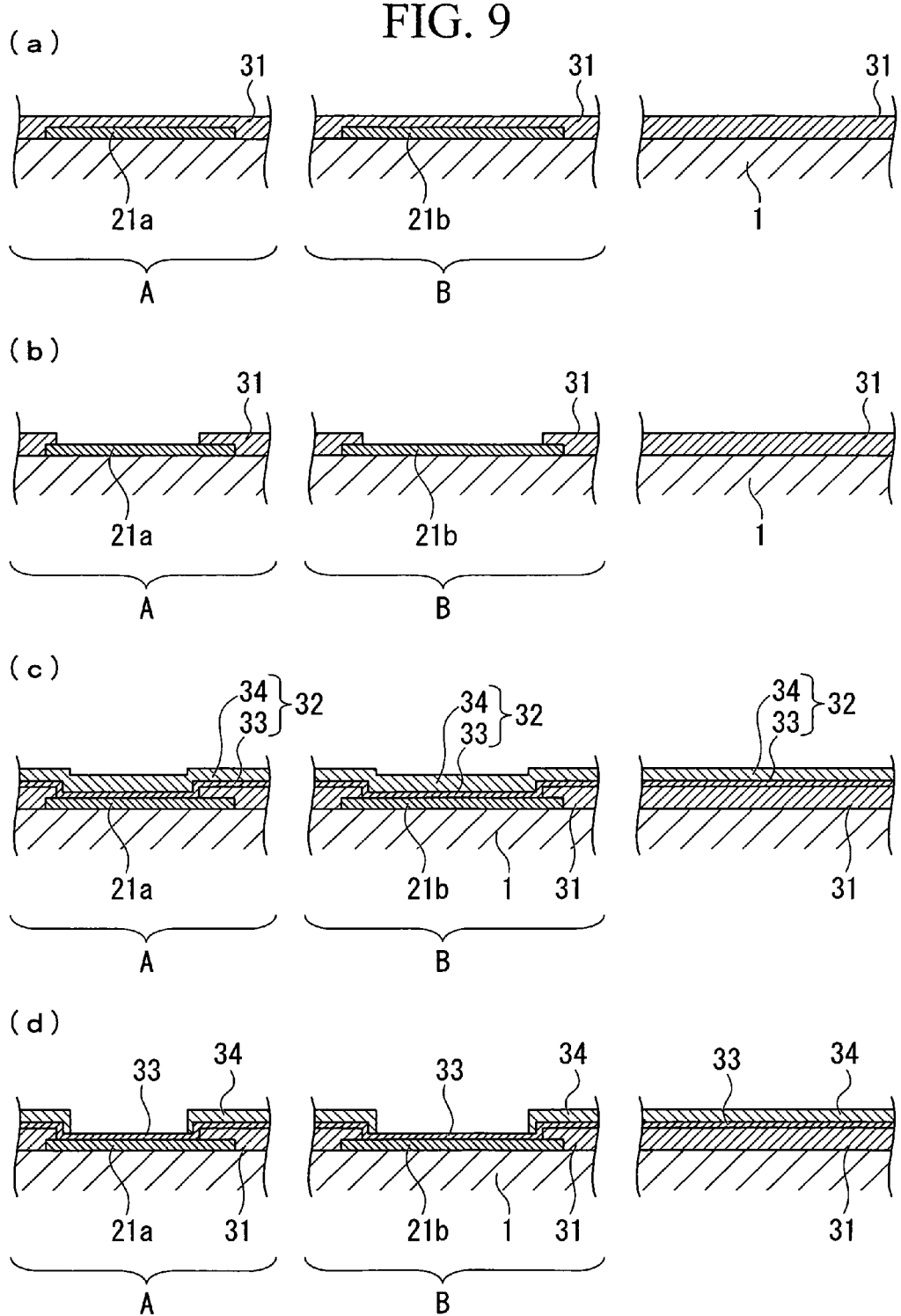
FIG. 9 Cross-sectional views showing a manufacturing method of the magnetic sensor of the first embodiment.

The manufacturing process of the first embodiment shown in FIG. 9 is repeated in the second embodiment; hence, the description thereof will be omitted.

Figure 17:
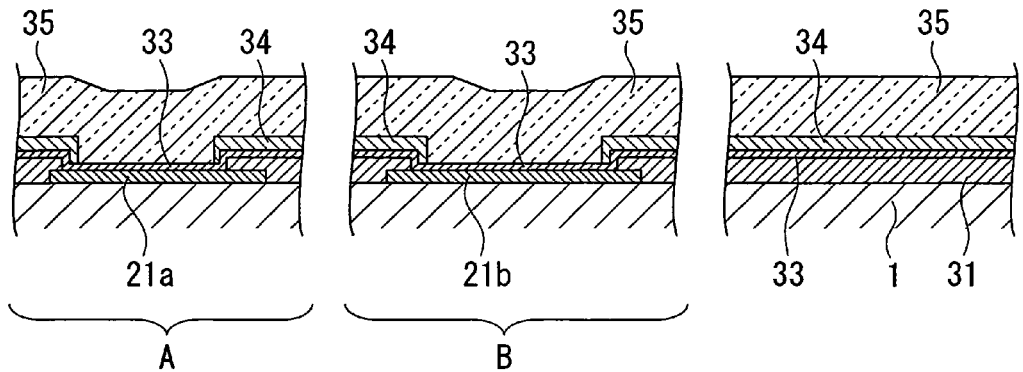
FIG. 17 Cross-sectional views showing a manufacturing method of a magnetic sensor in accordance with the second embodiment, which correspond to FIG. 10 used in the first embodiment.
Figure 17:
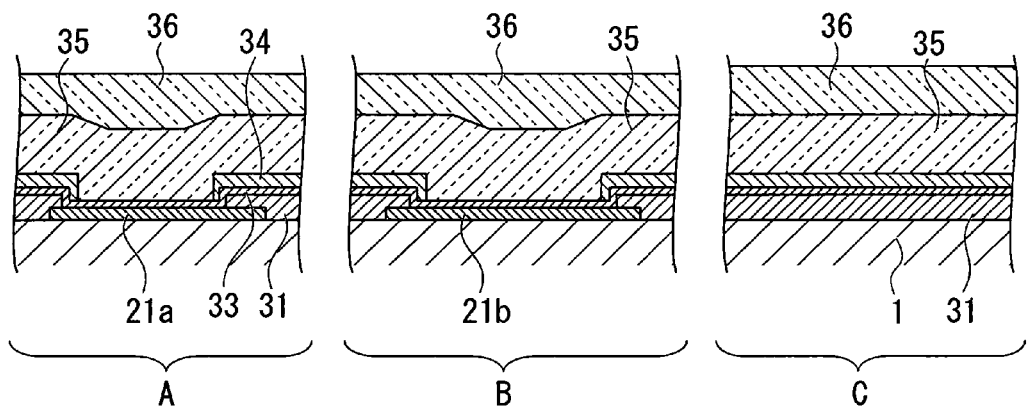
Figure 17:
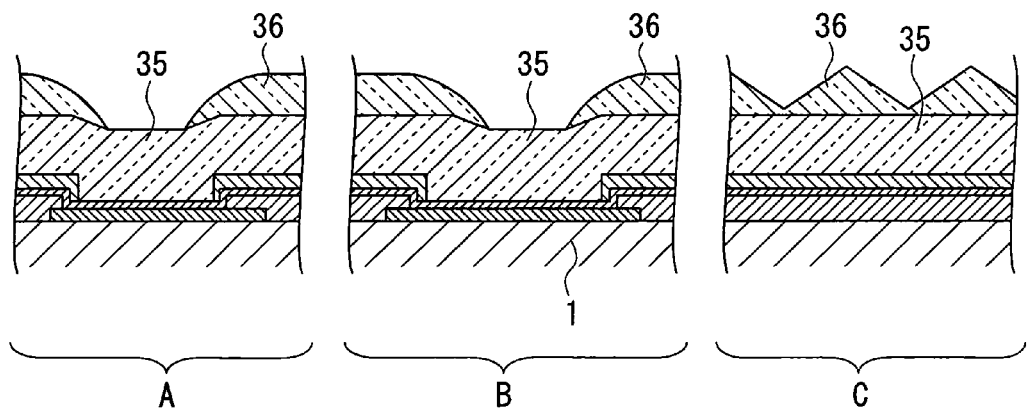

After completion of the process shown in FIG. 9(a)-(d), as shown in FIG. 17(a), the thick film 35 of 5 μm thickness composed of silicon oxide is formed by way of the plasma CVD method. In the following process, a plurality of the channels 8 are formed using the thick film 35.

Next, as shown in FIG. 17(b), the resist film 36 of 5 μm thickness is formed on the overall surface of the thick film 35. Then, as shown in FIG. 17(c), prescribed parts of the resist film 36 are removed by way of etching, thus making the via A and the pad B be exposed. In addition, prescribed parts of the resist film 36 in the channel forming region C are pressed so as to form a consecutive zigzag shape by way of the stamper method. That is, it is possible to form a plurality of projections and channels, wherein the cross-sectional shape of each projection is roughly formed in a triangular shape and the top portion thereof is sharpened.

The process for forming a plurality of channels in the resist film 36 in the channel forming region C by way of the stamper method will be described with reference to FIG. 18.

In the stamper method, at least one pair of alignment marks are formed in advance on both ends of the semiconductor substrate 1 when an uppermost wiring layer is formed on the semiconductor substrate 1.

First, as shown in FIG. 18(a), resist is applied to the overall surface of the thick film 35, thus forming the resist film 36. Then, the resist film 36 is subjected to heat treatment for five minutes at a temperature of 120° C. This improves the adhesion between the thick film 35 and the resist film 36, and this makes it possible to easily separate a mold, which is brought into contact with the resist film 36, from the resist film 36 in the after-treatment.

Next, as shown in FIG. 18(b) a mold 37 137 is attached to a contact aligner (not shown); then, the semiconductor substrate 1 in which the resist film 36 is formed is positioned at a prescribed position of the contact aligner, so that the mold 137 is positioned opposite to the resist film 36 formed on the semiconductor substrate 1. In this case, positioning is performed between alignment marks, which are applied to the semiconductor substrate 1, and alignment marks, which are applied to the mold 137 at prescribed positions opposite to the semiconductor substrate 1, thus establishing precise positioning between the semiconductor substrate 1 and the mold 137.

The mold 137 is composed of quartz, in which the aforementioned alignment marks are applied at the prescribed positions opposite to the semiconductor substrate 1. In addition, a plurality of projections 137a, which are consecutively aligned in a zigzag manner (and whose cross sections are each formed in an acute triangular shape having a summit), are formed in the mold 137 at prescribed positions suiting the channel forming regions C of the thick film 35.

Figure 18:
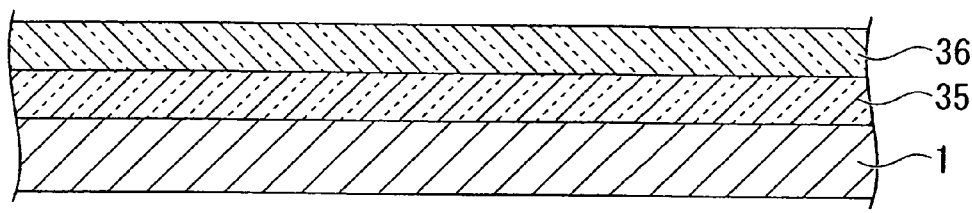
FIG. 18 Cross-sectional views showing processes for forming projections and channels in a zigzag manner in a channel forming region by way of a stamper method shown in FIG. 17(c).
Figure 18:
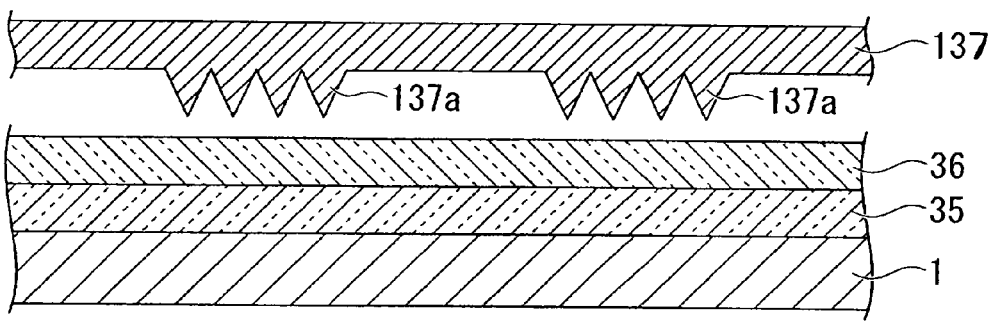
Figure 18:
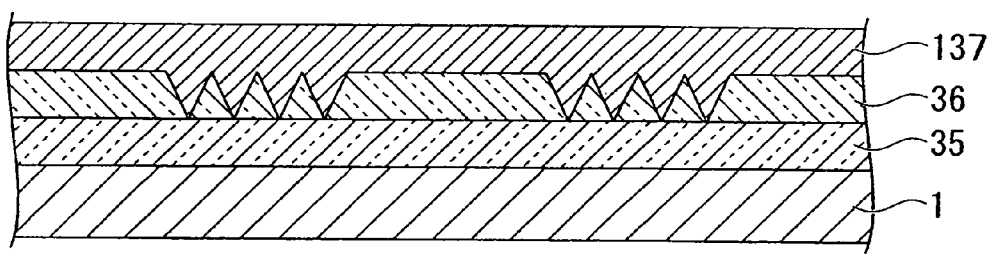
Figure 18:
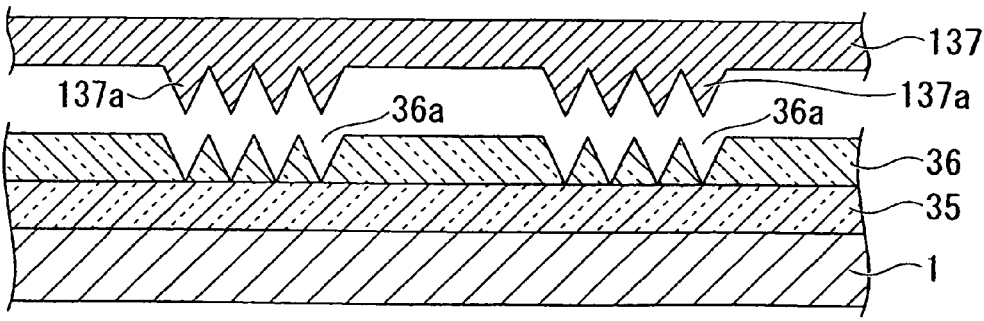

Next, as shown in FIG. 18©, the mold 137 is pressed against the resist film 36 formed on the semiconductor substrate 1. In order to realize easy separation between the resist film 36 and the mold 137 in the after-treatment, it is preferable that the contact surface (particularly, the lower surface at which the projections 137a are formed) of the mold 137 in contact with the resist film be covered with a fluorocarbon resin or be subjected to prescribed surface processing (or silicon processing).

Thereafter, the resist film 36 is subjected to heat treatment for ten minutes at a temperature of 150° C., thus dissolving the resist film 36. This makes the terminal surfaces of the via A and the pad B be inclined; and channels suiting the projections 137a are formed in the channel forming region C.

Incidentally, as the temperature is increased from the room temperature, the resist film 36 becomes softened at 150° C., and then it becomes hardened when the temperature of 200° C. That is, the resist film 36 is not hardened at the temperature of 150° C. In the present embodiment, the mold 137 is subjected to pressing as the resist film 36 becomes softened, so that the channel forming region C is deformed in shape to suit the projections 137a. Next, while the mold 137 is being pressed against the resist film 36 on the semiconductor substrate 1, the resist film 36 is cooled, and then the mold 137 is separated, so that the resist film 36 is hardened without changing channel shapes formed therein. When the heating temperature exceeds 100° C., solvent starts to be vaporized, thus improving adhesion between the semiconductor substrate 1 and the resist film 36.

Next, as shown in FIG. 18(d), the mold 137 is separated from the resist film 36. This allows the channels 36a whose shapes suit the projections 137a of the mold 137 to be formed in the resist film 36. Incidentally, the aforementioned mold 137 can be combined with a photomask; hence, it is possible to simultaneously realize the pattern formation of the resist film 36 and the formation of the channels 36a.

Next, as shown in FIG. 19(a), the resist film 36 and the thick film 35 are subjected to dry etching with an etching selection ratio of 1:1 between resist and silicon oxide, thus forming a plurality of channels 8 in the thick film 35 and also making the thinned thick film 35 be left in the via A and the pad B at the same time.

The aforementioned dry etching is performed under the following conditions.

Etching gas: $CF_4/CHF_3/N_2/O_2$, mixing ratio 60/180/10/100 sccm.

Pressure: 400 mTorr.

RF Power: 750 W.

Electrode temperature: 15° C.

Chamber temperature: 15° C.

In the aforementioned dry etching, as shown in FIG. 19(a), the recessed widths of the via A and the pad B are set not to be larger than the recessed width of the passivation film 32. Then, the resist film 36 remaining above the thick film 35 is removed.

Thus, as shown in FIG. 19(a), a plurality of channels 8 are formed in the channel forming region C of the thick film 35. Then, as shown in FIG. 19(b), the thick film 35 and the silicon oxide film 33 covering the via A are removed by way of resist work and etching, thus making the conductive portion 21a of the via A be exposed.

Next, the magnet film used for the formation of the bias magnets 6 of the giant magnetoresistive elements is formed on the overall surface of the semiconductor substrate 1 by way of sputtering. Then, unnecessary portions of the magnet film are removed by way of resist work and etching, so that as shown in FIG. 19(c), the bias magnets 6 are formed on the slopes of the channels 8, and the wiring film 25 is formed above the conductive portion 21a of the via A at the same time. In addition, the wiring layer 7 is formed to connect the wiring film 25 and the bias magnets 6 of the giant magnetoresistive elements.

As described above, a multilayered thin metal is used for the magnet film.

In this case, the bias magnets 6 of the giant magnetoresistive elements forming the X-axis sensor 2 and the Y-axis sensor 3 are formed together with the wiring layer 7 on the planar surface of the thick film 35.

In order to appropriately perform etching on the magnet film with respect to the slopes of the channels 8 in the resist work used for the formation of the bias magnets 6, the resist film 36 in which a prescribed pattern is formed is subjected to heat treatment, thus making the terminal surfaces thereof be inclined.

Next, in order to form the magneto-sensitive elements 5 of the giant magnetoresistive elements, the giant magnetoresistive element film is formed on the overall surface of the semiconductor substrate 1 by way of sputtering. The aforementioned multilayered thin metal is used as the giant magnetoresistive element film.

Then, the semiconductor substrate 1 is set up above a magnet array and is subjected to heat treatment for three to five hours at a temperature ranging from 260° C. to 290° C., thus performing the pinning process on the giant magnetoresistive element film.

Figure 20:
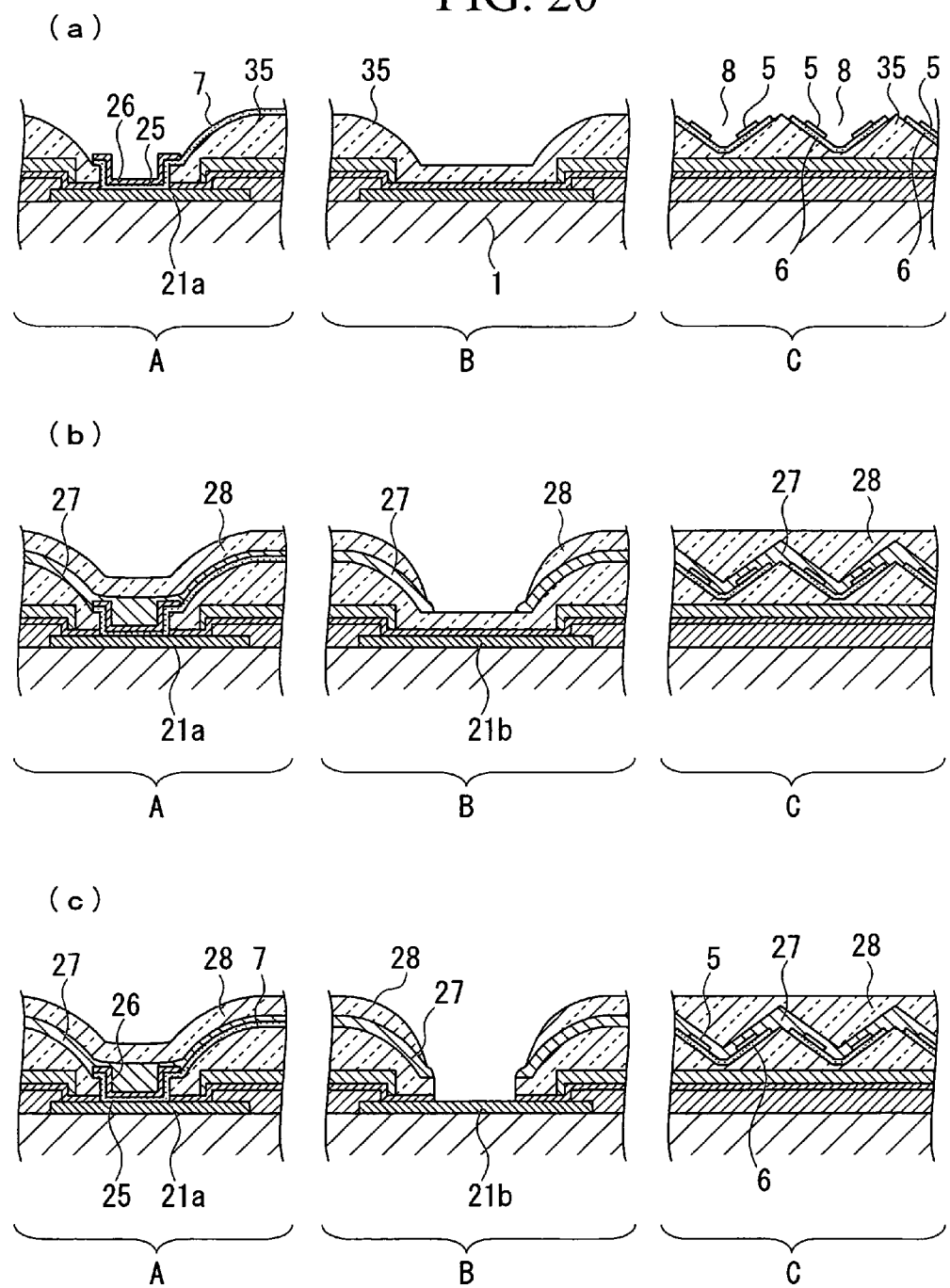
FIG. 20 Cross-sectional views showing the manufacturing method of the magnetic sensor of the second embodiment subsequently to FIG. 19.

Thereafter, the giant magnetoresistive element film is subjected to resist work and etching, thus removing unnecessary portions therefrom. As shown in FIG. 20(*a*), the magneto-sensitive elements 5 are formed on the slopes of the channels 8, thus producing the giant magnetoresistive elements. This completes the production of the Z-axis sensor 4.

In the above, the giant magnetoresistive element film is left above the wiring film 25 composed of the magnet film formed on the conductive portion 21*a* of the via A, and it is used as the protection conductive film 26. Thus, it is possible to form the via A having the structure shown in FIG. 8.

At the same time, the magneto-sensitive elements 5 are formed on the planar surface of the thick film 35 as well, thus completing the production of the giant magnetoresistive elements forming the X-axis sensor 2 and the Y-axis sensor 3.

Next, as shown in FIG. 20(*b*), the passivation film 27 of 1 μm thickness composed of silicon oxide is formed by way of the plasma CVD method, and the protection film 28 composed of polyimide is formed thereon. Then, the protection film 28 and the passivation film 27 are removed from the pad B, which is thus exposed.

Next, as shown in FIG. 20(*c*), etching is performed using the protection film 28 as a mask, whereby the silicon oxide film 33 and the thick film 35 covering the conductive portion 21*b* are removed so as to make the pad B be exposed. This completes the production of the magnetic sensor of the present embodiment.

According to the manufacturing method of the magnetic sensor of the present embodiment, it is possible to form the X-axis sensor 2, Y-axis sensor 3, and Z-axis sensor 4 on a single semiconductor substrate 1 and to also form the via A and the pad B; it is possible to easily produce a small-size three-axial magnetic sensor by way of a series of consecutive processes. In addition, the mod 137 having the projections 137*a*, which are shaped to suit the channels 8 formed in the thick film 35, is pressed against the resist film 36 so as to form the channels 8; hence, it is possible to easily form the channels 8 by way of the etching of the thick film 35. This improves the planation with respect to the slopes of the channels 8. Since the magneto-sensitive elements forming the giant magnetoresistive elements are formed on the slopes of the channels 8, it is possible to form the Z-axis sensor 4 having a fixed sensing direction and a high sensitivity.

In the manufacturing method of the magnetic sensor of the present embodiment, it is possible to change the process for forming a plurality of channels 8 in the channel forming region C of the resist film 36 formed on the semiconductor substrate 1 as described below.

Figure 21:
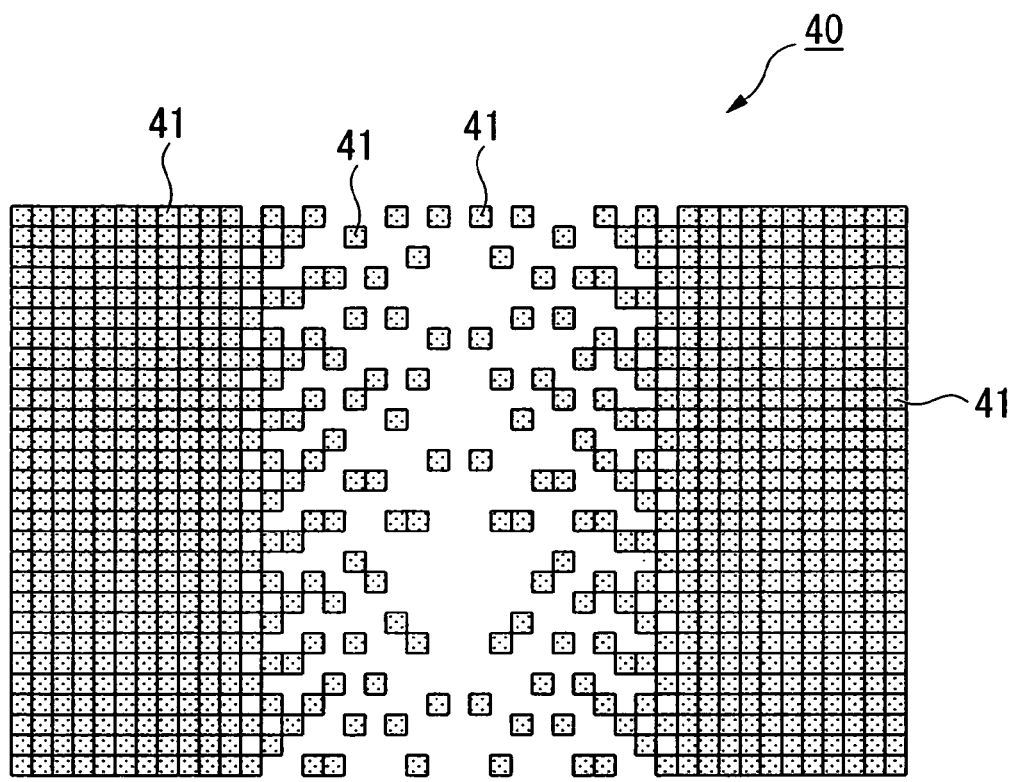
FIG. 21 A conceptual drawing showing a photomask having numerous fine patterns used for the formation of channels in a resist film on a semiconductor substrate, and a graph showing a pattern ratio.
Figure 21:
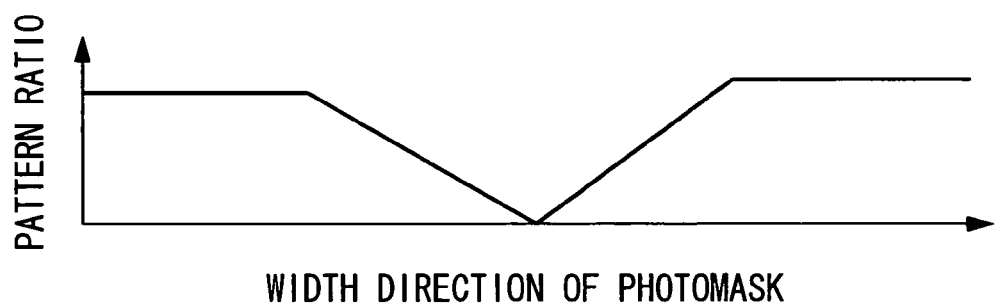

That is, a photomask 40 composed of gray reticles shown in FIG. 21(*a*) is used. Numerous fine patterns 41 each having a resolution that is smaller than a resolution of resist forming the resist film 36 are formed in the photomask 40. As shown in FIG. 21(*b*), the photomask 40 is designed such that the number of fine patterns 41 (hereinafter, referred to as a pattern ratio) per unit area is gradually increased from the center to both ends of the channel formed in the resist film 36. It is possible to appropriately adjust the pattern ratio in response to the shape of the channel 8 or the inclination of the slope of the channel 8.

Figure 22:
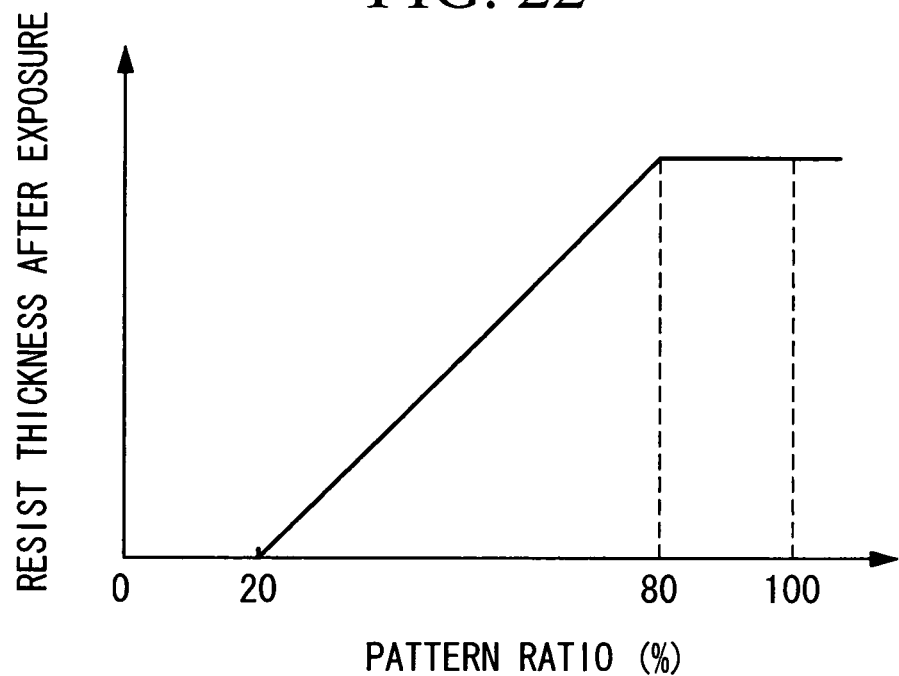
FIG. 22 A graph showing the relationship between the pattern ratio and the resist thickness after exposure.
Figure 23:
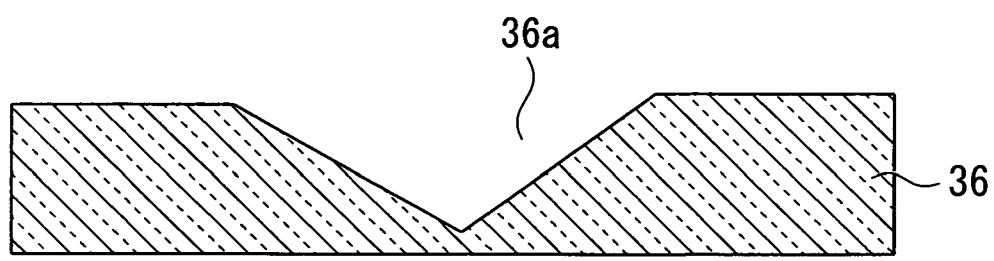
FIG. 23 A cross-sectional view diagrammatically showing the shape of a channel formed using the photomask.

When the resist film 36 is subjected to exposure using the aforementioned photomask 40, regions having higher pattern ratios are easily exposed, while regions having lower pattern ratios are difficult to expose. That is, as shown in FIG. 22, the resist thickness after exposure varies in response to the pattern ratio. As a result, as shown in FIG. 23, a channel 36*a* whose thickness gradually increases from the center to both ends is formed in the resist film 36.

Then, channels are formed in the thick film by way of etching, thus producing a desired magnetic sensor.

In the aforementioned variation, a positive-type resist is used for the formation of the channel 36*a* in the resist film 36 by use of the photomask 40; however, it is possible to form a negative-type resist by setting variations of the pattern ratio of the photomask 40 oppositely to those shown in FIG. 22, whereby a desired channel can be formed in the resist film 36.

According to the manufacturing method of the magnetic sensor of the present embodiment, it is possible to form the X-axis sensor 2, Y-axis sensor 3, and Z-axis sensor 4 on a single semiconductor substrate 1, and it is possible to simultaneously form the via A and the pad B. This makes it possible to rapidly produce a small-size three-axial magnetic sensor by way of a series of consecutive processes.

With respect to the formation of channels, it is possible to form the photomask 40 having numerous fine patterns 41, the number of which per unit area gradually increases from the center to both ends of the channel. The photomask 40 is positioned opposite to the resist film 36, which is then subjected to exposure and development, thus forming the desired channel 36*a*. This makes it possible to easily form channels having prescribed shapes by way of etching of the thick film 35; hence, it is possible to improve the planation with respect to the slopes of the channels. That is, magneto-sensitive elements of giant magnetoresistive elements are formed on the slopes of the channels having improved planation; hence, it is possible to produce a Z-axis sensor 4 having a fixed sensing direction and a high sensitivity.

Third Embodiment

A magnetic sensor of a third embodiment is similar to the magnetic sensors of the first and second embodiments, although the manufacturing method thereof partially differs from the foregoing ones. That is, after the foregoing processes of FIGS. 9 and 10, which are described in the first embodiment, the resist film 36 and the thick film 35 are subjected to dry etching in accordance with the reactive ion etching (RIE) method in high ion etching conditions, so that a plurality of channels 8 are formed in the thick film 35, and at the same time, the thick film 35 is reduced in thickness in connection with the via A and the pad B.

The high ion etching conditions in the reactive ion etching are as follows:

Etching gas: $CF_4/CHF_3/O_2/Ar$, mixing ratio of 30/90/50, 100/50, 200 sccm.

Pressure: 100 to 400 mTorr.

RF Power: 750 to 1200 W.

Figure 19:
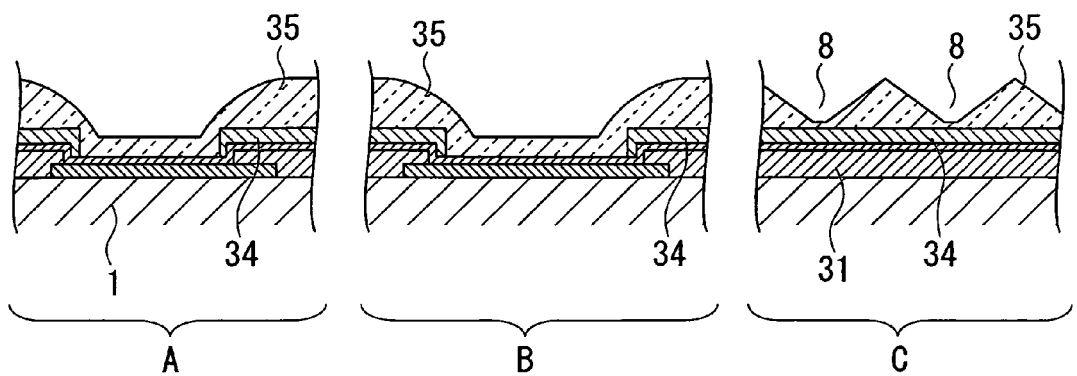
FIG. 19 Cross-sectional views showing the manufacturing method of the magnetic sensor of the second embodiment subsequently to FIG. 17.
Figure 19:
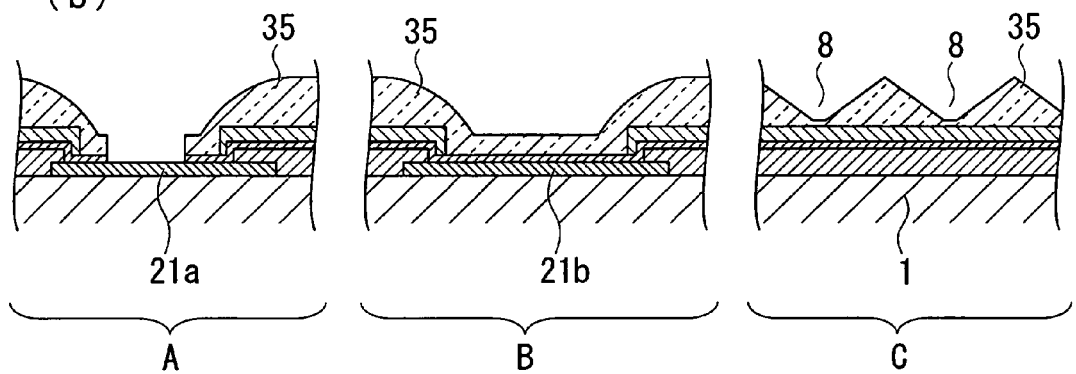
Figure 19:
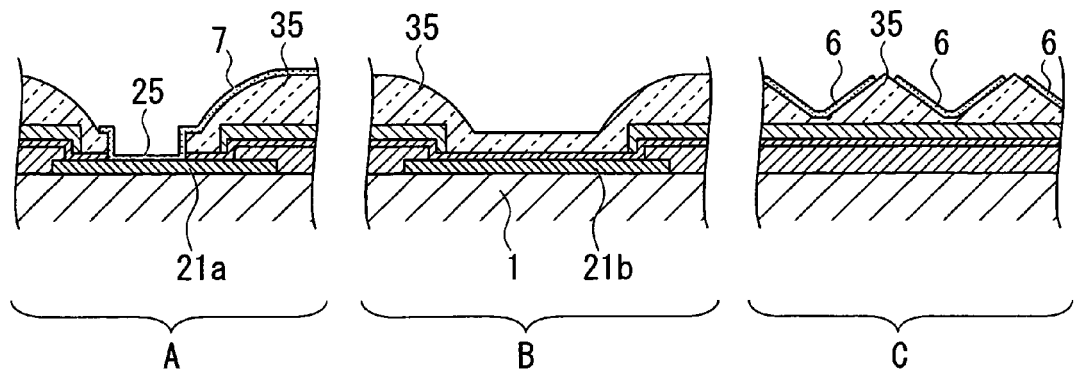

Under the aforementioned high ion etching conditions, it is possible to realize the shape shown in FIG. 19(*a*) used in the second embodiment. Then, as described in the second embodiment, the foregoing processes shown in FIGS. 19(*b*), (*c*), and FIGS. 20(*a*), (*b*), (*c*) are performed.

According to the third embodiment, it is possible to form the X-axis sensor 2, Y-axis sensor 3, and Z-axis sensor 4 on a single semiconductor substrate 1, and it is possible to form the via A and the pad B at the same time; hence, it is possible to rapidly produce a small-size three-axial magnetic sensor by way of a series of consecutive processes. In addition, dry etching is performed in accordance with the reactive ion etching method in the high ion etching conditions, whereby it is possible to form a plurality of channels 8 whose cross-sectional shapes are connected in a zigzag manner, in the thick film 35 in the channel forming region C; hence, it is possible to improve the planation with respect to the slopes of the channels 8.

Figure 24:
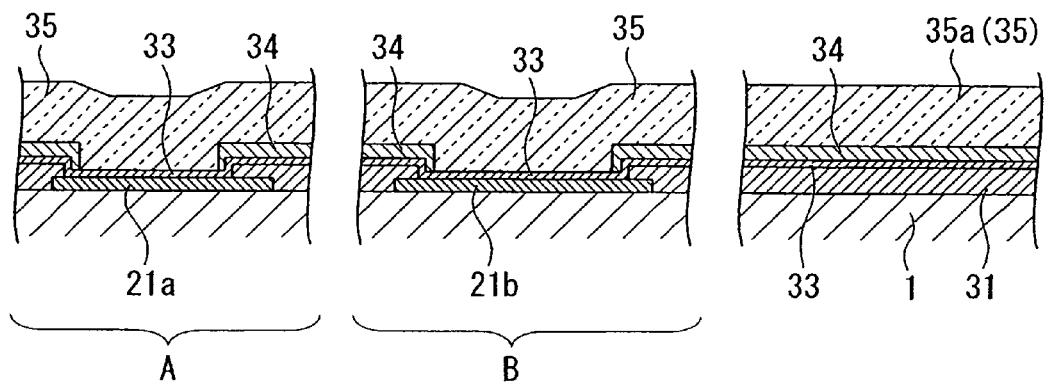
FIG. 24 Cross-sectional views showing a method of forming a plurality of projections having slopes in an insulating film of a channel forming region by way of the high-density plasma CVD method in accordance with a third embodiment of the present invention.
Figure 24:
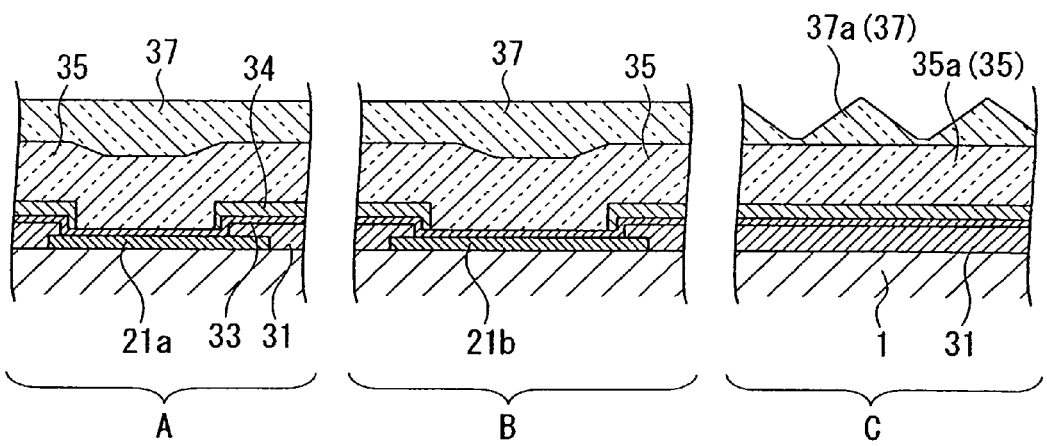

Incidentally, after the completion of the foregoing processes shown in FIGS. 9(a) to (d), it is possible to perform processes shown in FIGS. 24(a) and (b).

That is, as shown in FIG. 24(a), the thick film of 5 μm thickness composed of silicon oxide is formed by way of the plasma CVD method. Herein, a plurality of projections 35a each having a rectangular cross-sectional shape are formed only in the channel forming region C.

Next, as shown in FIG. 24(b), silicon oxide is deposited on the thick film 35 by way of the high-density plasma CVD method, thus forming an insulating film 37 whose thickness ranges from 3 μm to 5 μm. Herein, the insulating film 37 having a planar surface is formed in connection with the via A and the pad B, whereas the projections 37a having slopes are formed in the channel forming region C.

In the high-density plasma CVD method, silicon oxide is subjected to synthesis and deposition by use of high-density plasma (e.g., an electron density ranging from $1 \times 10^9/cm^3$ to $5 \times 10^{10}/cm^3$), and at the same time, prescribed parts of the deposited silicon oxide are subjected to plasma etching.

By the aforementioned high-density plasma CVD method, the insulating film 37 composed of silicon oxide is deposited on the plurality of projections 35a of the thick film 35, so that it projects upwardly in comparison with the periphery thereof. Upper corners of the insulating film 37 are subjected to cutting in the channel forming region C, so that the projections 37a having slopes are formed.

The high-density plasma CVD method is performed under the following conditions.

Monosilane flow: 50 to 150 sccm.
Oxygen flow: 100 to 200 sccm.
Pressure: 1 to 10 Pa.
Temperature: 250° C. to 450° C.
High frequency output: 2 kW to 5 kW.
Frequency: 10 MHz to 20 MHz.

Thereafter, the thick film 35 and the insulating film 37 are entirely subjected to back-etching in accordance with the reactive ion etching method, plasma dry etching method, and ion milling method, thus forming projections having slopes in the thick film 35 (see the channel forming region C shown in FIG. 19). As described above, a plurality of channels are formed. Then, the thick film 35 is subjected to dry etching by using the resist film 36, which has opening patterns in connection with the via A and the pad B, as a mask, thus reducing the thickness of the thick film 35 remaining in the via A and the pad B.

The following etching conditions are adapted to the reactive ion etching method, which is performed to form a plurality of the channels 8.

Etching gas: $CF_4/CHF_3/O_2/Ar$, mixing ratio of 30/90/50, 100/50, and 20 sccm.
Pressure: 100 to 400 mTorr.
RF Power: 750 to 1200 W.

In addition, the following conditions are adapted to the plasma etching method, which is performed to form a plurality of the channels 8.

Etching gas: Ar, 100 sccm.
RF Power: 1200 W.
Pressure: 100 mTorr.
Electrode temperature: 100° C.

Furthermore, the following conditions are adapted to the ion milling method, which is performed to form a plurality of the channels 8.

Ar gas: 4 to 10 sccm.
Pressure: $1 \times 10^4$ to $1 \times 10^{-3}$ Torr.
Acceleration voltage: 50 to 1000 W.
Current: 150 to 350 mA.
Electrode angle (i.e., an angle formed between the propagation direction of acceleration particles and the normal line of a wafer): 0±45°.

After the aforementioned process, the foregoing processes shown in FIGS. 19 and 20, which are described in the second embodiment, are performed.

Fourth Embodiment

Figure 25:
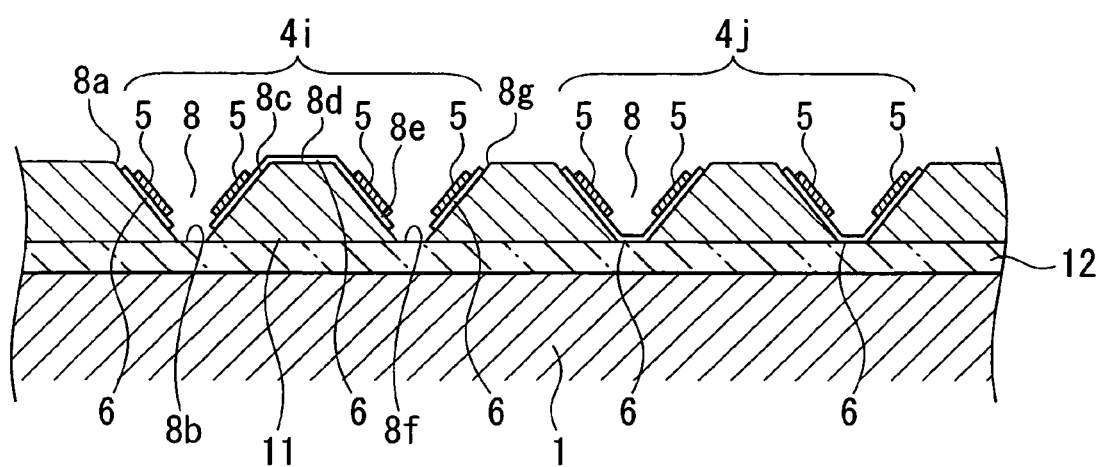
FIG. 25 A cross-sectional view showing a method of forming giant magnetoresistive elements forming a Z-axis sensor in accordance with a fourth embodiment of the present invention.

A magnetic sensor of a fourth embodiment is similar to the foregoing magnetic sensors of the first and second embodiments, although it partially differs from the foregoing ones in terms of the manufacturing method. Incidentally, unlike the foregoing structures shown in FIGS. 4 and 16, the fourth embodiment is designed such that, as shown in FIG. 25, an etching stopper layer 12 composed of a passivation film and an insulating film is inserted between the semiconductor substrate 1 and the thick film 11.

The manufacturing method of the magnetic sensor of the fourth embodiment will be described.

Figure 10:
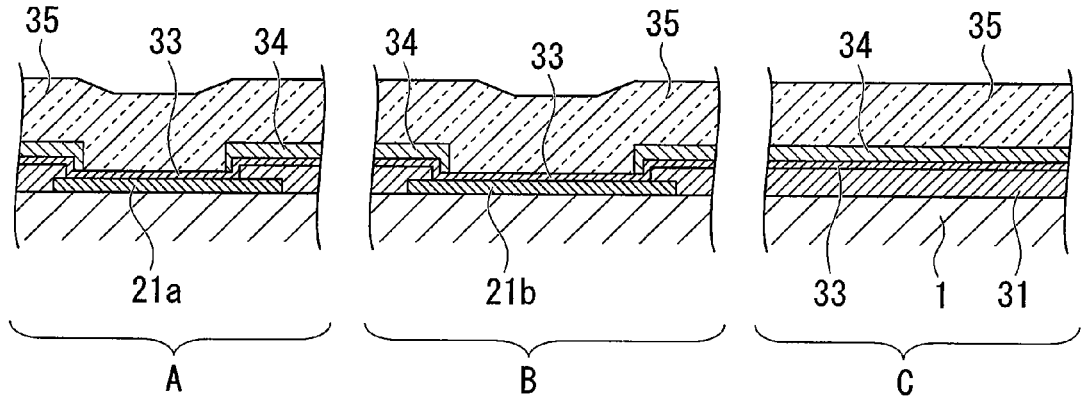
FIG. 10 Cross-sectional views showing the manufacturing method of the magnetic sensor of the first embodiment subsequently to FIG. 9.
Figure 10:
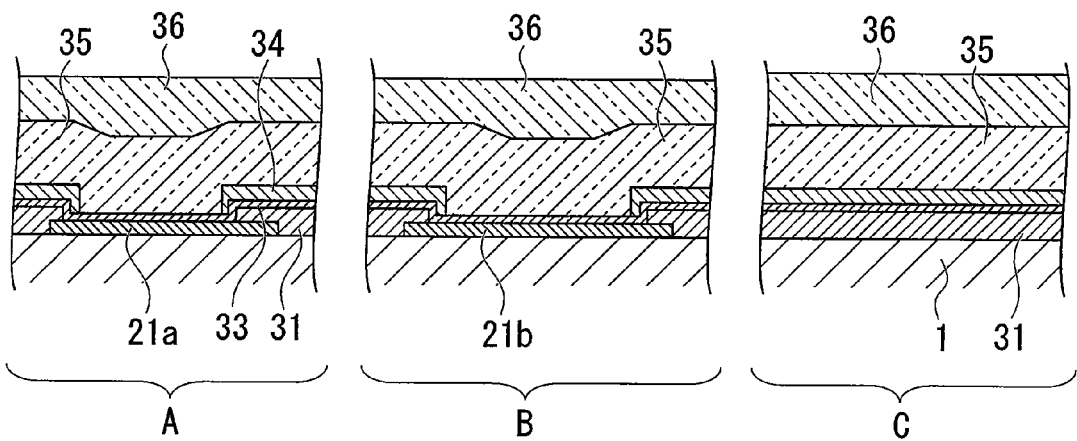
Figure 10:
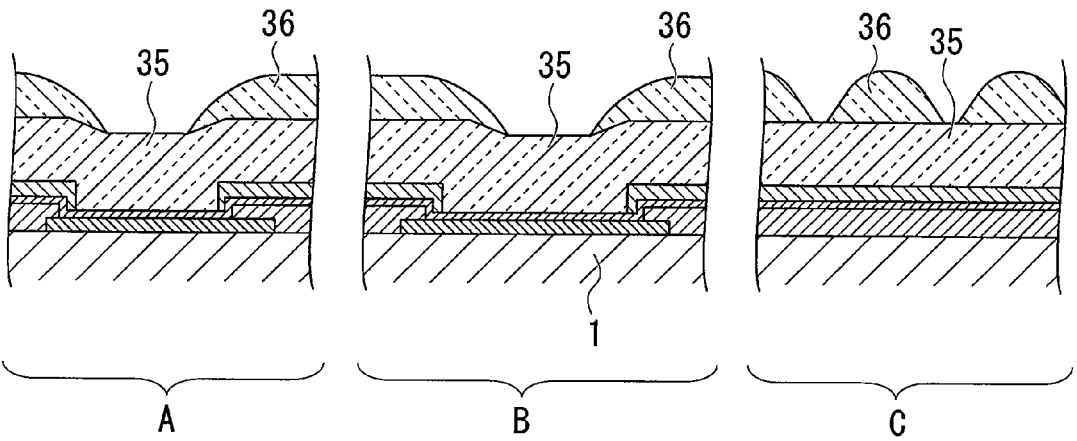
Figure 11:
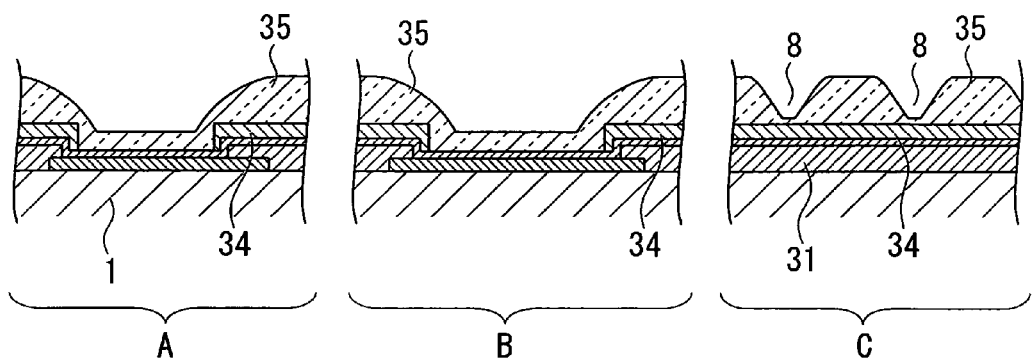
FIG. 11 Cross-sectional views showing the manufacturing method of the magnetic sensor of the first embodiment subsequently to FIG. 10.
Figure 11:
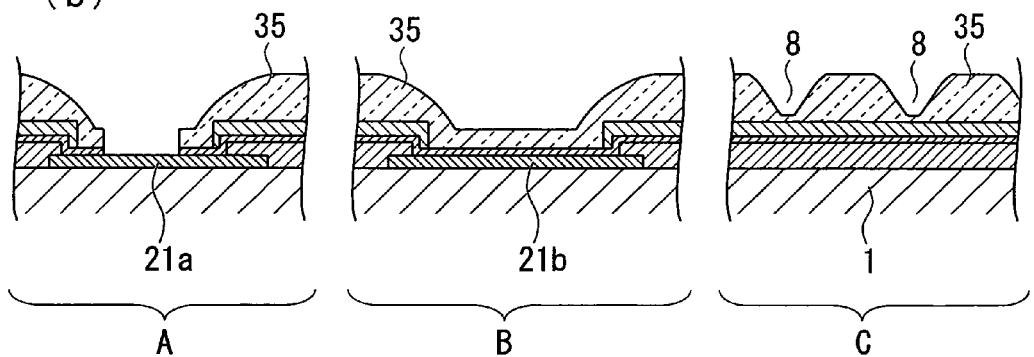
Figure 11:
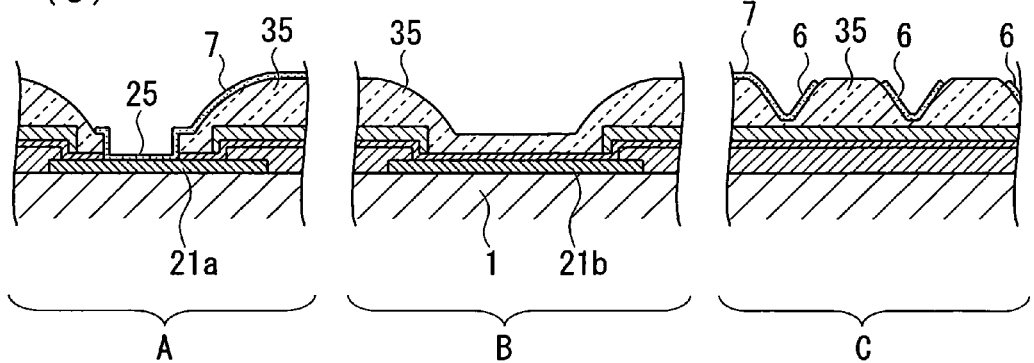
Figure 12:
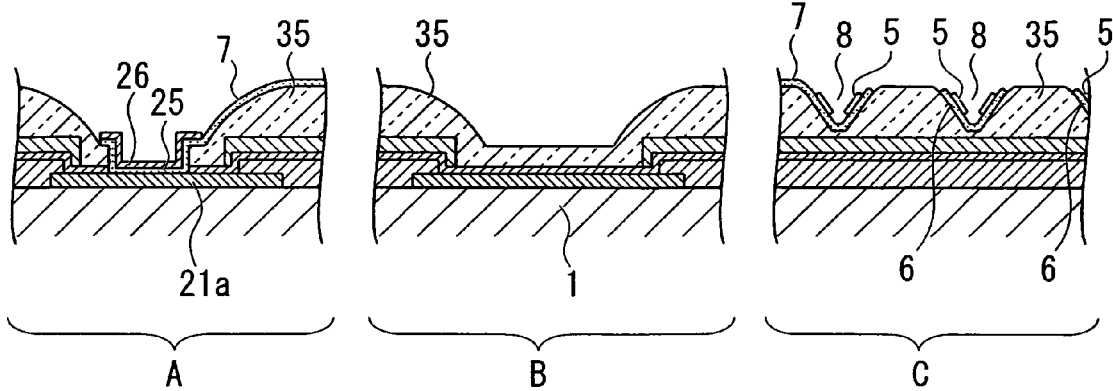
FIG. 12 Cross-sectional views showing the manufacturing method of the magnetic sensor of the first embodiment subsequently to FIG. 11.
Figure 12:
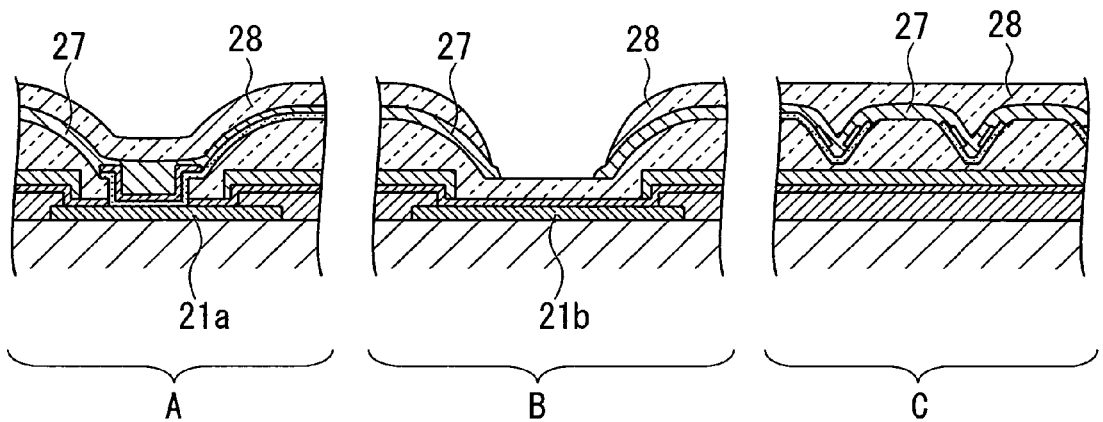
Figure 12:
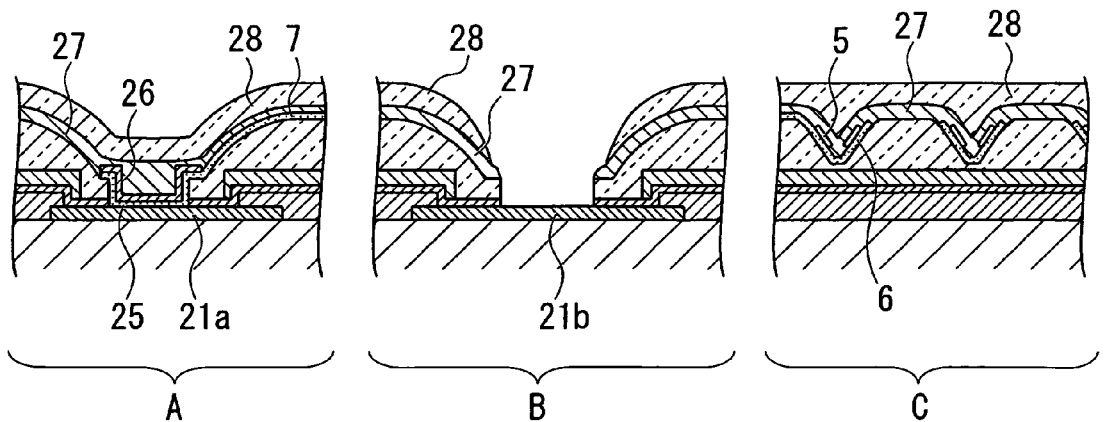

Similar to the first embodiment, after completion of the foregoing processes shown in FIGS. 9 and 10, the resist film 36 and the thick film 35 are subjected to dry etching by using the silicon nitride film 34 to form the upper layer of a passivation film 32 as an etching stopper as shown in FIG. 11(a), thus forming a plurality of the channels 8 in the thick film 35 and simultaneously reducing the thickness of the thick film 35 remaining in the via A and the pad B.

Since the silicon nitride film 34 is used as an etching stopper, dry etching is completed when the silicon nitride film 34 is exposed in the channel forming region C.

That is, reactive ion etching (RIE) is performed under the following conditions.

Etching gas: $C_4F_8/Ar/CH_2F_2$, mixing ratio of 7/500/4 sccm.
Gas pressure: 50 mTorr.
RF Power: 1500 W.

Since the dry etching is performed under the aforementioned conditions, it is possible to increase the etching selection ratio between resist forming the resist film 36 and silicon oxide forming the thick film 35; hence, it is possible to use the silicon nitride film 34 as an etching stopper. Thus, as shown in FIG. 11(a), the plurality of channels 8 formed in the thick film 35 are recessed toward the silicon nitride film 34. The etching selection ratio can be set to "6", for example.

Then, similar to the first embodiment, the foregoing processes shown in FIGS. 11(b), (c), and FIGS. 12(a), (b), (c) are performed.

Next, the manufacturing method of the magnetic sensor of the fourth embodiment will be described.

Figure 26:
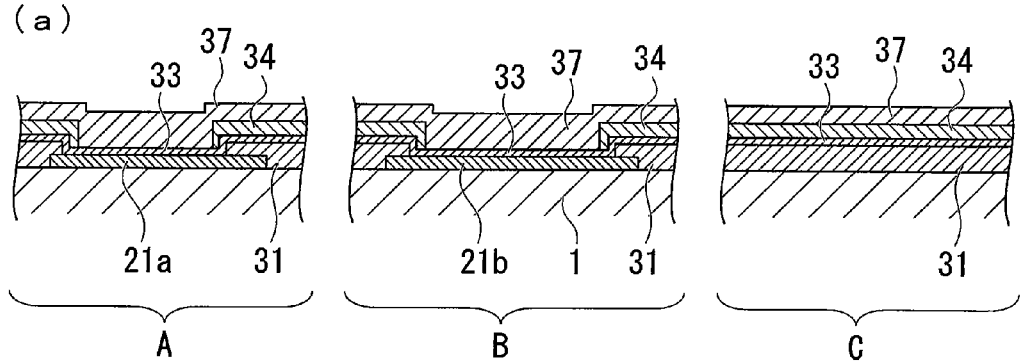
FIG. 26 Cross-sectional views showing a manufacturing method of a magnetic sensor in accordance with the fourth embodiment of the present invention, which show processes to be performed subsequently to FIG. 9.
Figure 26:
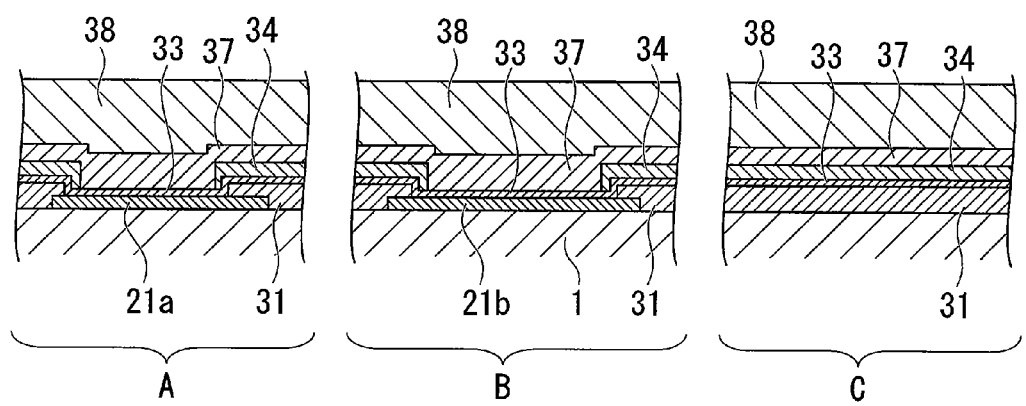
Figure 26:
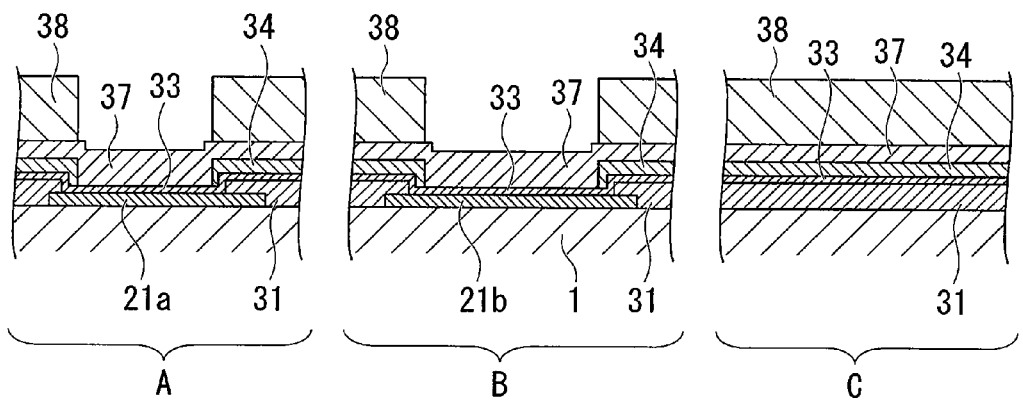

First, similar to the first embodiment, the foregoing processes shown in FIGS. 9(a) to (d) are performed. Then, as shown in FIG. 26(a), the insulating film 37 of 0.2 μm thickness is formed by way of sputtering. The insulating film 37 is composed of aluminum oxide ($Al_2O_3$), boron nitride (BN), and diamond-like carbon. As the insulating film, it is possible to use one such as a silicon nitride film and a silicon oxide film having an etching rate lower than that of the thick film 35.

Next, as shown in FIG. 26(b), a resist film 38 of 3 μm thickness is formed on the overall surface of the insulating film 37. Then, as shown in FIG. 26(c), prescribed parts of the resist film 38 are removed by way of etching, thus forming a prescribed resist pattern. The resist pattern has openings only corresponding to the via A and the pad B, by which the insulating film 37 is exposed.

Figure 27:
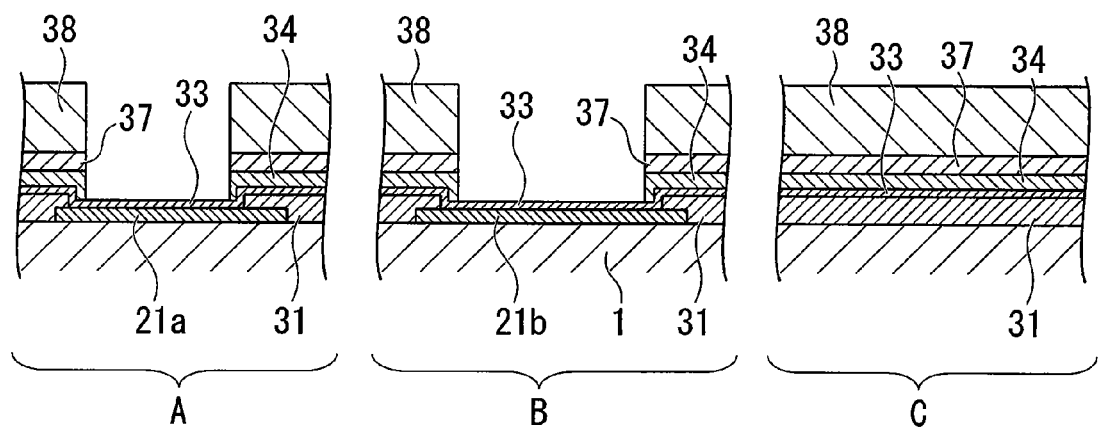
FIG. 27 Cross-sectional views showing the manufacturing method of the magnetic sensor of the fourth embodiment subsequently to FIG. 26.
Figure 27:
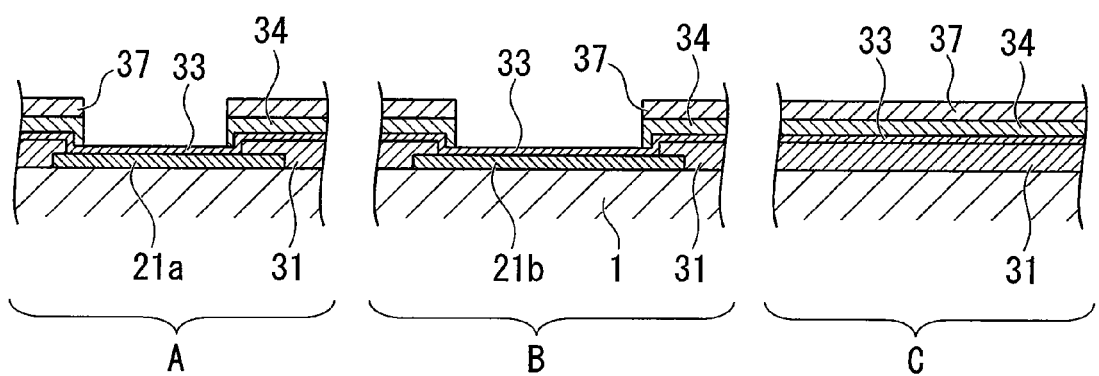

Next, as shown in FIG. 27(a), the insulating film 37 is removed from prescribed regions corresponding to the via A and the pad B by way of ion milling, thus making the silicon oxide film 33 be exposed. Then, as shown in FIG. 27(b), the resist film 38 is removed.

Figure 28:
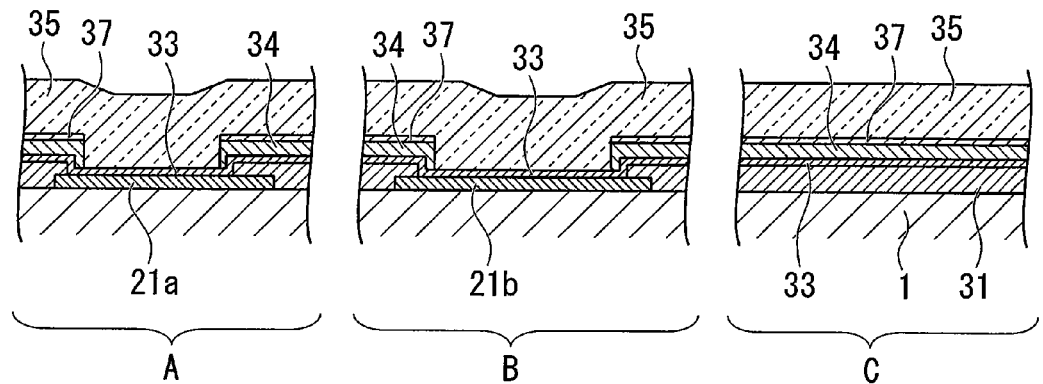
FIG. 28 Cross-sectional views showing the manufacturing method of the magnetic sensor of the fourth embodiment subsequently to FIG. 27.
Figure 28:
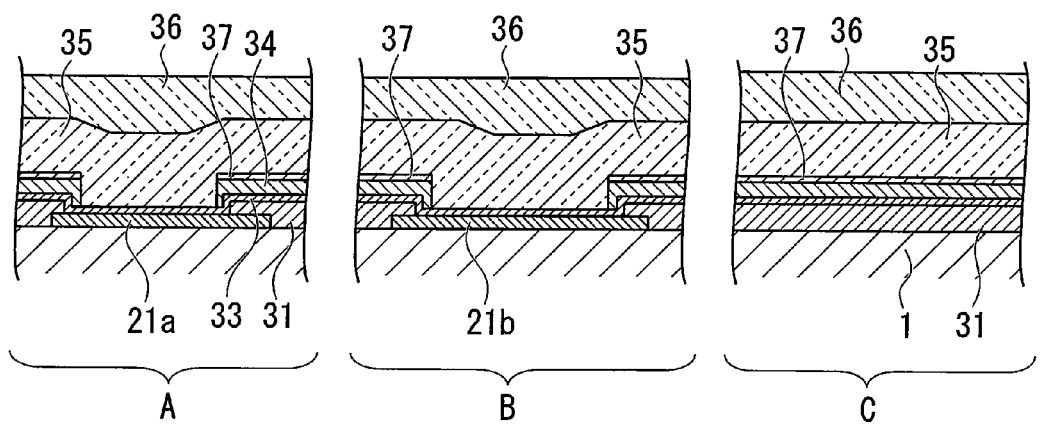
Figure 28:
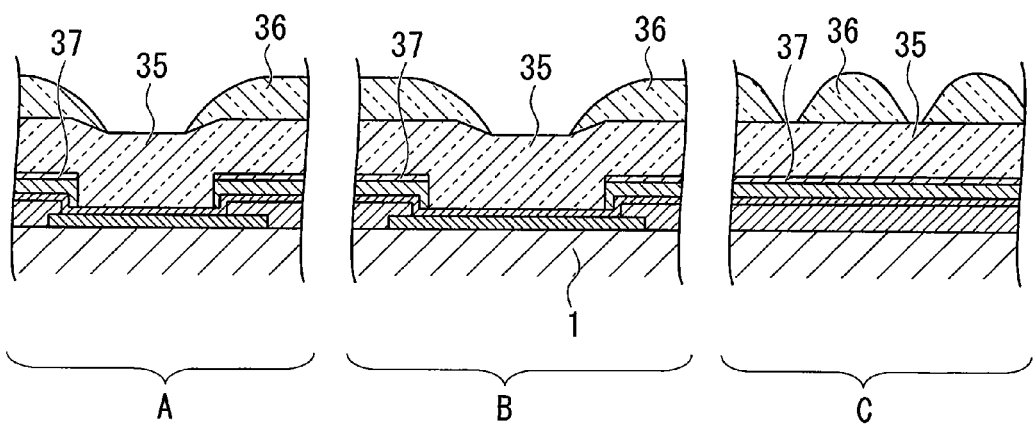

Next, as shown in FIG. 28(a), the thick film 35 of 5 μm thickness composed of silicon oxide is formed by way of the plasma CVD method. Then a plurality of the channels 8 are formed in the thick film 35.

Next, as shown in FIG. 28(b), the resist film 36 of 3 μm thickness is formed on the overall surface of the thick film 35. Then, prescribed parts of the resist film 36 are removed by way of etching, thus forming a prescribed resist pattern. The resist pattern has openings corresponding to the channels 8 formed in the channel forming region C and openings corresponding to the regions of the via A and pad B.

Next, as shown in FIG. 28(c), the remaining resist film 36 is subjected to heat treatment for ten minutes at a temperature of 150° C., thus dissolving the resist film 36. Due to the surface tension of a solution that is produced by dissolution of resist in the heat treatment, the upper surface of the resist film 36 rises up, and the terminal surface thereof slopes. In particular, a plurality of projections having linear ridgelines are formed in the resist film 36, wherein the height thereof is 5 μm or so.

Figure 29:
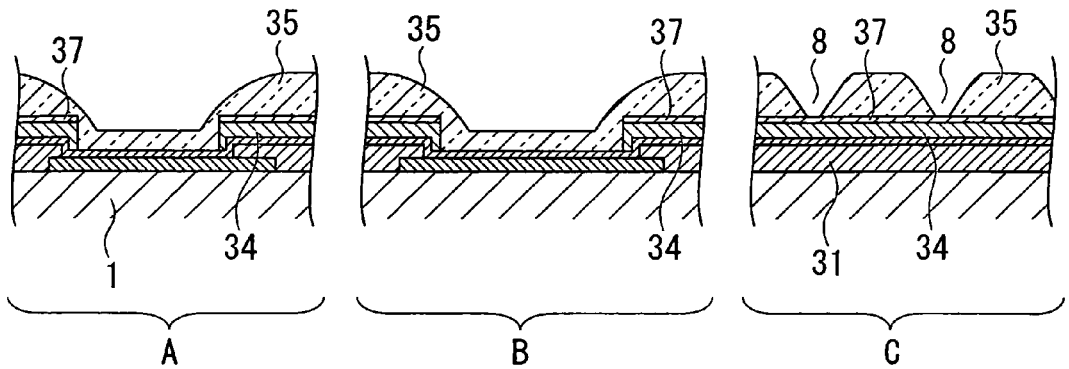
FIG. 29 Cross-sectional views showing the manufacturing method of the magnetic sensor of the fourth embodiment subsequently to FIG. 28.
Figure 29:
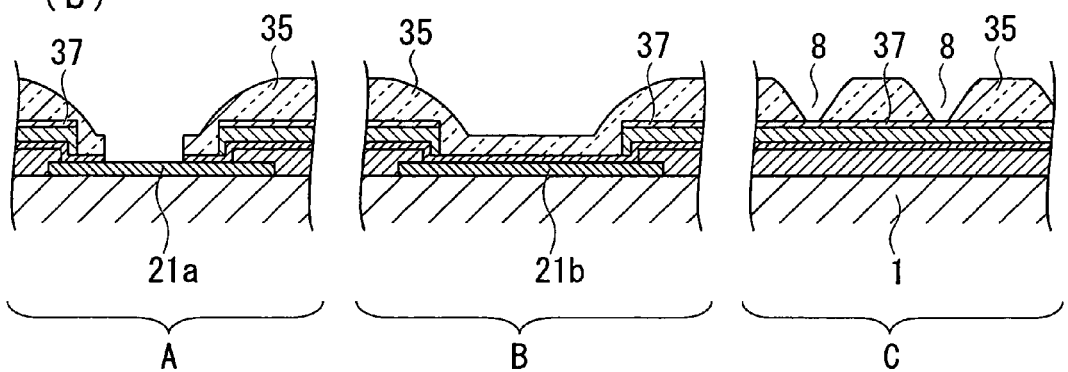
Figure 29:
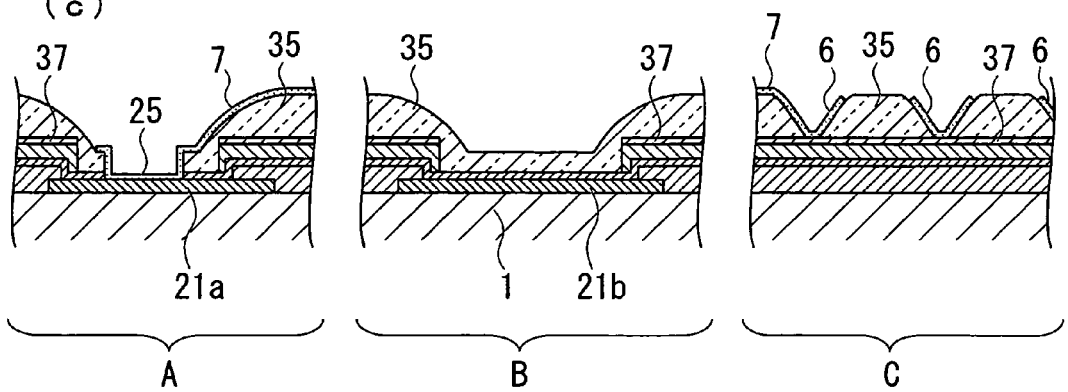

Next, as shown in FIG. 29(a), the resist film 36 and the thick film 35 are subjected to dry etching by using the insulating film 37 as an etching stopper under prescribed conditions realizing the etching selection ratio of 1:1 between the resist and silicon oxide, thus forming a plurality of channels 8 in the thick film 35 and simultaneously reducing the thickness of the thick film 35 remaining in the via A and the pad B.

That is, reactive ion etching (RIE) is performed under the following conditions.

Etching gas: $CF_4/CHF_3/N_2$, mixing ratio of 30/90/5 sccm.
Gas pressure: 200 mTorr.
RF Power: 750 W.

Since the aforementioned dry etching conditions realize setting of the etching selection ratio between resist forming the resist film 36 and silicon oxide forming the thick film 35 at 1:1, it is possible to use the insulating film 37 as an etching stopper. Thus, as shown in FIG. 29(a), each channel 8 is formed by recessing the thick film 35 toward the insulating film 37.

In the aforementioned dry etching, as shown in FIG. 29(a), the recessed widths at the via A and the pad B are controlled so as not to become larger than the recessed width of the first passivation film 32. Then, the resist film 36 remaining on the thick film 35 is removed.

Thus, as shown in FIG. 29(a), a plurality of the channels 8 are formed in the thick film 35 in the channel forming region C. Then, as shown in FIG. 29(b), the thick film 35 and the silicon oxide film 33 covering the conductive portion 21a of the via A are removed by way of etching, thus making the conductive portion 21a be exposed.

Thereafter, the magnet film forming the bias magnets 6 of the giant magnetoresistive elements is formed on the overall surface of the semiconductor substrate 1 by way of sputtering; unnecessary portions are removed by way of resist work and etching; as shown in FIG. 29(c), the bias magnets 6 are formed on the slopes of the channels 8; at the same time, the wiring film 25 is formed on the conductive portion 21a of the via A; furthermore, the wiring layer 7 is formed to connect the wiring film 25 and the bias magnets 6 of the giant magnetoresistive elements together.

A multilayered thin metal is used for the magnet film.

In addition, the bias magnets 6 of the giant magnetoresistive elements forming the X-axis sensor 2 and the Y-axis sensor 3 as well as the wiring layer 7 are formed on the planar surface of the thick film 35.

In order to appropriately perform etching on the magnet film in connection with the slopes of the channels 8 in the resist work for the formation of the bias magnets 6, the resist film 36, in which a prescribed resist pattern is already formed, is subjected to heat treatment, thus making the terminal surfaces of the resist film 36 incline.

Then, the giant magnetoresistive element film forming the magneto-sensitive elements 5 of the giant magnetoresistive elements is formed on the overall surface by way of sputtering. A multilayered thin metal is used for the giant magnetoresistive element film.

The semiconductor substrate 1, in which the aforementioned giant magnetoresistive element film is formed, is set up above a magnet array and is then subjected to heat treatment for three to five hours at a temperature ranging from 260° C. to 290° C., thus subjecting the giant magnetoresistive element film to the pinning process.

Figure 30:
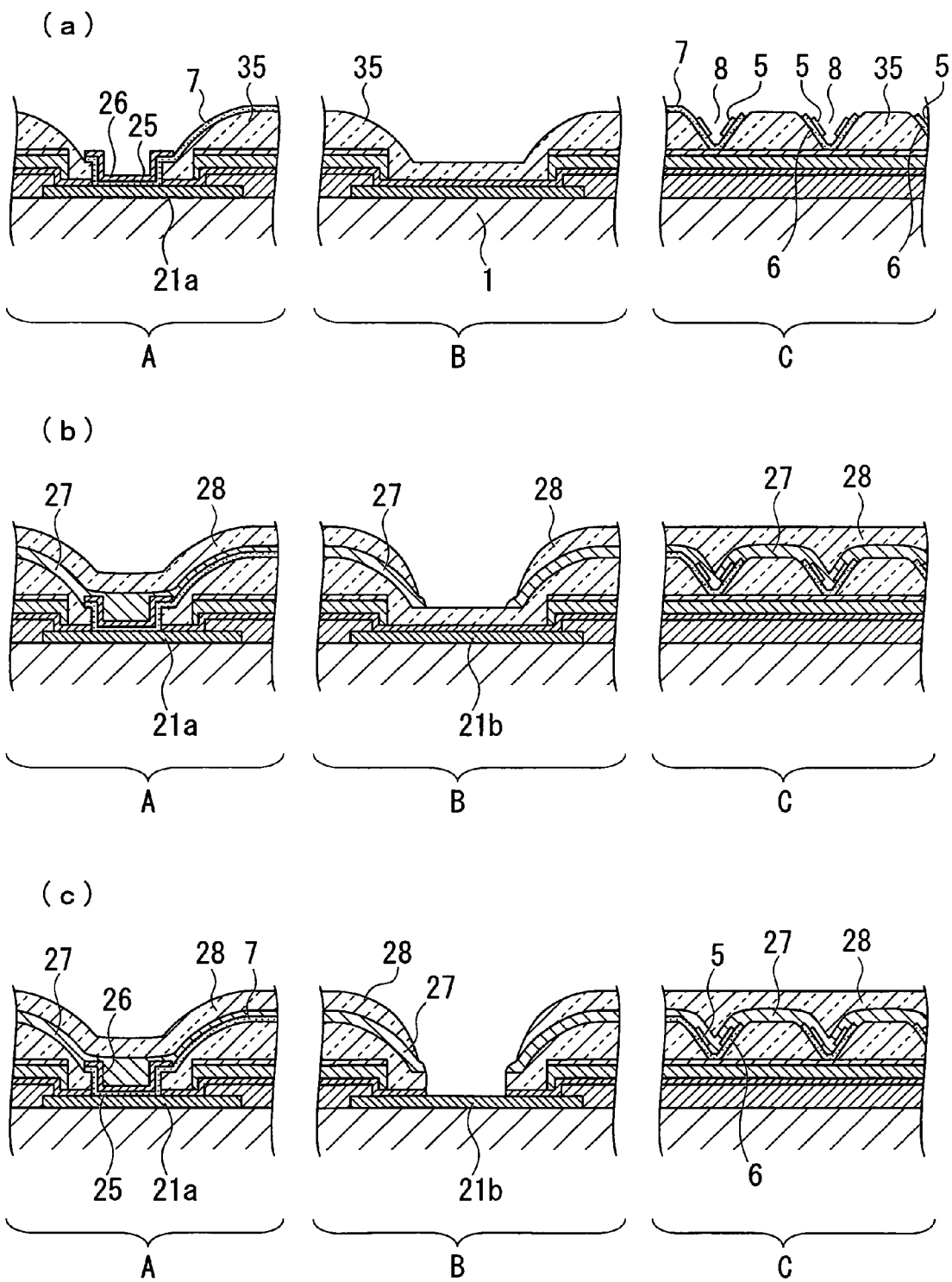
FIG. 30 Cross-sectional views showing the manufacturing method of the magnetic sensor of the fourth embodiment subsequently to FIG. 29.

Next, the giant magnetoresistive element film is subjected to resist work and etching so as to remove unnecessary portions therefrom, so that the magneto-sensitive elements 5 are formed on the slopes of the channels 8 as shown in FIG. 30(a), thus completing the production of the giant magnetoresistive elements. This completes the production of the Z-axis sensor 4.

At the same time, a part of the giant magnetoresistive element film remains on the wiring film 25 composed of the magnet film, which is formed in advance above the conductive portion 21a of the via A, and is used as the protective conductive film 26. Thus, it is possible to produce the via A having the structure shown in FIG. 8.

At the same time, the magneto-sensitive elements 5 are formed on the planar surface of the thick film 35 as well, thus forming the planar magnetoresistive elements. This completes the production of the X-axis sensor 2 and the Y-axis sensor 3.

Next, as shown in FIG. 30(b), the passivation film 27 of 1 μm thickness composed of silicon nitride is formed by way of the plasma CVD method; furthermore, the protection film 28 composed of polyimide is formed. Then, the protection film 28 and the passivation film 27 are removed from the region corresponding to the pad B, which is thus exposed.

Lastly, as shown in FIG. 30(c), etching is performed using the protection film 28 as a mask so as to remove the silicon oxide film 33 and the thick film 35 covering the conductive portion 21b of the pad B, thus making the conductive portion 21b of the pad B be exposed. This completes the production of the magnetic sensor of the fourth embodiment.

According to the manufacturing method of the magnetic sensor of the fourth embodiment, it is possible to form the X-axis sensor 2, Y-axis sensor 3, and Z-axis sensor 4 on a single semiconductor substrate 1 and to simultaneously form the via A and the pad B; hence, it is possible to rapidly produce a small-size three-axial magnetic sensor by way of a series of processes. Since the resist film 36 and the thick film 35 are subjected to etching by using the insulating film 37 formed on the passivation film 32 as an etching stopper, it is possible to form a plurality of channels 8 by recessing the insulating film 37 toward the thick film 35. This forms slopes having prescribed inclination angles in the thick film 35; hence, it is possible to produce a magnetic sensor using giant magnetoresistive elements realizing a sensitivity in a vertical direction perpendicular to the surface of the semiconductor substrate 1. The fourth embodiment is characterized in that the channel formation can be easily controlled in the depth direction due to the formation of the insulating film 37 on the passivation film 32.

Fifth Embodiment

A magnetic sensor of a fifth embodiment of the present invention has a structure similar to that of the first embodiment; and differences therebetween will be described with reference to FIGS. 31 to 33.

Figure 31:
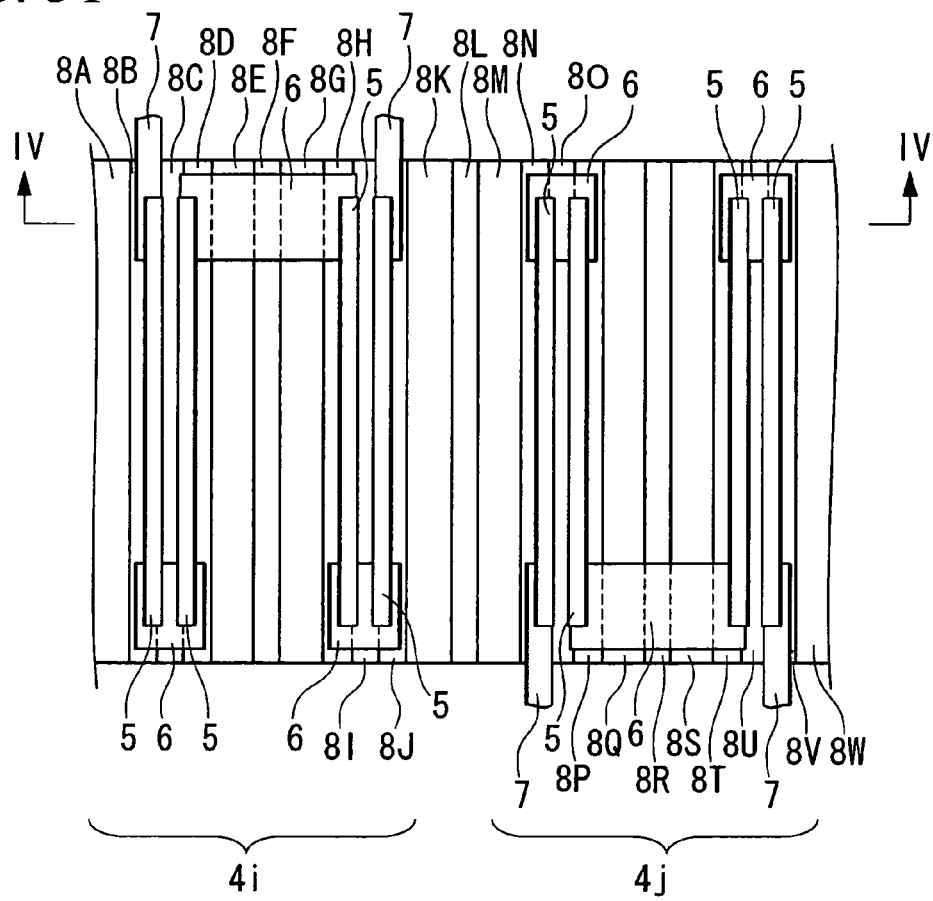
FIG. 31 A plan view showing giant magnetoresistive elements forming a Z-axis sensor mounted on a magnetic sensor in accordance with a fifth embodiment of the present invention.

FIG. 31 is a plan view showing the giant magnetoresistive elements 4i and 4j; FIG. 32 is a cross-sectional view taken along line IV-IV in FIG. 31; and FIG. 33 is an enlarged cross-sectional view of an area encompassed by dotted lines in FIG. 32.

Figure 32:
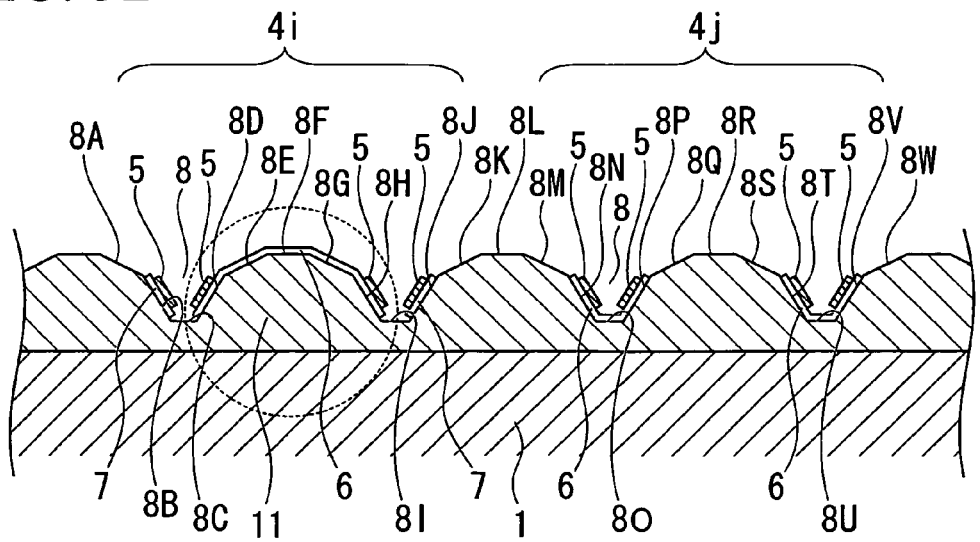
FIG. 32 A cross-sectional view taken along line IV-IV in FIG. 31.

In FIG. 32, the thick film 11 composed of silicon oxide is formed on the semiconductor substrate 1; and the thick film 11 is partially cut so as to form four channels, each having a V-shape, in parallel.

The channel 8 is a thin recess having prescribed dimensions, wherein the depth ranges from 3 μm to 8 μm, the length ranges from 200 μm to 400 μm, and the slope width ranges from 3 μm to 16 μm.

The slopes of the channels 8 are composed of first slopes 8A, 8E, and 8G on the upper side as well as second slopes 8B, 8D, and 8H on the lower side, wherein they have different inclination angles, which range from 60° to 80° with respect to the surface of the thick film 11, and wherein the second slopes are greater than the first slopes in inclination angles.

FIG. 32 shows that each slope of the channel 8 is formed by the first and second slopes, both of which are planar; however, in the actual manufacturing process, each slope of the channel 8 is slightly bent externally.

Figure 33:
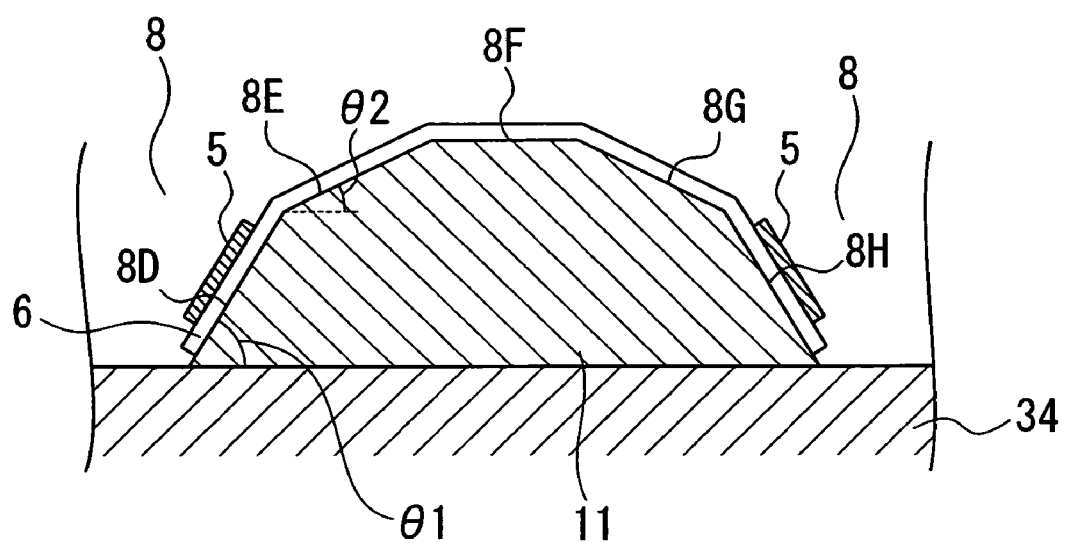
FIG. 33 An enlarged cross-sectional view of an area encompassed by dotted lines in FIG. 32.

As shown in FIG. 33, each slope of the channel 8 is formed so as to satisfy the relationship of $\theta_1 > \theta_2$, wherein $\theta_1$ represents an angle ($0° < \theta_1 < 90°$) formed between the second slope 8D and the silicon nitride film 34 (or the semiconductor substrate 1), and $\theta_2$ represents an angle ($0° < \theta_2 < 90°$) formed between the first slope 8E and the silicon nitride film 34 (or the semiconductor substrate 1).

In addition, a magneto-sensitive element 5 of the giant magnetoresistive element is formed on the second slope 8D having a larger inclination angle $\theta_1$.

Since the magneto-sensitive element 5 of the giant magnetoresistive element is formed on the second slope 8D having a larger inclination angle $\theta_1$ as described above, it is possible to adjust the sensing direction of the Z-axis sensor 4 and to increase the sensitivity thereof.

As described above, the magneto-sensitive elements 5 of the giant magnetoresistive elements are formed on the eight slopes adjoining together in the four channels 8 shown in FIG. 32 such that they are each formed along the lower-side second slope in the longitudinal direction and at the center having good planation.

With respect to the giant magnetoresistive element 4i, the magneto-sensitive element 5 formed on the second slope 8D is electrically connected to the magneto-sensitive element 5 formed on the second slope 8H via the bias magnet 6 extending over the first slope 8E, top portion 8F, and its adjacent first slope 8G.

With respect to the giant magnetoresistive element 4j, the magneto-sensitive element formed on the second slope 8N is electrically connected to the magneto-sensitive element 5 formed on the adjacent second slope 8P via the bias magnet 6 over the bottom 8O.

Next, the manufacturing method of the magnetic sensor of the fifth embodiment will be described.

Similar to the first embodiment, the foregoing processes shown in FIGS. 9(a) to (d) and FIGS. 10(a) to (c) are performed.

Figure 34:
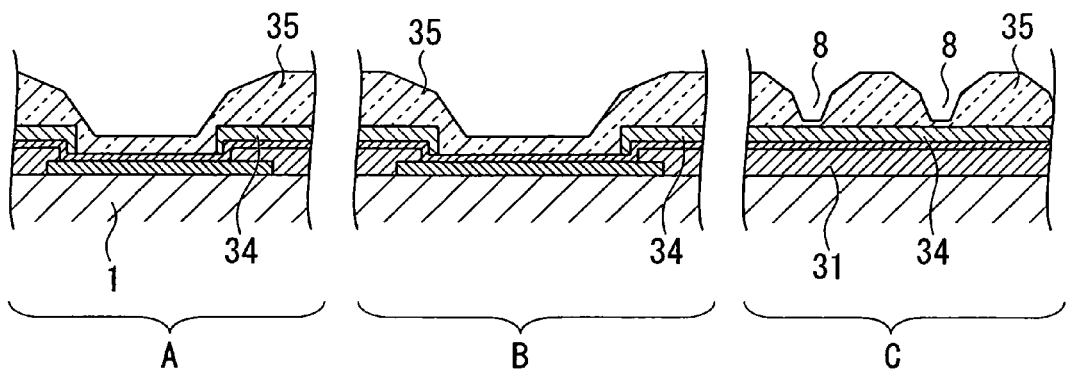
FIG. 34 Cross-sectional views showing a manufacturing method of a magnetic sensor of a fifth embodiment, which is performed subsequently to FIG. 10.
Figure 34:
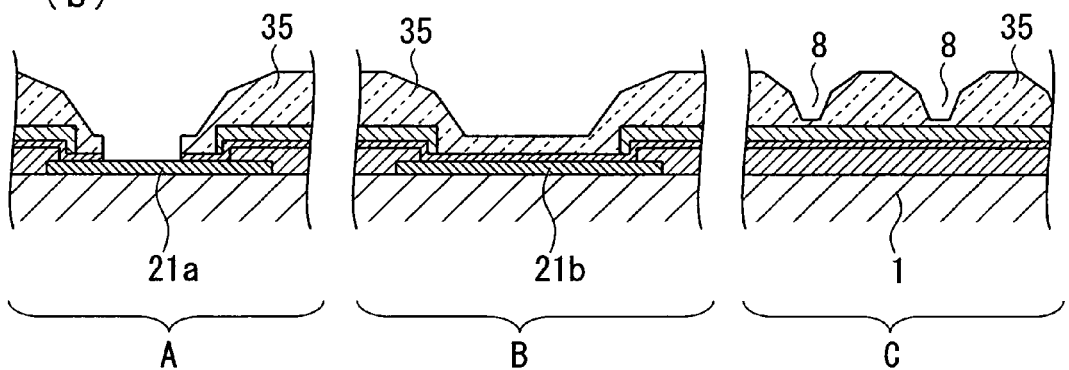
Figure 34:
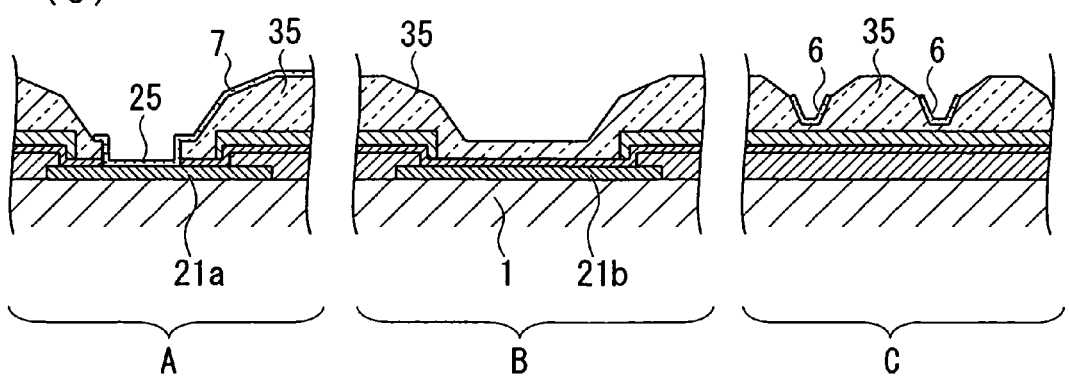

Then, as shown in FIG. 34(a), a plurality of channels are formed in the thick film 35 in the channel forming region C, wherein each slope of the channel 8 is bent in the middle thereof due to the aforementioned dry etching, so that the second slope lying in proximity to the silicon nitride film 34 is connected to the first slope lying in proximity to the top portion.

That is, each slope of the channel 8 is formed to satisfy the relationship of $\theta_1 > \theta_2$, wherein $\theta_1$ represents an angle ($0° < \theta_1 < 90°$) formed between the second slope and the silicon nitride film 34 (or the semiconductor substrate 1), and $\theta_2$ represents an angle ($0° < \theta_2 < 90°$) formed between the first slope and the silicon nitride film 34 (or the semiconductor substrate 1).

In the present embodiment, the magneto-sensitive element 5 of the giant magnetoresistive element is formed on the second slope having a larger inclination angle $\theta_1$ measured from the semiconductor substrate 1. Incidentally, the angles $\theta_1$ and $\theta_2$ vary depending upon the etching conditions used for the formation of the channels 8, wherein it is preferable that the angle $\theta_1$ be increased as much as possible and be set close to 90°.

Next, as shown in FIG. 34(b), the thick film 35 and the silicon oxide film 33 covering the conductive portion 21a of the via A are removed by way of etching, thus making the conductive portion 21a be exposed.

Next, the magnet film forming the bias magnets 6 of the giant magnetoresistive elements is formed on the overall surface of the semiconductor substrate 1 by way of sputtering; then, unnecessary portions are removed by way of resist work and etching. As a result, as shown in FIG. 34(c), the bias magnets 6 are formed on the second slopes of the channels 8; at the same time, the wiring film 25 is formed above the conductive portion 21a of the via A; and the wiring layer 7 is formed to connect together the wiring film 25 and the bias magnets 6 of the giant magnetoresistive elements. A multi-layered thin metal is used for the magnet film.

In addition, the bias magnets 6 of the giant magnetoresistive elements forming the X-axis sensor 2 and the Y-axis sensor 3 as well as the wiring layer 7 are formed on the planar surface of the thick film 35 as well.

In order to appropriately perform etching on the magnet film on the second slopes of the channels 8 in the resist work used for the formation of the bias magnets 6, the resist film, in which a prescribed resist pattern is formed, is subjected to heat treatment, thus making the terminal surfaces of the resist film incline.

Next, the giant magnetoresistive element film forming the magneto-sensitive elements 5 of the giant magnetoresistive elements is formed on the overall surface by way of sputtering. A multilayered thin metal is used for the giant magnetoresistive element film.

Then, the semiconductor substrate 1 is set in a position in proximity to a magnet array and is then subjected to heat treatment for three to five hours at a temperature ranging from 260° C. to 290° C., thus subjecting the giant magnetoresistive element film to the pinning process.

Figure 35:
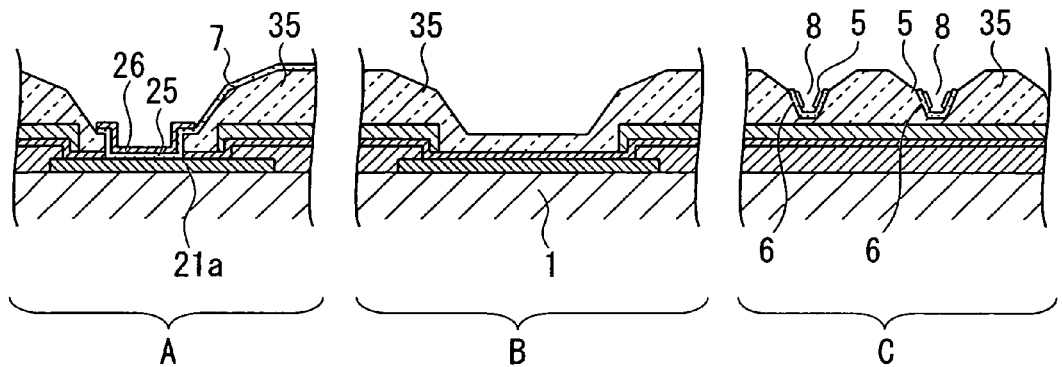
FIG. 35 Cross-sectional views showing the manufacturing method of the magnetic sensor of the fifth embodiment subsequently to FIG. 34.
Figure 35:
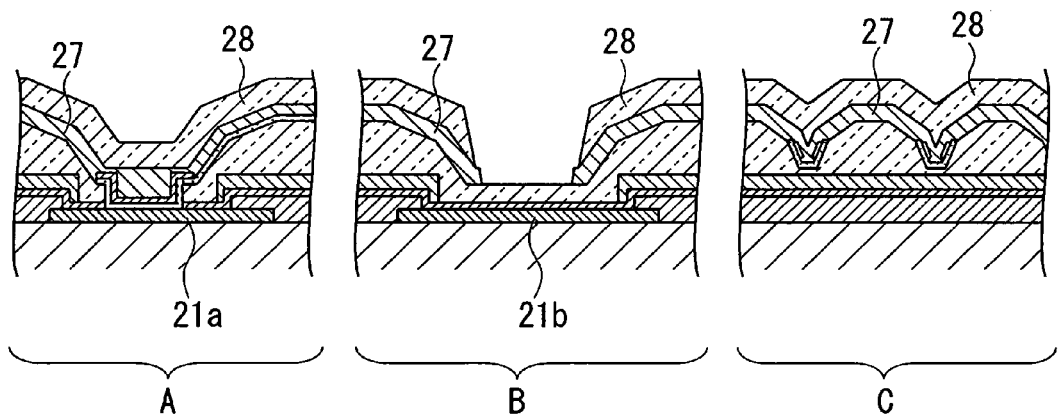
Figure 35:
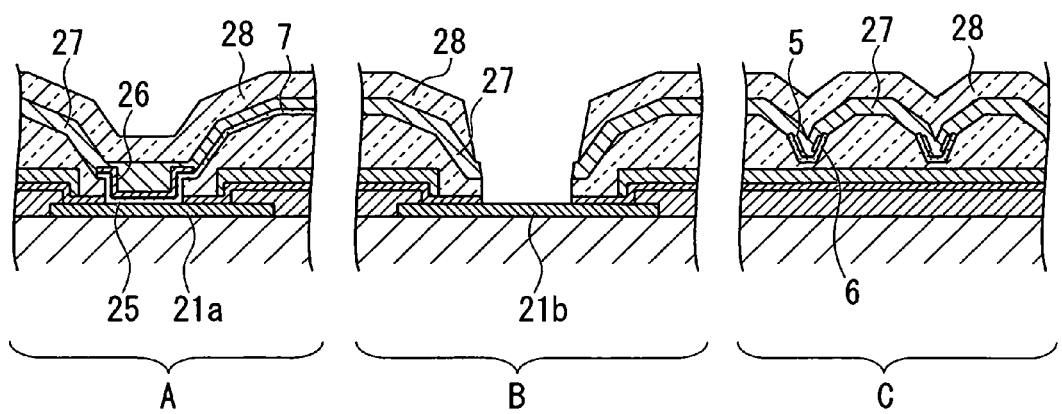

Thereafter, the giant magnetoresistive element film is subjected to resist work and etching so as to remove unnecessary portions therefrom, so that, as shown in FIG. 35(a), the magneto-sensitive elements 5 are formed on the second slopes of the channels, thus producing giant magnetoresistive elements. This completes the production of the Z-axis sensor 4.

In addition, the giant magnetoresistive element film remaining on the wiring film 25 composed of the magnet film, which is formed in advance above the conductive portion 21a of the via A, is used for the protective conductive film 26. Thus, it is possible to produce the via A having the structure shown in FIG. 8. At the same time, the magneto-sensitive elements 5 are also formed on the planar surface of the thick film 35, thus producing giant magnetoresistive elements. This completes the production of the X-axis sensor 2 and the Y-axis sensor 3.

Next, as shown in FIG. 35(b), the passivation film 27 of 1 μm thickness composed of silicon nitride is formed by way of the plasma CVD method; and the protection film 28 composed of polyimide is formed thereon. The protection film 28 and the passivation film 27 are removed from the prescribed region corresponding to the pad B, which is thus exposed.

Next, as shown in FIG. 35(c), etching is performed using the protection film 28 as a mask so as to remove the silicon oxide film 33 and the thick film 35 covering the conductive portion 21b of the pad B, so that the pad B is completely exposed. This completes the production of the magnetic sensor of the present embodiment.

Sixth Embodiment

Next, a sixth embodiment of the present invention will be described, wherein the constituent elements similar to those of the first embodiment are not described.

Similar to the first embodiment, the sixth embodiment is designed such that a plurality of giant magnetoresistive elements are formed on the semiconductor substrate 1 so as to form the X-axis sensor 2, Y-axis sensor 3, and Z-axis sensor 4, wherein differences are introduced into the giant magnetoresistive elements forming the Z-axis sensor 4.

Figure 36:
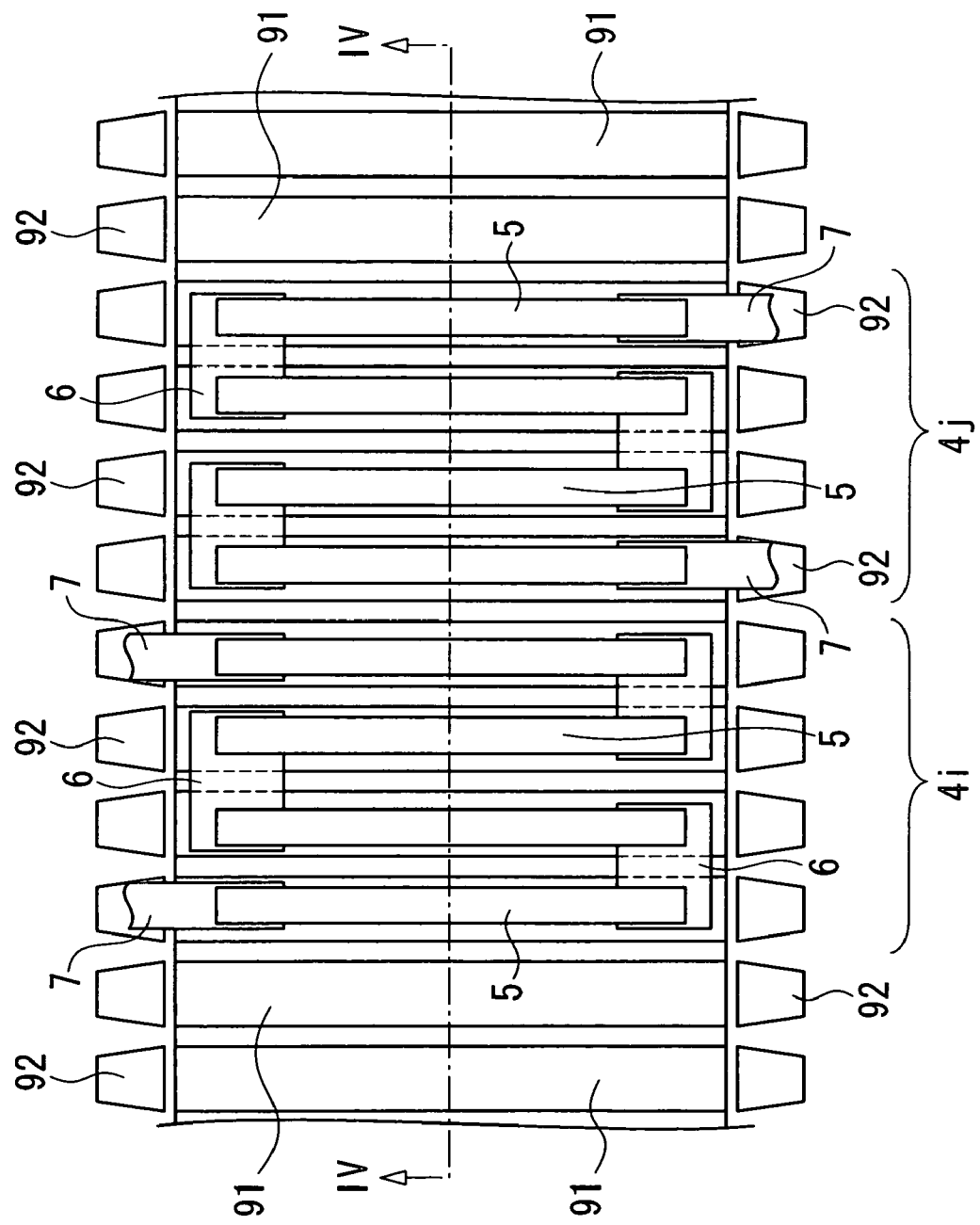
FIG. 36 A plan view showing giant magnetoresistive elements forming a Z-axis sensor mounted on a magnetic sensor in accordance with a sixth embodiment of the present invention.
Figure 37:
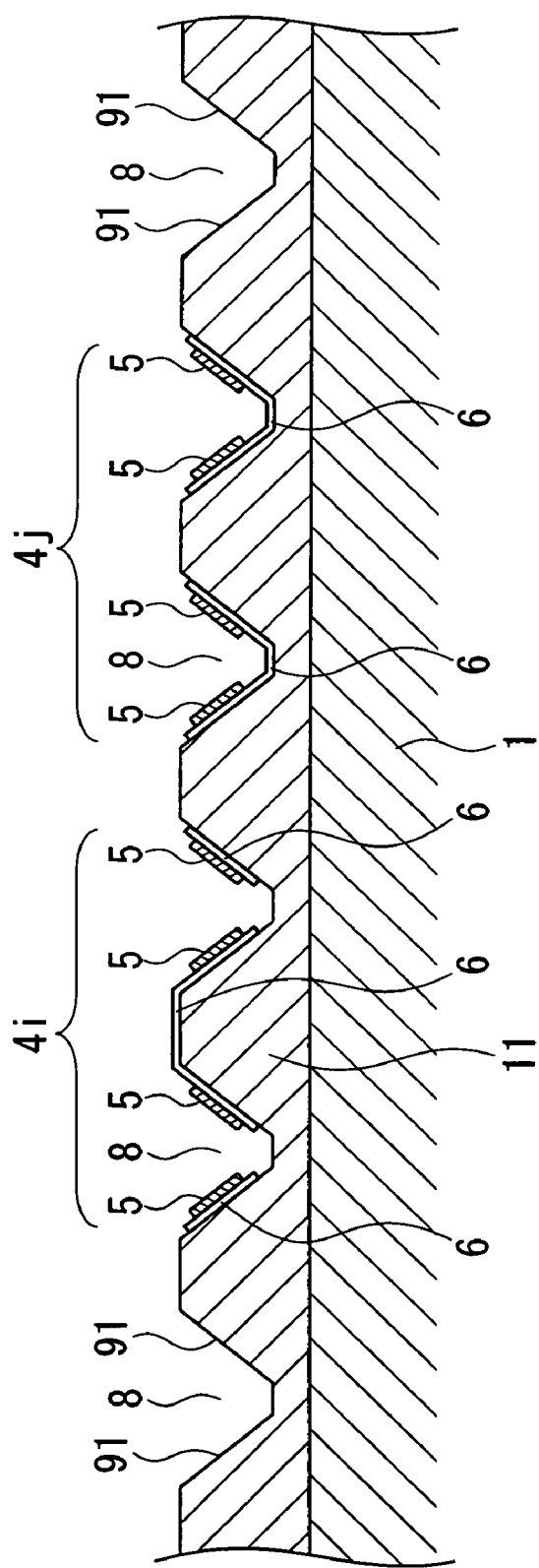
FIG. 37 A cross-sectional view taken along line IV-IV in FIG. 36.

FIG. 36 is a plan view showing the giant magnetoresistive elements 4i and 4j forming the Z-axis sensor 4; and FIG. 37 is a cross-sectional view taken along line IV-IV in FIG. 36.

In FIG. 37, the thick film 11 composed of silicon oxide is formed on the semiconductor substrate 1. Prescribed parts of the thick film 11 are subjected to cutting, thus forming six channels 8, each having a V-shape, in parallel. Each channel 8 is a thin recess having prescribed dimensions, wherein the depth ranges from 3 μm to 7 μm, the length ranges from 250 μm to 300 μm, and the slope width ranges from 3 μm to 8 μm, and wherein an angle formed between the slope and the thick film 11 ranges from 60° to 80° and is preferably set to 70°. Incidentally, due to the actual manufacturing process, each slope of the channel 8 is not formed to be planar but is curved externally.

In FIG. 37, eight of the magneto-sensitive elements 5 forming giant magnetoresistive elements are formed with respect to eight channels of four adjacent channels, which are positioned in the center among six channels 8 adjoining together, wherein they are each formed at the center having good planation along the longitudinal direction.

With respect to the giant magnetoresistive element 4i, the magneto-sensitive element 5 formed on the slope of the channel 8 is electrically connected to the magneto-sensitive element 5 formed on the slope of the adjacent channel 8 via the bias magnet 6 extending over the top portion. With respect to the giant magnetoresistive element 4j, the magneto-sensitive element 5 formed on one slope of the channel 8 is electrically connected to the magneto-sensitive element 5 formed on the other slope of the channel 8 via the bias magnet 6 extending over the bottom portion.

In the present embodiment, as shown in FIGS. 36 and 37, a total of four first dummy slopes 91 are formed using the two channels 8, which are formed externally to the four channels 8 in which the giant magnetoresistive elements are formed. In addition, both ends of the total of twelve slopes formed in the six channels 8 are extended in the longitudinal direction and are used to form a total of twenty-four second dummy slopes 92 via gaps therebetween.

The first dummy slopes 91 are each shaped in a similar manner to the other slopes and are each formed in a rectangular shape in plan view, wherein the inclination angles thereof are reduced. As shown in FIG. 36, the second dummy slopes 92 are each formed in a trapezoidal shape in plan view but are reduced in widths thereof toward both ends of each channel 8, wherein the inclination angles thereof are reduced.

The magneto-sensitive elements 5 and the bias magnets 6 forming the giant magnetoresistive elements are not formed on the first dummy slopes 91 and the second dummy slopes 92. Both the first dummy slopes 91 and the second dummy slopes 92 are formed simultaneously with the formation of the channels 8. Details will be described later.

In the present embodiment, even when peripheral shapes and inclination angles of slopes vary due to the formation of the channels 8 in association with the formation of the first dummy slopes 91 and the second dummy slopes 92, it is possible to avoid variations in the performance of giant magnetoresistive elements because no giant magnetoresistive element is formed in the corresponding region; hence, it is possible to produce giant magnetoresistive elements having good magnetism sensing characteristics. This reliably produces a Z-axis sensor having good performance.

In addition, the pinning direction of the magneto-sensitive element 5 is inclined by an angle ranging from 30° to 60° in the longitudinal direction, whereby it is possible to improve the stability against a high magnetic field with respect to the giant magnetoresistive elements.

Next, the manufacturing method of the magnetic sensor of the present embodiment will be described.

Figure 38:
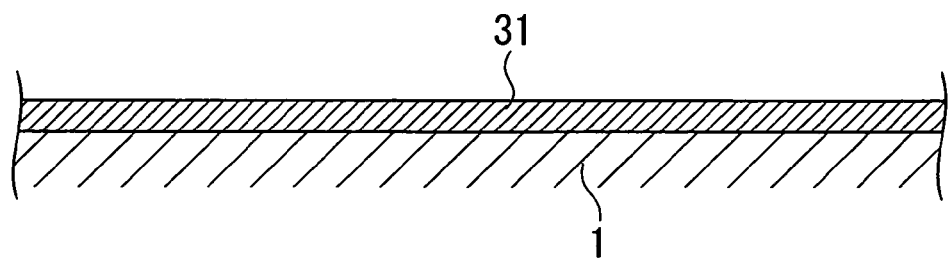
FIG. 38 Cross-sectional views showing a manufacturing method of the magnetic sensor of the sixth embodiment.
Figure 38:
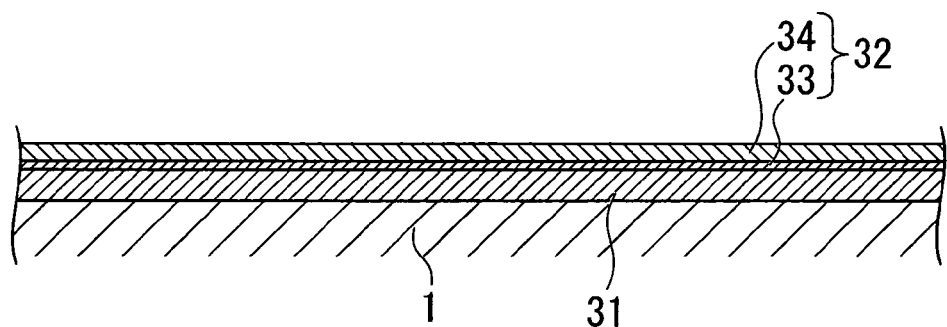

First, as shown in FIG. 38(a), the planation film 31 is formed on the semiconductor substrate 1. The planation film 31 is formed by sequentially laminating a silicon oxide film of 300 nm thickness, a SOG film of 600 nm thickness, and a silicon oxide film of 50 nm thickness composed of triethoxy silane by way of the plasma CVD method.

Next, as shown in FIG. 38(b), the passivation film 32 is formed on the overall surface of the semiconductor substrate 1. The passivation film 32 is formed by laminating a silicon oxide film of 250 nm thickness and a silicon nitride film of 600 nm thickness by way of the plasma CVD method.

Figure 39:
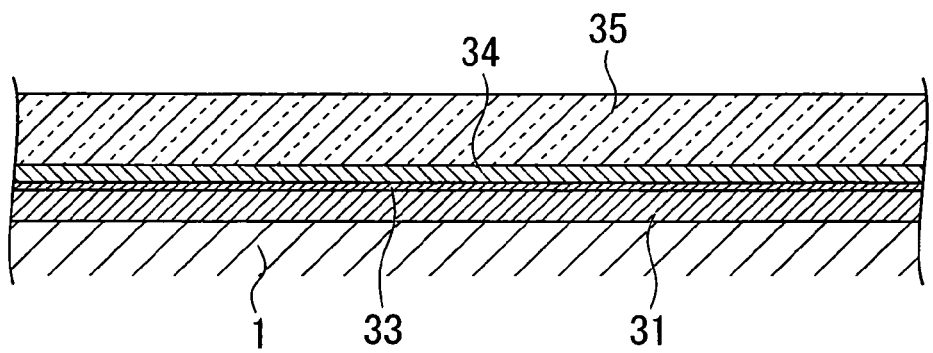
FIG. 39 Cross-sectional views showing the manufacturing method of the magnetic sensor of the sixth embodiment subsequently to FIG. 38.
Figure 39:
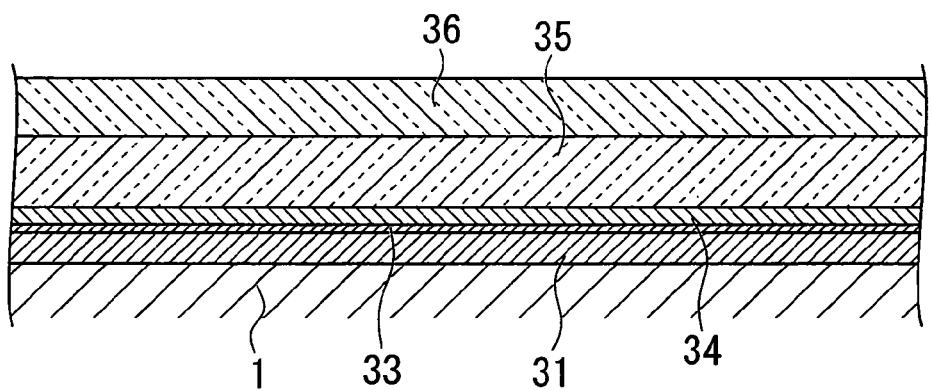
Figure 39:
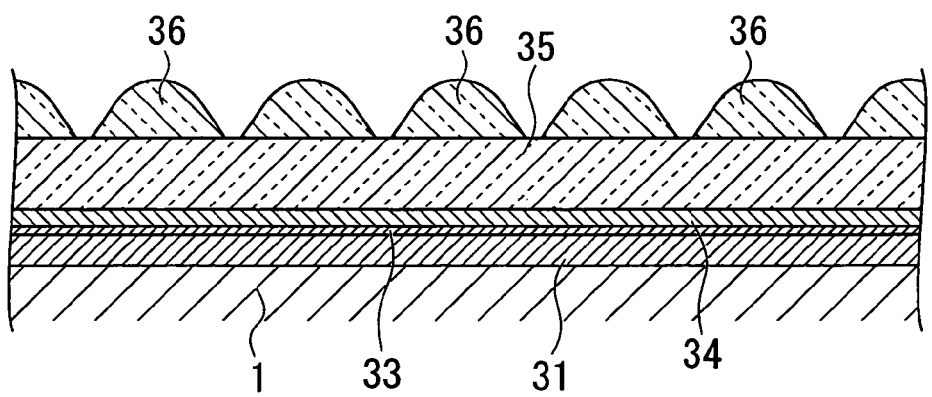

Next, as shown in FIG. 39(a), the thick film 35 of 5 μm thickness composed of silicon oxide is formed by way of the plasma CVD method. In the after-treatment, a plurality of channels 8 are formed in the thick film 35.

Next, as shown in FIG. 39(b), the resist film 36 of 3 μm thickness is formed on the overall surface of the thick film 35. Then, prescribed parts of the resist film 36 are removed by way of etching, thus forming a prescribed resist pattern. The resist pattern has openings at prescribed regions corresponding to channels formed in the channel forming region. In the present embodiment, the resist pattern is appropriately processed at the prescribed regions thereof in order to realize the simultaneous formation of the first dummy slopes 91 and the second dummy slopes 92.

Next, as shown in FIG. 39(c), the remaining resist film 36 is subjected to heat treatment for ten minutes at a temperature of 150° C., thus dissolving the resist film 36. The upper surface of the resist film 36 rises upwardly due to the surface tension of a solution, which is produced following the resist dissolution in the heat treatment, thus making the terminal surfaces thereof incline. Thus, it is possible to form a plurality of projections having linear ridgelines, the height of which is set to 5 μm or so.

Thereafter, the resist film 36 and the thick film 35 are subjected to dry etching at an etching selection ratio of 1:1 between resist and silicon oxide. The dry etching is performed under the following conditions.

Etching gas: $CH_4/CHF_3/N_2/O_2$, mixing ration of 60/180/10/100 sccm.

Pressure: 400 mTorr (53.2 Pa).

RF Power: 750 W.

Electrode temperature: 15° C.

Chamber temperature: 15° C.

Then, the resist film 36 remaining above the thick film 35 is removed.

Figure 40:
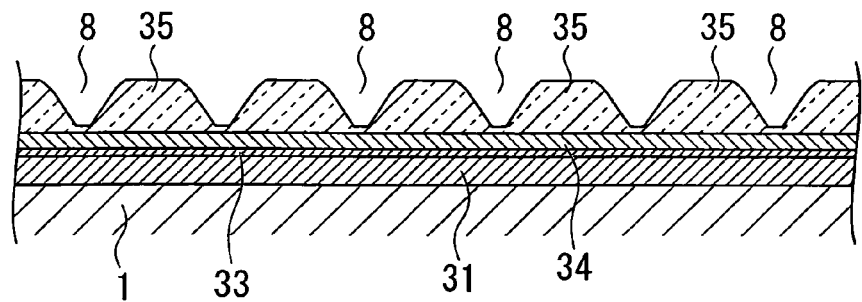
FIG. 40 Cross-sectional views showing the manufacturing method of the magnetic sensor of the sixth embodiment subsequently to FIG. 39.
Figure 40:
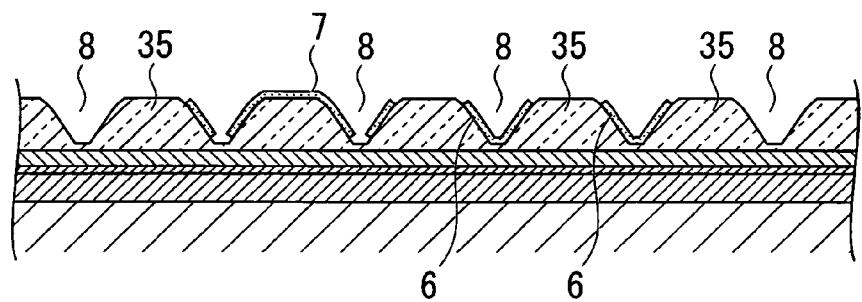

Thus, as shown in FIG. 40(a), it is possible to form a plurality of channels 8 in the thick film 35 in the channel forming region.

Next, the magnet film forming the bias magnets 6 of the giant magnetoresistive elements is formed on the overall surface of the semiconductor substrate 1 by way of sputtering, and then unnecessary portions thereof are removed by way of resist work and etching. Thus, as shown in FIG. 40(b), it is possible to appropriately form the bias magnets 6 and the wiring film therefor on the slopes of the channels 8 except for the first dummy slopes 91 and the second dummy slopes 92.

A multilayered thin metal is used for the magnet film.

In addition, the bias magnets 6 of the giant magnetoresistive elements forming the X-axis sensor 2 and the Y-axis sensor 3 as well as the wiring layer 7 therefor are formed on the planar surface of the thick film 35.

In order to appropriately perform etching on the magnet film on the slopes of the channels 8 in the resist work for the formation of the bias magnets 6, the resist film 36, in which a prescribed resist pattern is formed, is subjected to heat treatment, thus making the terminal surfaces thereof incline.

Next, the giant magnetoresistive element film forming the magneto-sensitive elements 5 of the giant magnetoresistive elements is formed on the overall surface of the semiconductor substrate 1 by way of sputtering. A multilayered thin metal is used for the giant magnetoresistive element film.

The aforementioned semiconductor substrate 1 is set in a position close to a magnet array and is then subjected to heat treatment for three to five hours at a temperature ranging from 260° C. to 290° C., thus subjecting the giant magnetoresistive element film to the pinning process.

Figure 41:
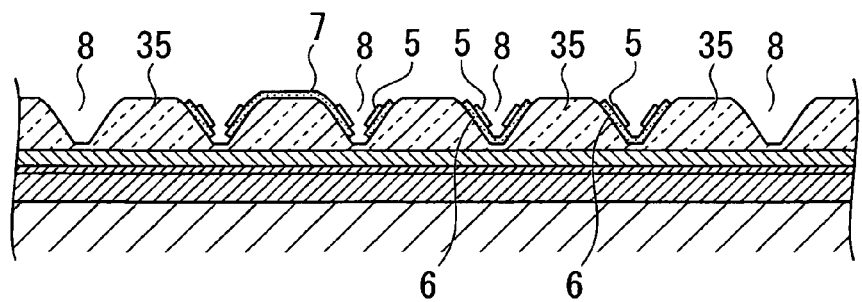
FIG. 41 Cross-sectional views showing the manufacturing method of the magnetic sensor of the sixth embodiment subsequently to FIG. 40.
Figure 41:
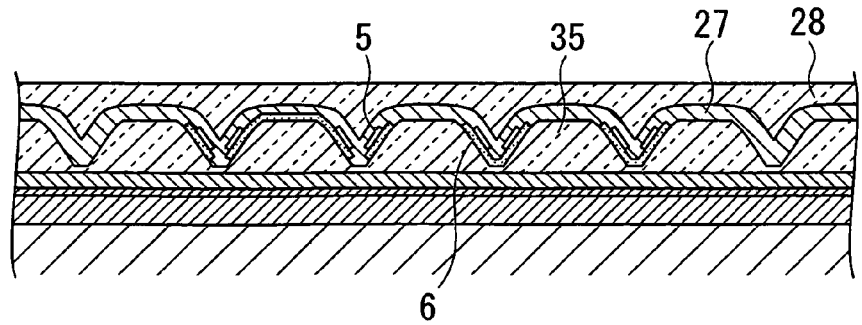

Thereafter, the giant magnetoresistive element film is subjected to resist work and etching, thus removing unnecessary portions therefrom; hence, as shown in FIG. 41(a), the magneto-sensitive elements 5 are formed on the slopes of the channels except for the first dummy slopes 91 and the second dummy slopes 92, thus forming giant magnetoresistive elements. This completes the production of the Z-axis sensor 4.

At the same time, the magneto-sensitive elements 5 are formed on the planar surface of the thick film 35 as well, thus forming giant magnetoresistive elements. This completes the production of the X-axis sensor 2 and the Y-axis sensor 3.

Next, as shown in FIG. 41(b), the passivation film 27 of 1 μm thickness composed of silicon nitride is formed by way of the plasma CVD method; furthermore, the protection film 28 composed of polyimide is formed. This completes the production of the magnetic sensor of the present embodiment.

In the present embodiment, a plurality of channels 8 are formed in the thick film, and the first dummy slopes 91 and the second dummy slopes 92 are formed using similar channel shapes. Herein, channel shapes are not necessarily formed; that is, a plurality of bank-like projections are formed on the semiconductor substrate 1, and the slopes thereof are used, for example.

The formation of the aforementioned projection is realized by the same method as the formation of the channels 8. That is, as shown in FIG. 39(c), the resist film 36 is subjected to patterning and heat treatment, and then the resist film 36 and the thick film 35 are subjected to plasma etching with an etching selection ratio of 1:1 between resist and silicon oxide.

The plasma etching is performed to make the surface of the thick film 35 be planar except for the prescribed regions used for the formation of channels 8; and then a major part of the thick film 35 is removed so as to form a plurality of bank-like projections.

With respect to the formation of projections, a prescribed resist pattern is applied to the resist film 36 so as to produce projections realizing the first dummy slopes 91 and the second dummy slopes 92.

Seventh Embodiment

A magnetic sensor of a seventh embodiment is similar to the first embodiment; hence, the duplicate description is omitted, and differences therebetween are described below.

Figure 42:
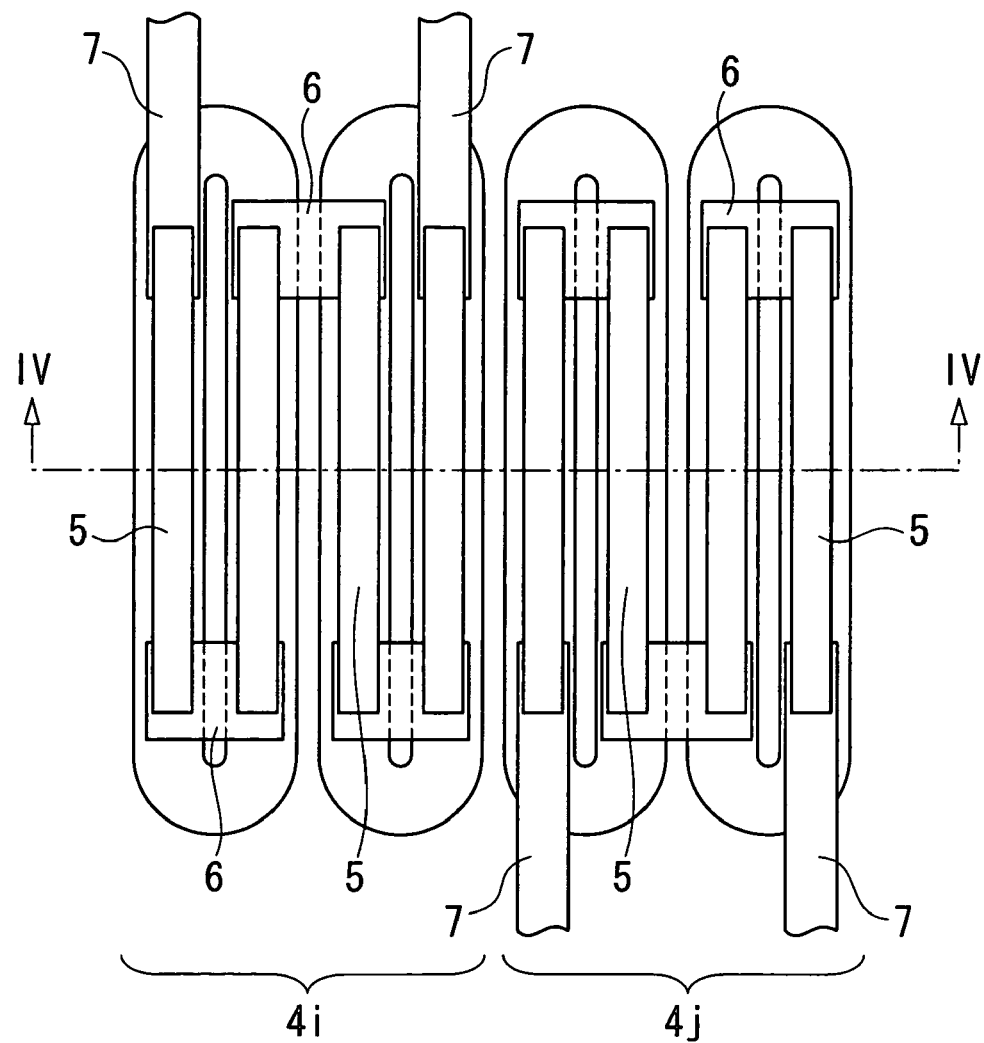
FIG. 42 A plan view showing the structure of giant magnetoresistive elements forming a Z-axis sensor mounted on a magnetic sensor in accordance with a seventh embodiment of the present invention.
Figure 43:
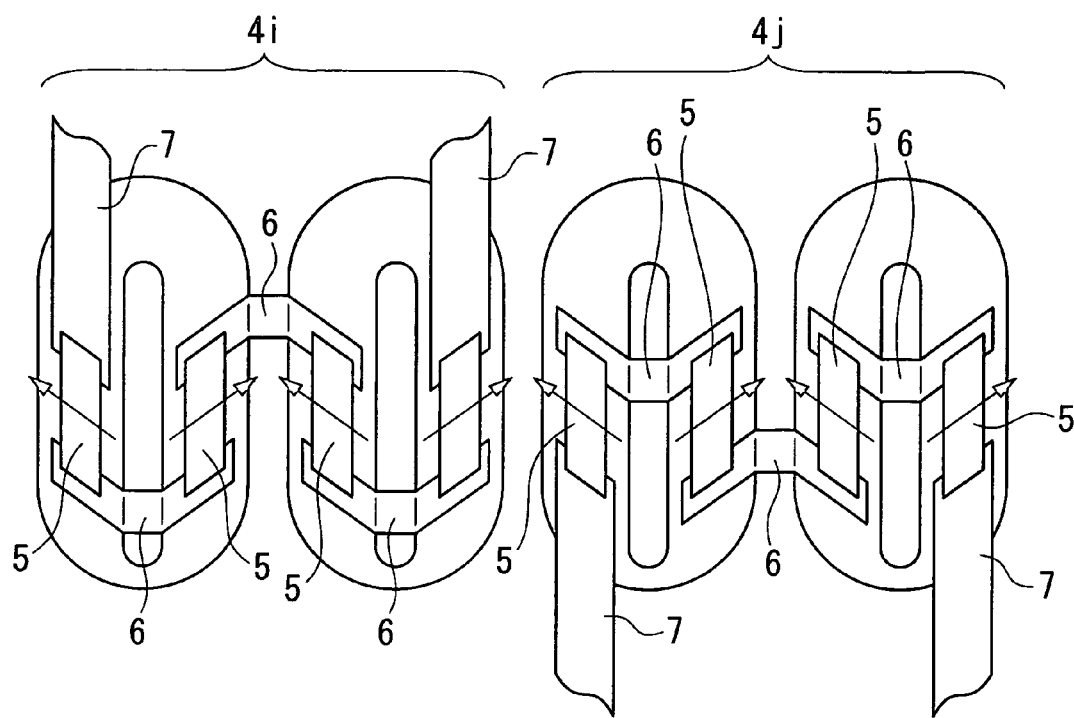
FIG. 43 A perspective view showing an example of the layout of giant magnetoresistive elements forming the Z-axis sensor in the seventh embodiment.
Figure 44:
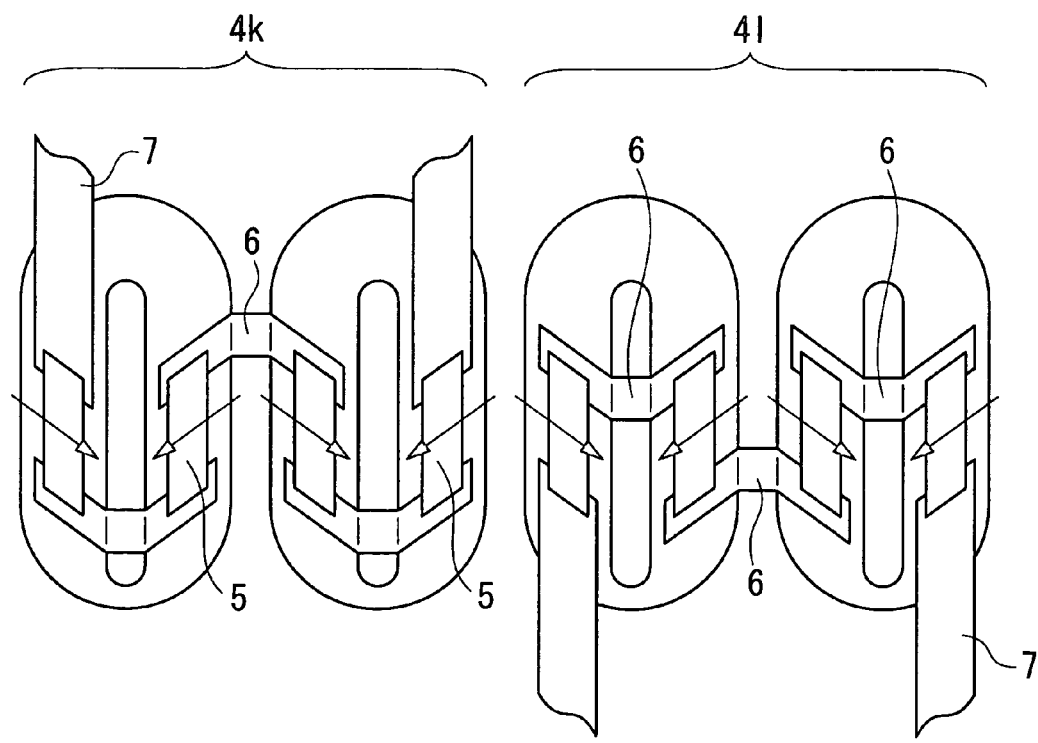
FIG. 44 A perspective view showing another example of the layout of giant magnetoresistive elements forming the Z-axis sensor in the seventh embodiment.

FIG. 42 is a plan view showing giant magnetoresistive elements 4i and 4j forming a Z-axis sensor 4. Incidentally, a cross-sectional view taken along line IV-IV in FIG. 42 is identical to FIG. 4. FIG. 43 is a perspective view showing the layout of the giant magnetoresistive elements 4i and 4j; and FIG. 44 is a perspective view showing the layout of the giant magnetoresistive elements 4k and 4l.

In the present embodiment, the terminal portions of the channels 8 extending in the longitudinal direction are curved slopes having semi-circular shapes. When the channels 8 are formed by way of etching, the resist film is subjected to patterning and is shaped by heating to realize the shapes of the channels 8. In this case, since the terminal portions of the channel slopes of the resist pattern in the longitudinal direction are shaped so as to be semi-circular, it is possible to prevent the widths of the terminal portions of the slopes after heat treatment from being decreased. Incidentally, the terminal portions of the channel slopes are not necessarily shaped to be semi-circular; hence, it is possible to employ other shapes having prescribed degrees of roundness.

Figure 45:
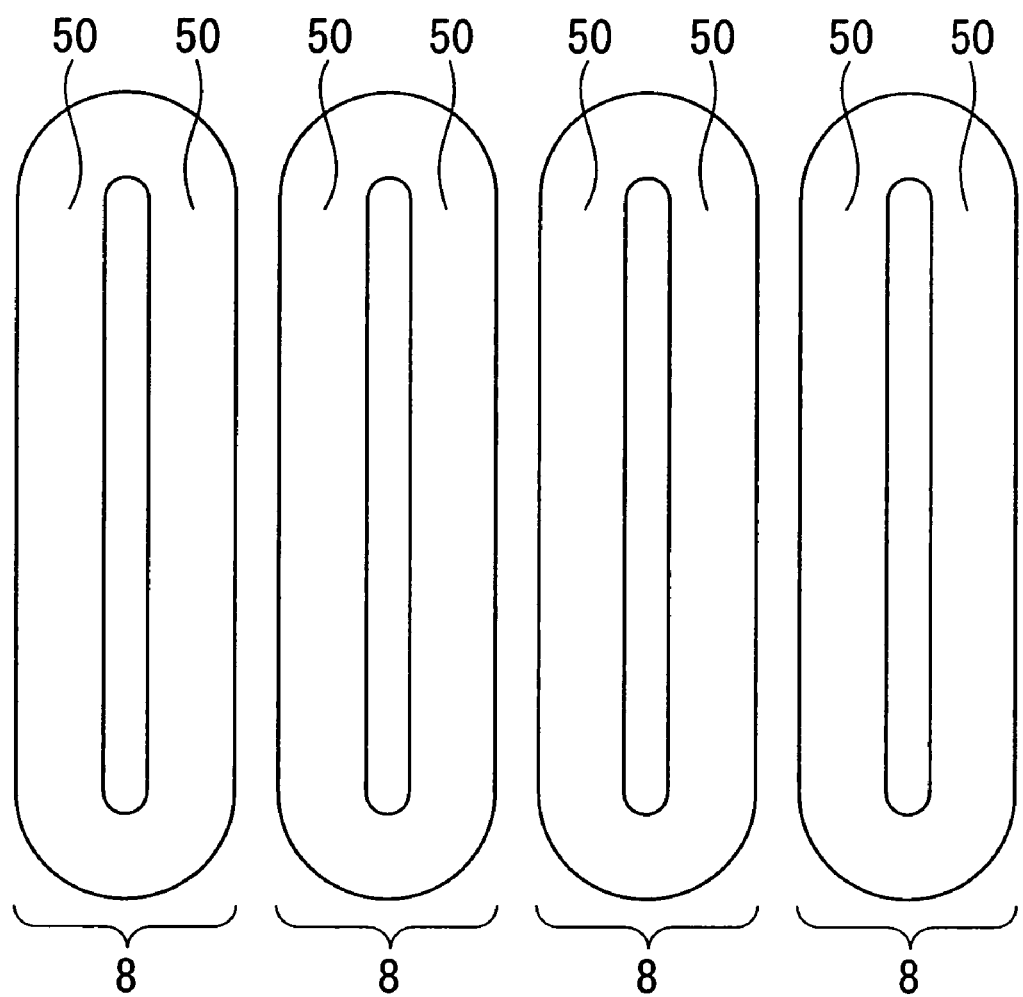
FIG. 45 A conceptual drawing showing that end portions of slopes of channels formed in a thick film are consecutively rounded in a manufacturing method of the magnetic sensor of the seventh embodiment.

Incidentally, the manufacturing method of the magnetic sensor of the present embodiment is similar to the foregoing ones used in the first to sixth embodiments; hence, the description thereof will be omitted. In the channel formation, after the heat treatment, slopes 50 are formed as shown in FIG. 45. That is, each slope 50 is formed so as to have the same width in the longitudinal direction ranging from the center to the ends, thus realizing a uniform plane shape and inclination angle. In addition, the ends of the slopes 50 in the longitudinal direction are connected as curved slopes; hence, adjacently opposite slopes are connected, and the end portion of the channel is shaped so as to be semi-circular.

INDUSTRIAL APPLICABILITY

The present invention is designed such that the thick film formed on the semiconductor substrate is subjected to cutting so as to form channels or projections having linear ridgelines, in which giant magnetoresistive elements forming a Z-axis sensor are formed on the slopes; hence, it is applicable to small-size magnetic sensors such as three-axial sensors each formed on a single semiconductor substrate.

In addition, the present invention is applicable to electronic compasses installed in various portable electronic devices such as portable telephones.

The invention claimed is:

1. A manufacturing method for a magnetic sensor comprising the steps of:
    forming a planation layer that provides planation by covering a wiring layer of a semiconductor substrate;
    forming a passivation film on the planation layer;
    forming a thick film on the passivation film;
    forming a resist film on the thick film;
    partially removing the resist film;
    performing heat treatment on the resist film, thus making terminal surfaces thereof incline;
    performing etching on the resist film and the thick film at an etching selection ratio of 1:1, thus forming a plurality of channels in the thick film;
    forming bias magnets forming giant magnetoresistive elements on a planar surface of the thick film as well as slopes, top portions, and bottoms of the channels;
    forming a giant magnetoresistive element film;
    positioning the semiconductor substrate, in which the giant magnetoresistive film is formed, close to a magnet array, and subjecting the semiconductor substrate to heat treatment;
    removing a part of the giant magnetoresistive element film by way of etching, thus forming magneto-sensitive elements forming the giant magnetoresistive elements on the planar surface of the thick film and the slopes of the channels; and
    forming a protection film.

2. A manufacturing method for a magnetic sensor comprising the steps of:
    forming a planation layer that provides planation by covering a wiring layer of a semiconductor substrate;
    removing a part of the planation layer so as to make a via and a pad be exposed;
    forming a passivation film on the planation layer;
    removing an upper layer of the passivation film from the via and the pad;
    forming a thick film on the passivation film;
    forming a resist film on the thick film;
    partially removing the resist film;
    performing heat treatment on the resist film, thus making terminal surfaces thereof incline;
    performing etching on the resist film and the thick film at an etching selection ratio of 1:1, thus forming a plurality of channels in the thick film;
    removing the thick film and a lower layer of the passivation film from a center of the via, thus making a conductive portion of the via be exposed;
    forming bias magnets forming giant magnetoresistive elements on a planar surface of the thick film as well as slopes, top portions, and bottoms of the channels;
    forming a wiring film connecting the bias magnets and the conductive portion of the via;
    forming a giant magnetoresistive element film;
    positioning the semiconductor substrate, in which the giant magnetoresistive film is formed, close to a magnet array, and subjecting the semiconductor substrate to heat treatment;
    removing a part of the giant magnetoresistive element film by way of etching, thus forming magneto-sensitive elements forming the giant magnetoresistive elements on the planar surface of the thick film and the slopes of the channels;
    forming a protection film; and
    removing the thick film and the lower layer of the passivation film covering the pad, thus making a conductive portion of the pad be exposed.

3. The manufacturing method for a magnetic sensor according to claim 1, wherein the plurality of channels are formed by pressing a mold having a plurality of projections matching the plurality of channels formed in the thick film toward the resist film after formation of the resist film.

4. A manufacturing method for a magnetic sensor comprising the steps of:
    forming a planation layer that provides planation by covering a wiring layer of a semiconductor substrate;
    forming a passivation film on the planation layer;
    forming a thick film on the passivation film;
    forming a resist film on the thick film;
    partially removing the resist film;
    performing heat treatment on the resist film, thus making terminal surfaces thereof incline;
    performing etching on the resist film and the thick film at an etching selection ratio of 1:1, thus forming a plurality of channels in the thick film;
    forming bias magnets forming giant magnetoresistive elements on a planar surface of the thick film as well as slopes, top portions, and bottoms of the channels;
    forming a giant magnetoresistive element film;
    positioning the semiconductor substrate, in which the giant magnetoresistive film is formed, close to a magnet array, and subjecting the semiconductor substrate to heat treatment;
    removing a part of the giant magnetoresistive element film by way of etching, thus forming magneto-sensitive elements forming the giant magnetoresistive elements on the planar surface of the thick film and the slopes of the channels; and
    forming a protection film,
    wherein after formation of the resist film, a photomask having fine patterns, the number of which per unit area gradually increases from a center to both ends of at least one of the channel formed in the thick film, is positioned opposite to the resist film, which is then subjected to exposure and development, thus forming the at least one channel in the resist film.

5. The manufacturing method for a magnetic sensor according to claim 1, wherein after the heat treatment of the resist film, a reactive ion etching method is performed on the resist film and the thick film under high ion etching conditions, thus forming the plurality of channels in the thick film.

6. A manufacturing method for a magnetic sensor comprising the steps of:
    forming a planation layer that provides planation by covering a wiring layer of a semiconductor substrate;
    forming a passivation film on the planation layer;
    forming a thick film on the passivation film;
    forming an insulating film by depositing silicon oxide on the thick film by way of a high-density plasma CVD method, thus forming a plurality of projections having linear ridgelines in a part of the insulating film;
    etching the insulating film having the plurality of projections and the thick film under high ion etching conditions, thus forming a plurality of channels in the thick film and also reducing the thickness of the thick film remaining on a via and a pad;

forming a resist film on the thick film;

partially removing the resist film;

performing heat treatment on the resist film, thus making terminal surfaces thereof incline;

performing etching on the resist film and the thick film at an etching selection ratio of 1:1;

forming bias magnets forming giant magnetoresistive elements on a planar surface of the thick film as well as slopes, top portions, and bottoms of the channels;

forming a giant magnetoresistive element film;

positioning the semiconductor substrate, in which the giant magnetoresistive film is formed, close to a magnet array, and subjecting the semiconductor substrate to heat treatment;

removing a part of the giant magnetoresistive element film by way of etching, thus forming magneto-sensitive elements forming the giant magnetoresistive elements on the planar surface of the thick film and the slopes of the channels; and forming a protection film.

7. A manufacturing method for a magnetic sensor comprising the steps of:

forming a planation layer that provides planation by covering a wiring layer of a semiconductor substrate;

forming a passivation film on the planation layer;

forming a thick film on the passivation film;

forming an insulating film between the thick film and the passivation film;

forming a resist film on the thick film;

partially removing the resist film;

performing heat treatment on the resist film, thus making terminal surfaces thereof incline;

performing etching on the resist film and the thick film at an etching selection ratio of 1:1, thus forming a plurality of channels in the thick film, wherein the insulating film is used as an etching stopper to perform the etching;

forming bias magnets forming giant magnetoresistive elements on a planar surface of the thick film as well as slopes, top portions, and bottoms of the channels;

forming a giant element film;

positioning the semiconductor substrate, in which the giant magnetoresistive film is formed, close to a magnet array, and subjecting the semiconductor substrate to heat treatment;

removing a part of the giant magnetoresistive element film by way of etching, thus forming magneto-sensitive elements forming the giant magnetoresistive elements on the planar surface of the thick film and the slopes of the channels; and forming a protection film.

8. A manufacturing method for a magnetic sensor comprising the steps of:

forming a planation layer that provides planation by covering a wiring layer of a semiconductor substrate;

forming a passivation film on the planation layer;

forming a thick film on the passivation film;

forming a resist film on the thick film;

partially removing the resist film;

performing heat treatment on the resist film, thus making terminal surfaces thereof incline;

performing etching on the resist film and the thick film at an etching selection ratio of 1:1, thus forming a plurality of channels in the thick film, wherein each of the slopes of the channels formed by the etching is constituted of a first slope on an upper side and a second slope on a lower side, and wherein an inclination angle of the second slope is larger than an inclination angle of the first slope;

forming bias magnets forming giant magnetoresistive elements on a planar surface of the thick film as well as slopes, top portions, and bottoms of the channels;

forming a giant magnetoresistive element film;

positioning the semiconductor substrate, in which the giant magnetoresistive film is formed, close to a magnet array, and subjecting the semiconductor substrate to heat treatment;

removing a part of the giant magnetoresistive element film by way of etching, thus forming magneto-sensitive elements forming the giant magnetoresistive elements on the planar surface of the thick film on the second slope of the channels; and forming a protection film.

* * * * *